United States Patent
Sakaguchi et al.

(10) Patent No.: US 8,649,202 B2
(45) Date of Patent: Feb. 11, 2014

(54) RESISTANCE CHANGE MEMORY INCLUDING A RESISTIVE ELEMENT

(75) Inventors: Takeshi Sakaguchi, Yokkaichi (JP); Hiroyuki Nitta, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 13/021,944

(22) Filed: Feb. 7, 2011

(65) Prior Publication Data

US 2011/0286261 A1    Nov. 24, 2011

(30) Foreign Application Priority Data

May 21, 2010   (JP) .................................. 2010-117593

(51) Int. Cl.
    *G11C 11/00*   (2006.01)
(52) U.S. Cl.
    USPC ...................................... 365/148; 365/230.03
(58) Field of Classification Search
    USPC .......................................... 365/148, 230.03
    See application file for complete search history.

(56) References Cited

U.S. PATENT DOCUMENTS

| | | | |
|---|---|---|---|
| 7,989,789 B2 | 8/2011 | Toda | |
| 8,259,489 B2 | 9/2012 | Nagashima et al. | |
| 8,269,207 B2 | 9/2012 | Toda | |
| 8,384,059 B2 | 2/2013 | Toda | |
| 2008/0258129 A1* | 10/2008 | Toda | 257/5 |
| 2009/0134432 A1 | 5/2009 | Tabata et al. | |
| 2009/0201710 A1* | 8/2009 | Ueda | 365/51 |
| 2010/0034012 A1* | 2/2010 | Matsuo | 365/148 |

FOREIGN PATENT DOCUMENTS

| | | |
|---|---|---|
| JP | 2003-257177 | 9/2003 |
| JP | 2005-522045 | 7/2005 |
| JP | 2008-91519 | 4/2008 |
| JP | 2009-099198 | 5/2009 |
| JP | 2009-130140 | 6/2009 |

OTHER PUBLICATIONS

Office Action issued on Nov. 26, 2013 in Japanese Patent Application No. 2010-117593 (with English Translation).

* cited by examiner

*Primary Examiner* — Hoai V Ho
(74) *Attorney, Agent, or Firm* — Oblon, Spivak, McClelland, Maier & Neustadt, L.L.P.

(57) ABSTRACT

According to one embodiment, a resistance change memory includes a memory cell array area and a resistive element area on a substrate. A first memory cell array in the memory cell array area includes a first control line, a second control line above first control line, and a first cell unit between the first and second control lines. A second memory cell array on the first memory cell array includes the second control line, a third control line above the second control line, and a second cell unit between the second and the third control lines. And a resistive element in the resistive element area includes resistance lines, and a resistor connected to the resistance lines. The resistor includes the same member as one of a member of the cell unit and a member of a contact plug.

13 Claims, 38 Drawing Sheets

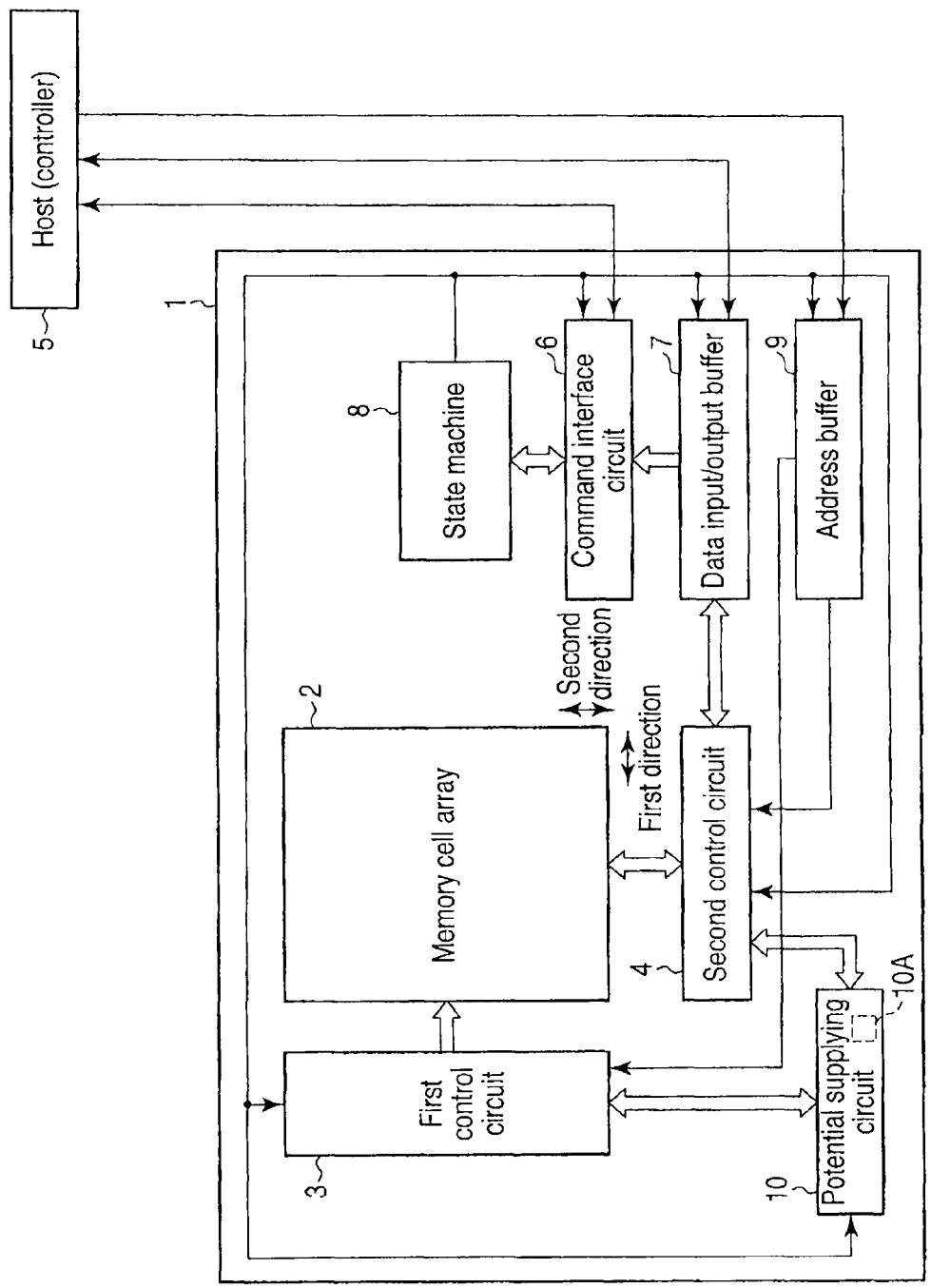
F I G. 1

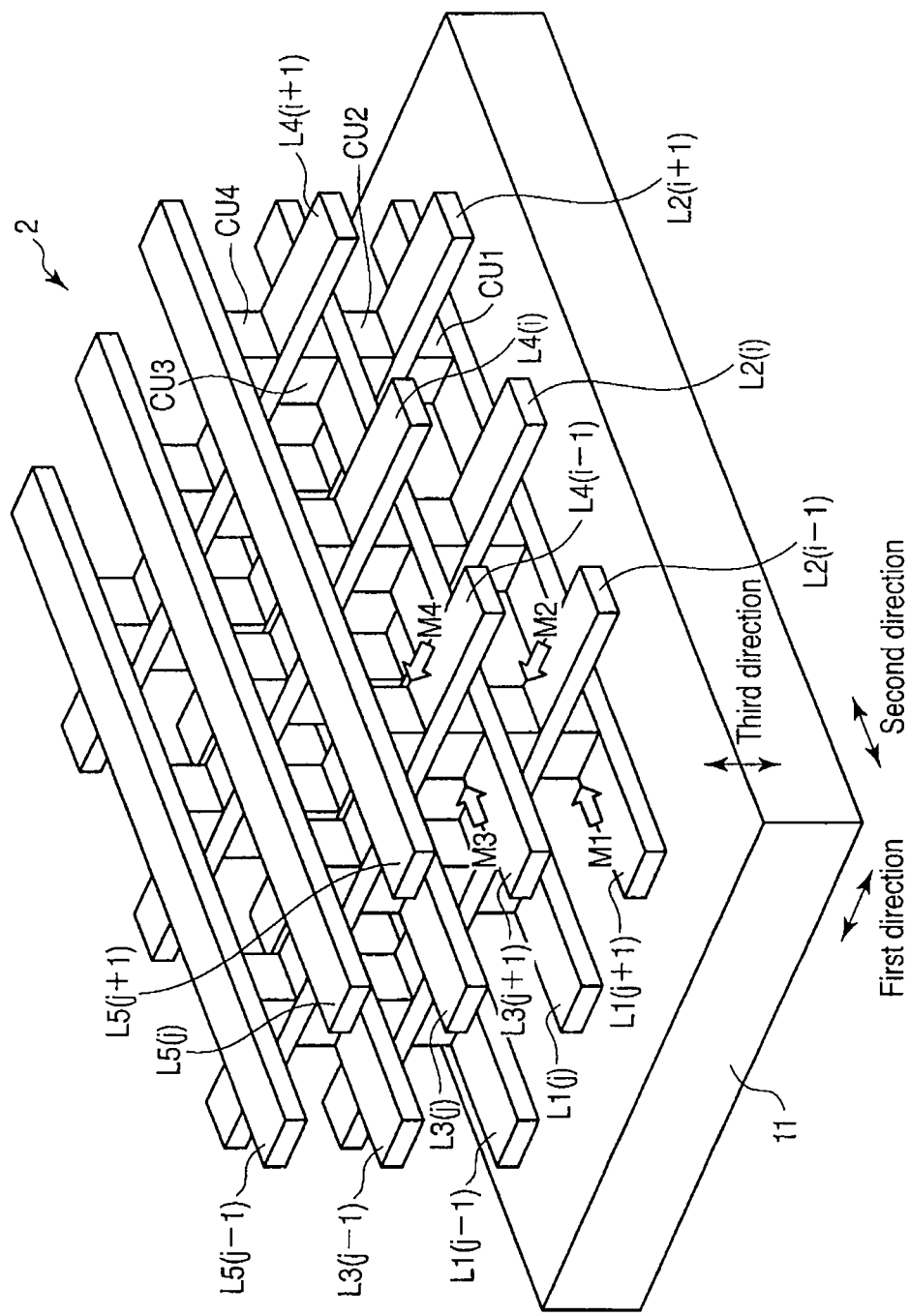
F I G. 2

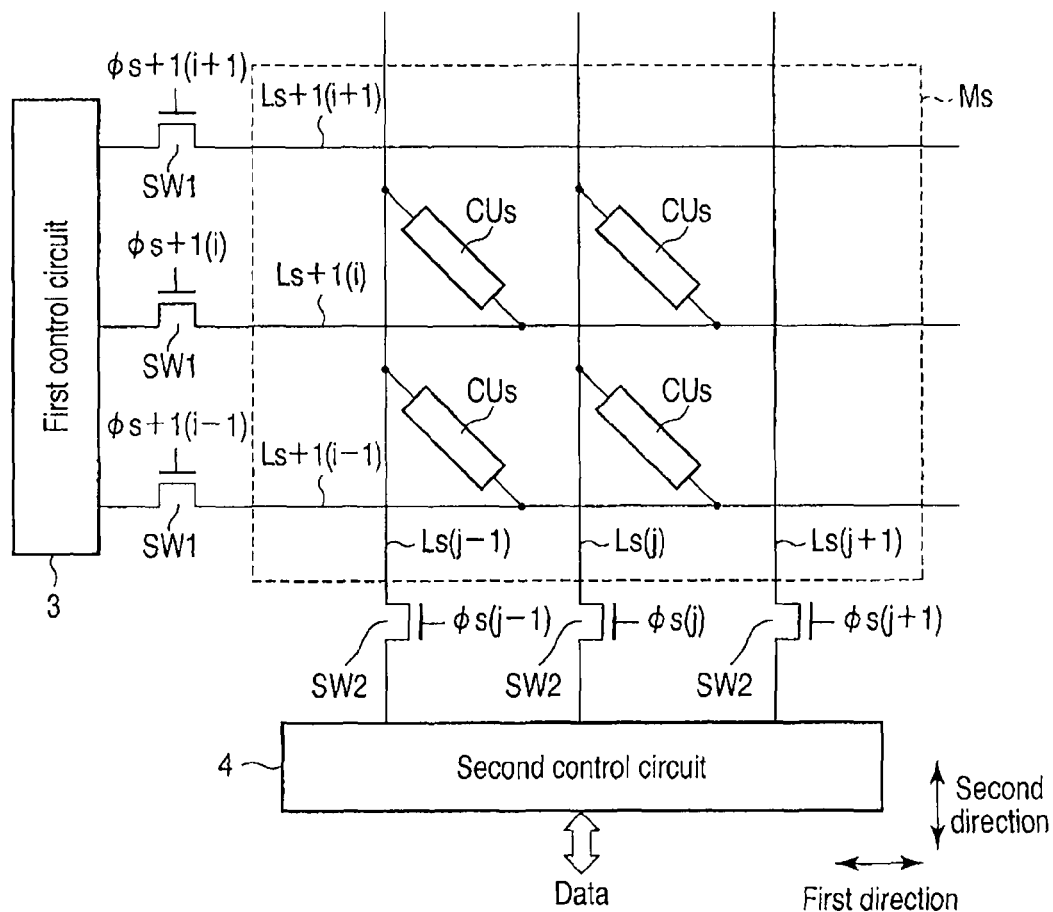
F I G. 5A

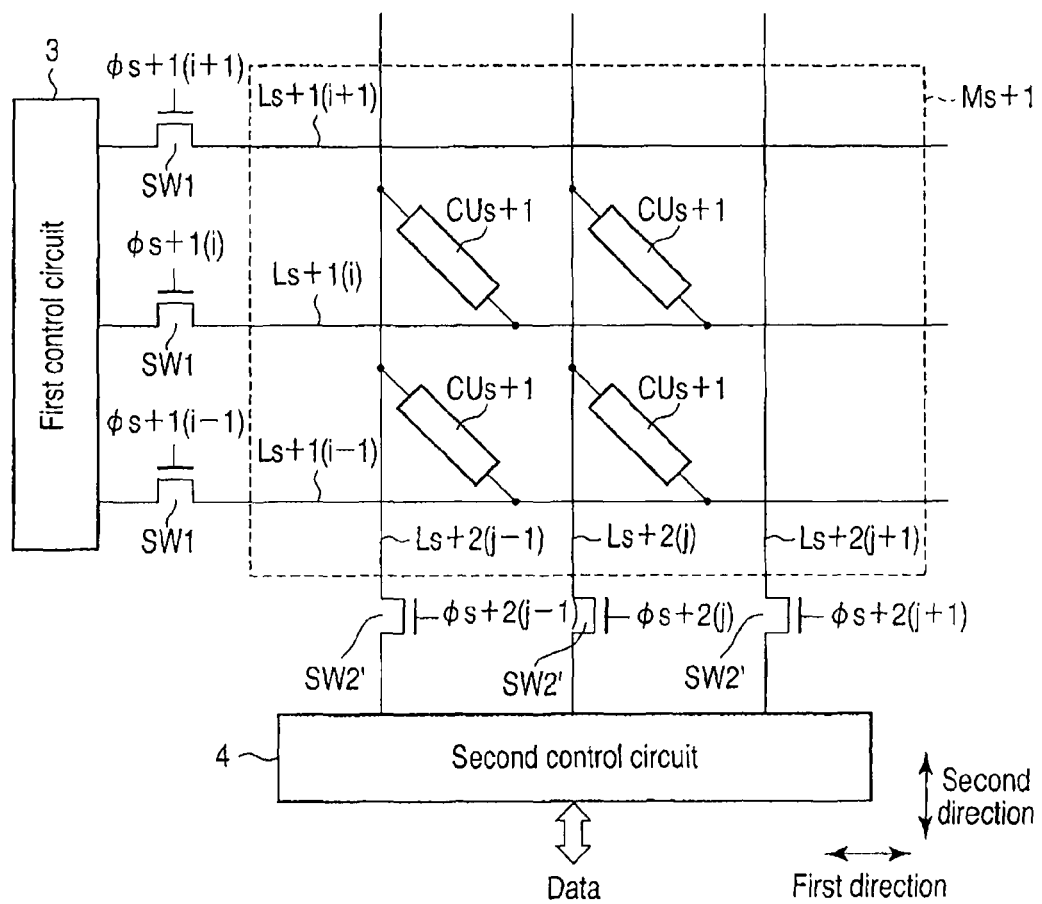
F I G. 5B

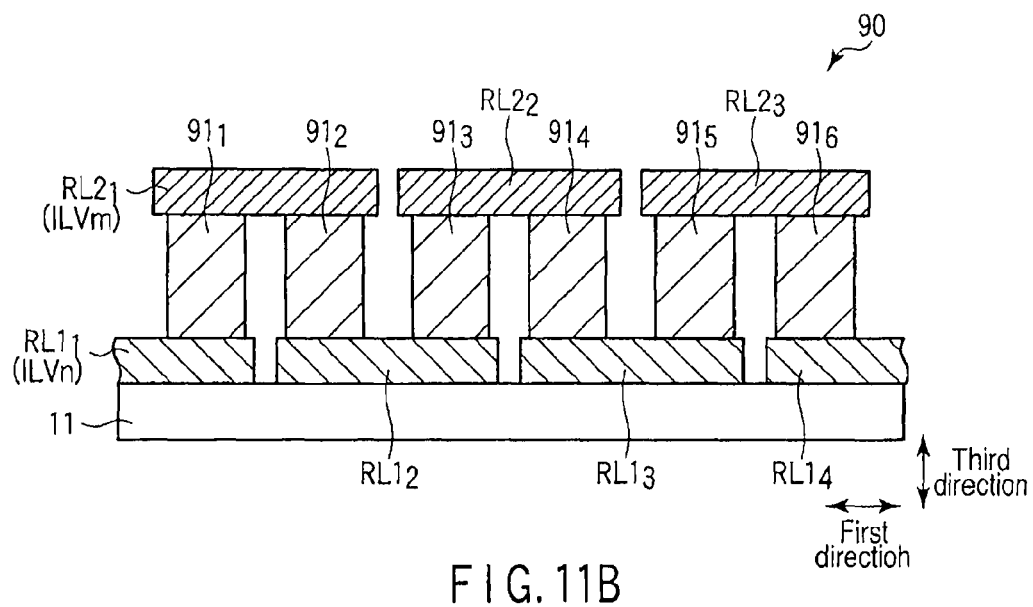
F I G. 11B
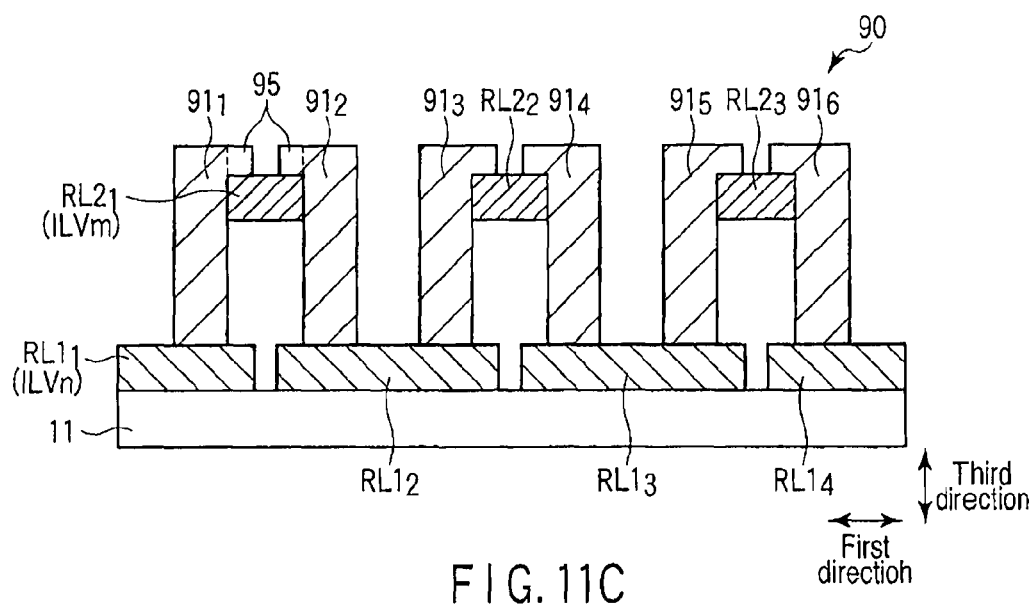
F I G. 11C

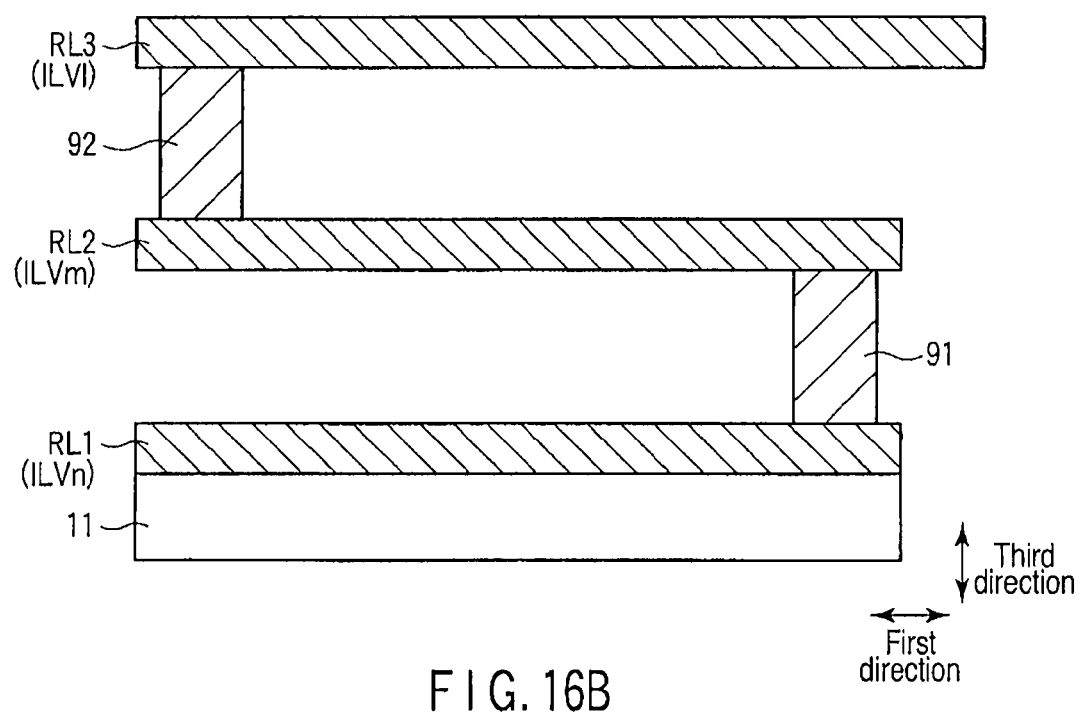
F I G. 16B

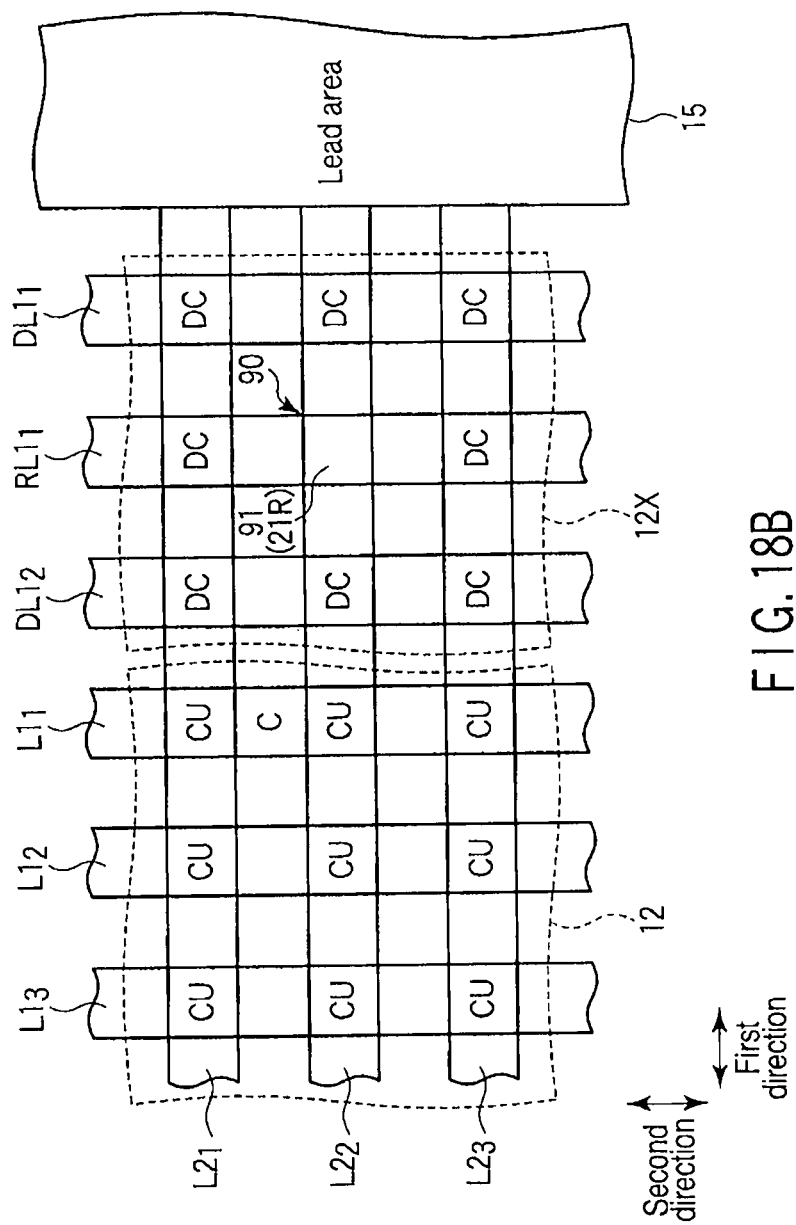
F I G. 18B

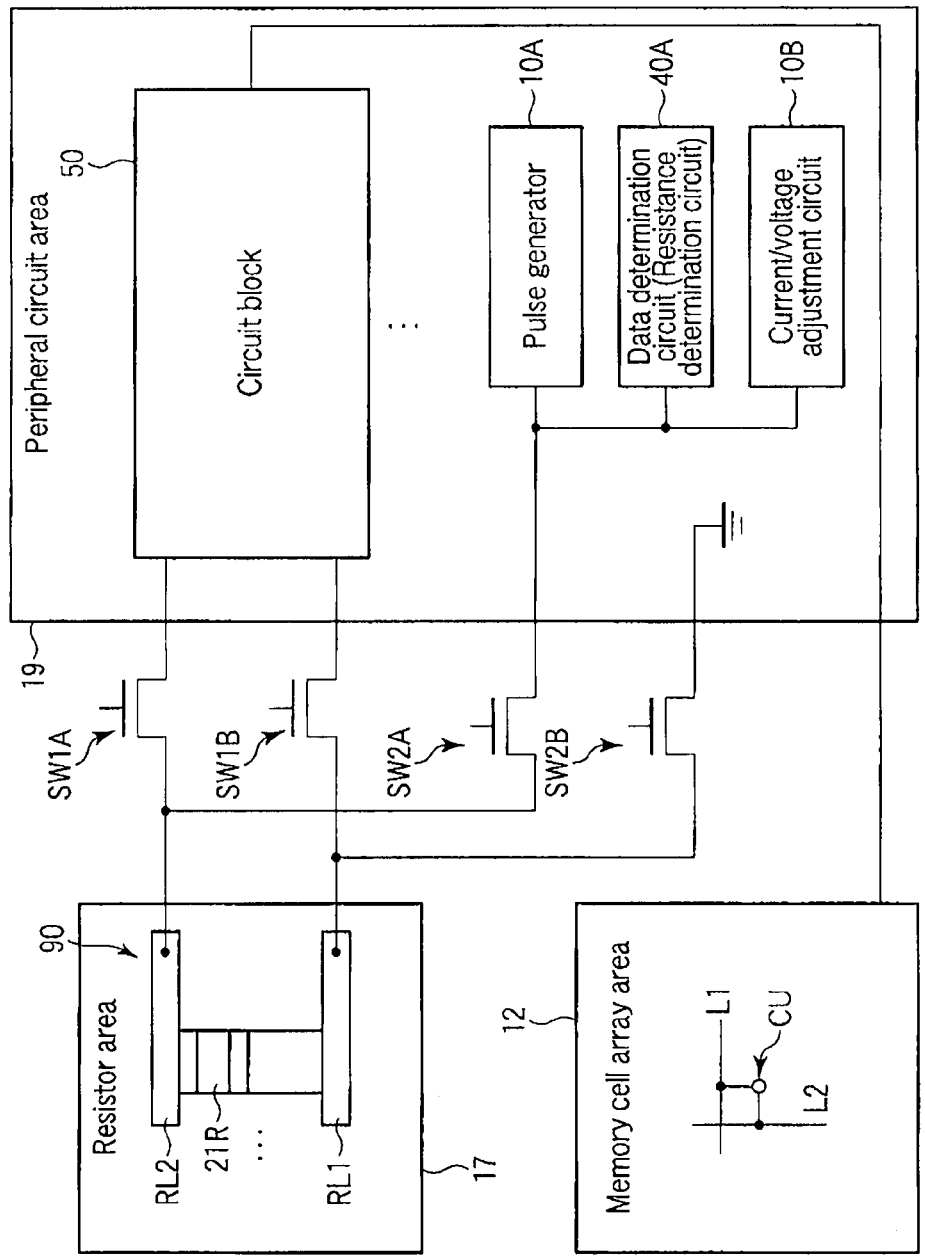
F I G. 19

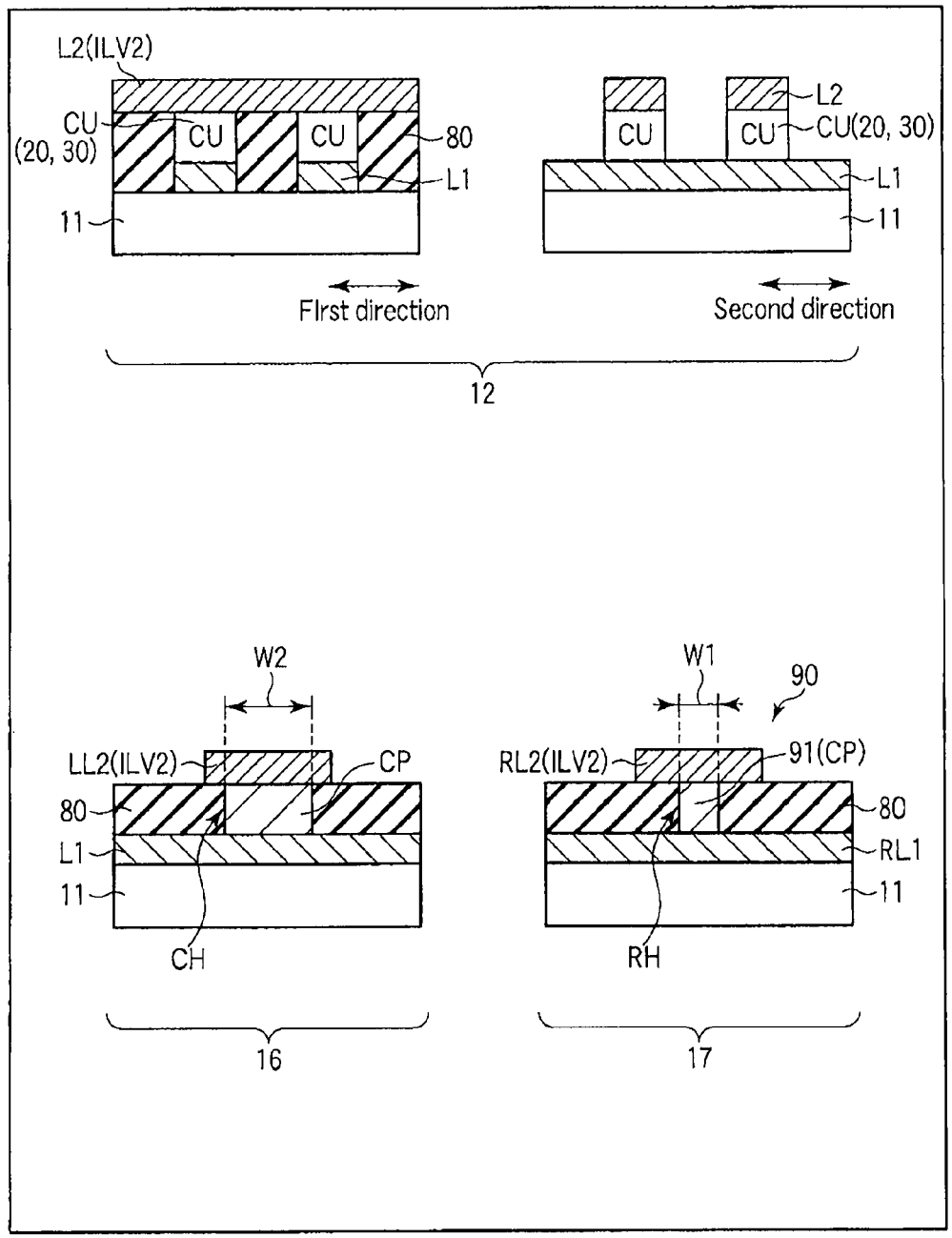
F I G. 20C

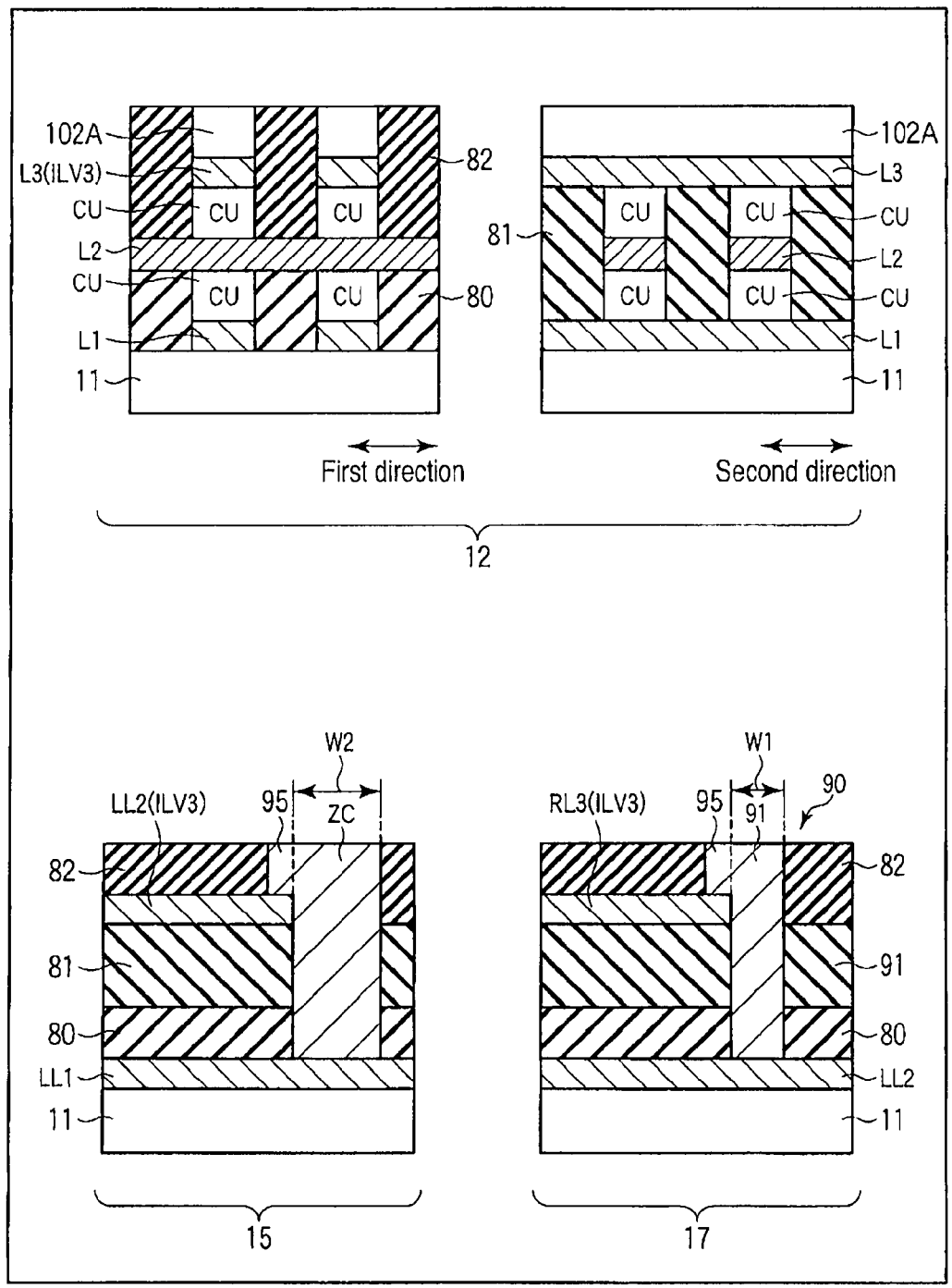
F I G. 21D

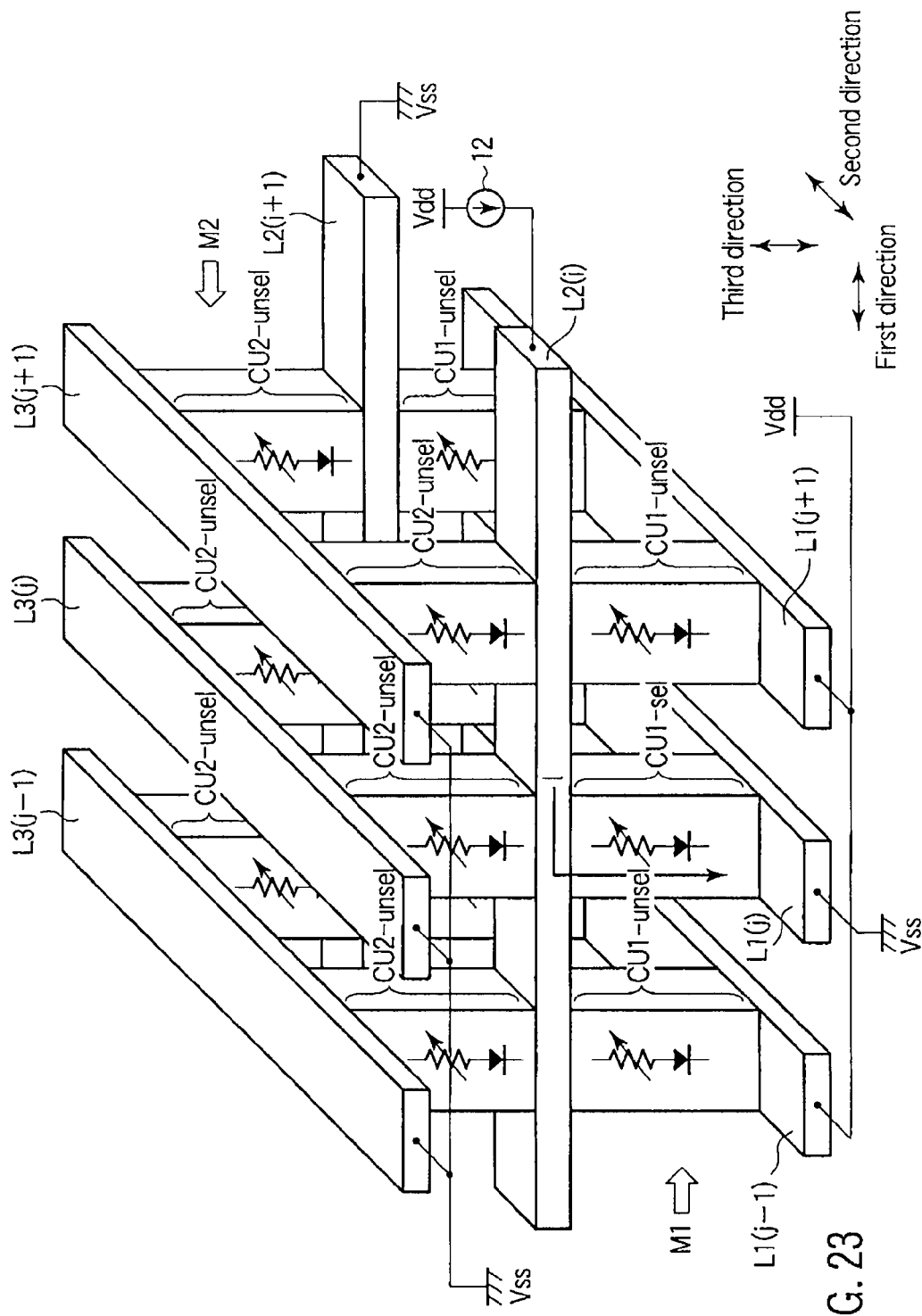
F I G. 23

RESISTANCE CHANGE MEMORY INCLUDING A RESISTIVE ELEMENT

CROSS-REFERENCE TO RELATED APPLICATIONS

This application is based upon and claims the benefit of priority from Japanese Patent Application No. 2010-117593, filed May 21, 2010; the entire contents of which are incorporated herein by reference.

FIELD

Embodiments described herein relate generally to a resistance change memory.

BACKGROUND

In recent years, as a next-generation nonvolatile semiconductor memory, a resistance change memory such as an ReRAM (Resistive RAM) using a variable resistive element as a memory element, or a PCRAM (Phase change RAM) using a phase-change element as a memory element attracts attention.

These resistance change memories are characterized in that a memory cell array is of a cross-point type, a large memory capacity can be realized by three-dimensional integration, and a high-speed operation like a DRAM is possible.

When such resistance change memories are put to practical use, an NAND flash memory as a file memory and a DRAM as a work memory can be substituted by the resistance change memories, for example.

In the resistance change memory, the cross-point type memory cell array includes a plurality of cell units. The cell unit is formed of a memory element and a non-ohmic element (see, e.g., JP-A 2009-130140 (KOKAI)).

Peripheral circuits for controlling a memory cell array are provided on the same chip as the cross-point type memory cell array. The peripheral circuits include a resistive element, a capacitive element, a field-effect transistor and other elements.

BRIEF DESCRIPTION OF THE DRAWINGS

FIG. 1 is a view showing a structural example of a resistance change memory;
FIG. 2 is a view showing a cross-point type memory cell array;
FIG. 5A is a view showing a layout of first and second control circuits;
FIG. 5B is a view showing a layout of the first and second control circuits;
FIG. 11B is a cross-sectional view showing a structural example of the resistive element depicted in FIG. 11A;
FIG. 11C is a cross-sectional view showing a structural example of the resistive element depicted in FIG. 11A;
FIG. 16B is a cross-sectional view showing a structural example of the resistive element depicted in FIG. 16A;
FIG. 18B is a plan view showing an example of a layout of a resistive element;
FIG. 19 is a view for explaining an adjustment method for a resistance value of a resistive element;
FIG. 20C is a view showing a step in the manufacturing method of a resistance change memory according to this embodiment;

FIG. 21D is a view showing a step in the manufacturing method of a resistance change memory according to this embodiment;

FIG. 23 is a view for explaining an operation of the resistance change memory.

DETAILED DESCRIPTION

Figure 3A:
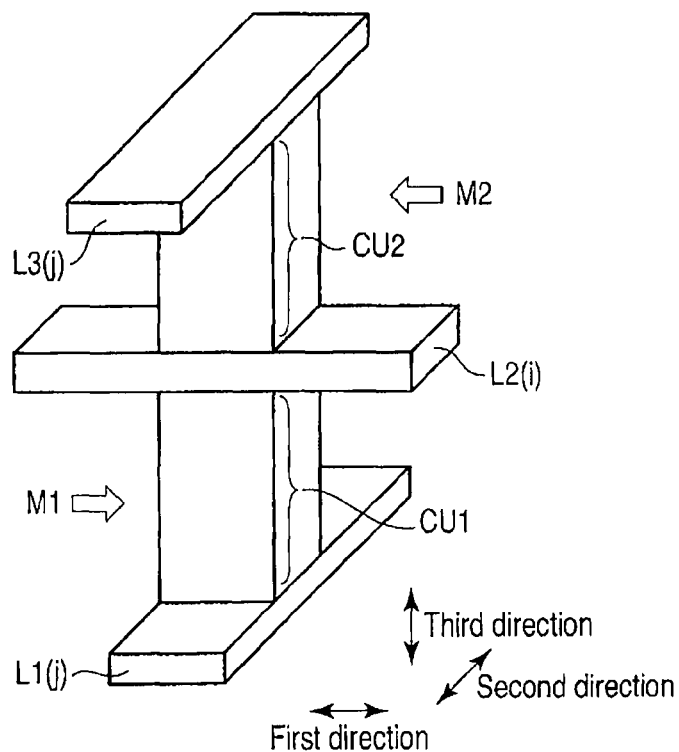
FIG. 3A is a view showing a cell unit.

This embodiment will now be described hereinafter in detail with reference to the accompanying drawings. In the following description, repeated explanations will only be given on constituent elements denoted by like reference numerals if required.

For example, according to one embodiment, a resistance change memory includes a memory cell array area and a resistive element area on a substrate.

A memory cell array area includes a first memory cell array and a second memory cell array stacked on the first memory cell array. A resistive element area includes a resistive element.

A first memory cell array includes a first control line which is placed on a first interconnect level and parallel to a first direction, a second control line which is placed on a second interconnect level above first interconnect level and parallel to a second direction crossing the first direction, and a first cell unit provided between the first control line and the second control line.

A second memory cell array includes the second control line, a third control line which is placed on a third interconnect level above the second interconnect level and parallel to the first direction, and a second cell unit provided between the second control line and the third control line.

And a resistive element includes at least two resistance lines provided on at least two interconnect levels in the first to third interconnect levels, and at least one resistor which is connected to the resistance lines and includes the same constituent member as one of a constituent member of the first cell unit and a constituent member of a contact plug.

This embodiment is intended for a resistance change memory using a variable resistive element or a phase-change memory as a memory element.

Embodiment (1) Resistance Change Memory
(a) Overall Configuration

A resistance change memory according to this embodiment will now be described with reference to FIGS. 1 to 8.

FIG. 1 shows a primary portion of a resistance change memory.

The resistance change memory (e.g., a chip) 1 has a cross-point type memory cell array 2.

A first control circuit 3 is arranged at one end of the cross-point type memory cell array 2 in a first direction, and a second control circuit 4 is arranged at one end of the same in a second direction crossing the first direction.

The first control circuit 3 selects a row in the cross-point type memory cell array 2 based on, e.g., a row address signal. The second control circuit 4 selects a column in the cross-point type memory cell array 2 based on, e.g., a column address signal.

The first and second control circuits 3 and 4 control writing, erasing and reading of data with respect to memory elements in the memory cell array 2.

Here, in the resistance change memory 1 according to this embodiment, for example, writing is called set, and erasing is called reset. It is good enough for a resistance value in a set state to be different from a resistance value in a reset state, and whether it is higher or lower than the resistance value in the reset state is not important.

Further, in a set operation, when one level in a plurality of resistance value levels that can be taken by the memory elements can be selectively written, a multi-level resistance change memory in which one memory element stores multi-level data can be realized.

A controller 5 supplies a control signal and data to the resistance change memory 1. The control signal is input to a command interface circuit 6, and the data is input to a data input/output buffer 7. The controller 5 may be arranged in the chip 1 or may be arranged in a chip (a host device) different from the chip 1.

The command interface circuit 6 judges whether the data from the controller 5 is command data based on the control signal. When the data is the command data, the command interface circuit 6 transfers this data to a state machine 8 from the data input/output buffer 7.

The state machine 8 manages operations of the resistance change memory 1 based on the command data. For example, the state machine 8 manages a set/reset operation and a read operation based on the command data from the controller 5. The controller 5 can receive status information managed by the state machine 8 and judge an operation result in the resistance change memory 1.

In the set/reset operation and the read operation, the controller 5 supplies an address signal to the resistance change memory 1. The address signal is input to the first and second control circuits 3 and 4 through an address buffer 93.

A potential supplying circuit 10 outputs, e.g., a voltage pulse or a current pulse required for the set/reset operation and the read operation at a predetermined timing based on a command from the state machine 8. The potential supplying circuit 10 includes, e.g., a pulse generator 10A and controls a voltage value/current value and a pulse width of the output voltage pulse/current pulse in accordance with the command data and an operation indicated by a control signal.

Circuits other than the cross-point type memory cell array 2 constituting the resistance change memory (the chip) will be referred to as peripheral circuits hereinafter.

FIG. 2 is a bird's-eye view showing a configuration of the cross-point type memory cell array.

The cross-point type memory cell array 2 is arranged on a substrate 11. The substrate 11 is a semiconductor substrate (e.g., a silicon substrate) or an interlayer insulating film on the semiconductor substrate. It is to be noted that, when the substrate 11 is the interlayer insulating film, a circuit using a field-effect transistor or the like may be formed as a peripheral circuit of the resistance change memory on a semiconductor substrate surface below the cross-point type memory cell array 2.

The cross-point type memory cell array 2 is formed of, e.g., a stack structure including a plurality of memory cell arrays (which are also called memory cell layers).

FIG. 2 shows an example in which the cross-point type memory cell array 2 is formed of four memory cell arrays M1, M2, M3 and M4 stacked in a third direction (a direction vertical to a main plane of the substrate 11). As the number of memory cell arrays to be stacked, 2 or above can suffice. It is to be noted that the cross-point type memory cell array 2 may be formed of one memory cell array. Furthermore, an insulating film may be provided between two stacked memory cell arrays, and the insulating film may electrically separate the two memory cell arrays from each other.

When the plurality of memory cell arrays M1, M2, M3 and M4 are stacked as depicted in FIG. 2, the address signal includes, e.g., a memory cell array selecting signal, a row address signal and a column address signal. The first and second control circuits 3 and 4 select one of the plurality of stacked memory cell arrays based on, e.g., the memory cell array selecting signal. The first and second control circuits 3 and 4 can write/erase/read data with respect to one of the plurality of stacked memory cell arrays, or can write/erase/read data simultaneously with respect to two or more or all of the plurality of stacked memory cell arrays.

The memory cell array M1 includes a plurality of cell units CU1 arranged in an array shape in the first and second directions. At the same time, the memory cell array M2 includes a plurality of cell units CU2 arranged in an array shape, the memory cell array M3 includes a plurality of cell units CU3 arranged in an array shape, and the memory cell array M4 includes a plurality of cell units CU4 arranged in an array shape.

Moreover, on the substrate 11 are sequentially arranged from the substrate 11 side control lines L1($j$−1), L1($j$) and L1($j$+1), control lines L2($i$−1), L2($i$) and L2($i$+1), control lines L3($j$−1), L3($j$) and L3($j$+1), control lines L4($i$−1), L4($i$) and L4($i$+1) and control lines L5($j$−1), L5($j$) and L5($j$+1).

The odd-numbered control lines from the substrate 11 side, i.e., the control lines L1($j$−1), L1($j$) and L1($j$+1), the control lines L3($j$−1), L3($j$) and L3($j$+1) and the control lines L5($j$−1), L5($j$) and L5($j$+1) extend in the second direction.

The even-numbered control lines from the substrate 11 side, i.e., the control lines L2($i$−1), L2($i$) and L2($i$+1) and the control lines L4($i$−1), L4($i$) and L4($i$+1) extend in the first direction crossing the second direction.

These control lines are used as word lines or bit lines.

The first memory cell array M1 in the lowermost layer is arranged between the first control lines L1($j$−1), L1($j$) and L1($j$+1) and the second control lines L2($i$−1), L2($i$) and L2($i$+1). In the set/reset operation and the read operation with respect to the memory cell array M1, either the first control lines L1($j$−1), L1($j$) and L1($j$+1) or the second control lines L2($i$−1), L2($i$) and L2($i$+1) are used as the word lines, and the other control lines are used as the bit lines.

The memory cell array M2 is arranged between the second control lines L2($i$−1), L2($i$) and L2($i$+1) and the third control lines L3($j$−1), L3($j$) and L3($j$+1). In the set/reset operation and the read operation with respect to the memory cell array M2, either the second control lines L2($i$−1), L2($i$) and L2($i$+1) or the third control lines L3($j$−1), L3($j$) and L3($j$+1) are used as the word lines, and the other control lines are used as the bit lines.

The memory cell array M3 is arranged between the third control lines L3($j$−1), L3($j$) and L3($j$+1) and the fourth control lines L4($i$−1), L4($i$) and L4($i$+1). In the set/reset operation and the read operation with respect to the memory cell array M3, either the third control lines L3($j$−1), L3($j$) and L3($j$+1) or the fourth control lines L4($i$−1), L4($i$) and L4($i$+1) are used as the word lines, and the other control lines are used as the bit lines.

The memory cell array M4 is arranged between the fourth control lines L4($i$−1), L4($i$) and L4($i$+1) and the fifth control lines L5($j$−1), L5($j$) and L5($j$+1). In the set/reset operation and the read operation with respect to the memory cell array M4, either the control lines L4($i$−1), L4($i$) and L4($i$+1) or the control lines L5($j$−1), L5($j$) and L5($j$+1) are used as the word lines, and the other control lines are used as the bit lines.

The cell units CU1 are arranged at positions at which the control lines L1($j$−1), L1($j$) and L1($j$+1) cross the control lines L2($i$−1), L2($i$) and L2($i$+1), respectively. Likewise, the cell units CU2, CU3 and CU4 are arranged at positions where the control lines L2($i$−1), L2($i$) and L2($i$+1) cross the control lines L3($j$−1), L3($j$) and L3($j$+1), positions where control lines L3($j$−1), L3($j$) and L3($j$+1) cross the control lines L4($i$−1), L4($i$) and L4($i$+1), and positions where the control lines L4($i$−1), L4($i$) and L4($i$+1) cross the control lines L5($j$−1), L5($j$) and L5($j$+1), respectively. That is, in the cross-point type memory cell array 2, the cell units are arranged at the positions where the plurality of control lines continuously stacked in the third direction cross each other.

It is to be noted that, when the memory cell arrays to be stacked are separated from each other by insulating films in accordance with each layer, the control lines extending in the first and second directions are not shared by the two stacked memory cell arrays, and control lines as word lines and bit lines are provided in accordance with the memory cell array in each layer.

Figure 3B:
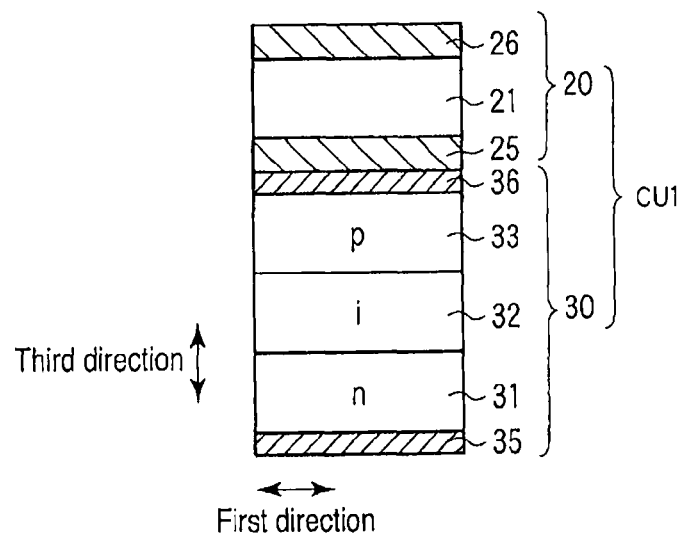
FIG. 3B is a cross-sectional view showing a structural example of the cell unit.

FIG. 3A shows an example of a configuration of control lines and cell units in the cross-point type memory cell array. FIG. 3B shows one specific example of the cell unit.

FIG. 3A shows the cell units CU1 and CU2 in the two memory cell arrays M1 and M2 in FIG. 2. In this case, a configuration of cell units in the two memory cell arrays M3 and M4 in FIG. 2 is the same as a configuration of the cell units in the two memory cell arrays M1 and M2 in FIG. 2.

The stacked cell units CU1 and CU2 share one control line L2($i$).

One end of a current path of the cell unit CU1 is connected to the control line L1($j$), and the other end of the current path of the cell unit CU1 is connected to the control line L2($i$). One end of a current path of the cell unit CU2 is connected to the control line L2($i$), and the other end of the current path of the cell unit CU2 is connected to the control line L3($j$).

Each of the cell units CU1 and CU2 is formed of a memory element and a non-ohmic element. The memory element and the non-ohmic element are connected in series. For example, a rectification element is used for the non-ohmic element.

As a connecting relationship between the memory element and the rectification element as the non-ohmic element, various patterns are possible. However, all the cell units in one memory cell array must have the same connecting relationship between the memory element and the rectification element.

FIG. 3B shows an example of a cross-sectional configuration of one cell unit. In the example depicted in FIG. 3B, a memory element 20 is staked on a non-ohmic element 30, and it is connected to the non-ohmic element 30 in series. A stacked body formed of the memory element 20 and the non-ohmic element 30 is sandwiched as one cell unit CU between the two control lines L2($i$) and L3($j$). However, the configuration of the cell unit CU depicted in FIG. 3B is just an example, and the non-ohmic element 30 may be stacked on the memory element 20.

The memory element 20 is a variable resistive element or a phase-change element. Here, the variable resistive element means an element formed of a material whose resistance value varies when energy such as a voltage, a current or heat is given. Furthermore, the phase-change element means an element formed of a material whose crystal phase varies due to energy given thereto and whose physical properties (an impedance) such as a resistance value or a capacitance vary due to this change in phase.

In this embodiment, the memory element is mainly formed of a metal oxide (e.g., a binary metal oxide or ternary metal oxide), a metal compound, a chalcogenide material (e.g., Ge—Sb—Te or In—Sb—Te), an organic substance, carbon, carbon nanotubes and other materials.

It is to be noted that a resistance value of a magnetoresistive effect element used for an MRAM (Magnetoresistive RAM) also varies when a relative direction of magnetization of two magnetic layers constituting this element changes. In this embodiment, for example, a magnetoresistive effect element like an MTJ (Magnetic Tunnel Junction) element is also included in the variable resistive element.

As methods of changing a resistance value of the memory element 20, there are an operation called a bipolar operation and an operation called a unipolar operation.

According to the bipolar operation, a resistance value of the memory element 20 is reversibly changed at least between a first value (a first level) and a second value (a second level) by varying a polarity of a voltage applied to the memory element 20. The bipolar operation is adopted to a memory in which a current must bidirectionally flow through the memory element at the time of writing like a spin injection type MRAM.

According to the unipolar operation, a resistance value of the memory element is reversibly changed at least between a first value and a second value by controlling an intensity of a voltage or an application time (a pulse width) of the voltage or controlling both of them without varying a polarity of the voltage applied to the memory element.

The memory element 20 has electrode layers 25 and 26 at one end and the other end thereof in the third direction (a stacking direction). The electrode layer 25 is provided on a bottom portion of the memory element 20, and the electrode layer 26 is provided on an upper portion of the memory element 20. The electrode layers 25 and 26 are used as, e.g., electrodes of the memory element. For example, a metal film, a metal compound film, a semiconductor film having conductivity, or a staked film constituted of these films is used for each of the electrode layers 25 and 26.

In this embodiment, a portion sandwiched between the two electrode layers 25 and 26 is called a resistance change film 21. The resistance change film 21 is a film formed of a material whose resistance value or whose crystal phase varies due to energy such as a voltage, a current or heat. The resistance change film 21 is formed of a material having properties such that a resistance value or a crystal phase of the film itself varies due to the energy given thereto.

On the other hand, the resistance change film 21 may be formed of a material having properties such that characteristics of an interface between the resistance change film 21 and each of the electrode layers 25 and 26 vary due to the given energy and a resistance value (or a crystal phase) thereby changes. In this case, the properties of the memory element 20 that enable its resistance value to change can be stably obtained by appropriately setting a combination of a material used for the resistance change film 21 and a material used for the electrode layers 25 and 26.

The electrode layers 25 and 26 may have a function as a diffusion preventing layer. The diffusion preventing layer prevents an impurity generated from the lower element 30 or the control lines from diffusing into the memory element 20. Alternatively, it prevents an impurity generated from the memory element 20 from diffusing into the lower element or the control lines.

Each of the electrode layers 25 and 26 may have a function as an adhesive layer that prevents the memory element 20 from being delaminated from the lower element 30 or the control lines.

The non-ohmic element 30 is an element having no linearity in input/output characteristics thereof, i.e., having non-ohmic characteristics in input/output characteristics thereof.

The non-ohmic element 30 has conductive layers 35 and 36 at one end and the other end thereof in the third direction (the stacking direction). The conductive layer 35 is provided on a bottom portion of the non-ohmic element 30, and the conductive layer 36 is provided on an upper portion of the non-ohmic element.

The conducive layers 35 and 36 are used as, e.g., electrodes of the non-ohmic element 30. Each of the conductive layers 35 and 36 is formed of any one selected from a silicide, a metal, a metal compound and a conductive semiconductor. Moreover, each of the conductive layers 35 and 36 may be constituted of a stacked body of these materials. The conductive layer 35 or 36 using the silicide will be also referred to as a silicide layer 35 or 36 hereinafter in particular.

In FIG. 3B, a PIN diode is shown as the non-ohmic element. The PIN diode means a diode having an intrinsic semiconductor layer between a P-type semiconductor layer (an anode layer) and an N-type semiconductor layer (a cathode layer). In the configuration depicted in FIG. 3B, a layer 32 sandwiched between two layers 31 and 33 is the intrinsic semiconductor layer, one layer 33 in the two layers 31 and 33 is the p-type semiconductor layer, and the other layer 31 is the N-type semiconductor layer. It is to be noted that the intrinsic semiconductor layer has both a configuration containing no N-type or P-type impurity at all and a configuration having an impurity concentration lower than impurity concentrations of the N-type and P-type semiconductor layers.

The non-ohmic element is not restricted to the PIN diode depicted in FIG. 3B, and a PN diode, an MIS diode, an SIS structure or an MIM structure may be appropriately used in accordance with an operation required for the cell units.

The PN diode means a diode in which a P-type semiconductor layer (an anode layer) and an N-type semiconductor layer (a cathode layer) form a PN junction. The MIS (Metal-Insulator-Semiconductor) diode means a diode having an insulating layer between a metal layer and a semiconductor layer. The MIM (Metal-Insulator-Metal) structure or the SIS (Semiconductor-Insulator-Semiconductor) structure means an element having a configuration in which an insulating layer is sandwiched between two layers consisting of metal layers or semiconductor layers.

In a resistance change memory driven by the unipolar operation, a rectification element such as a diode is mainly used as the non-ohmic element 30. In a resistance change memory driven by the bipolar operation, the MIM structure or the SIS structure is mainly used as the non-ohmic element 30.

In this embodiment, a resistance change memory using the unipolar operation will be explained. However, the resistance change memory according to this embodiment can be of course a memory using the bipolar operation.

Figure 4:
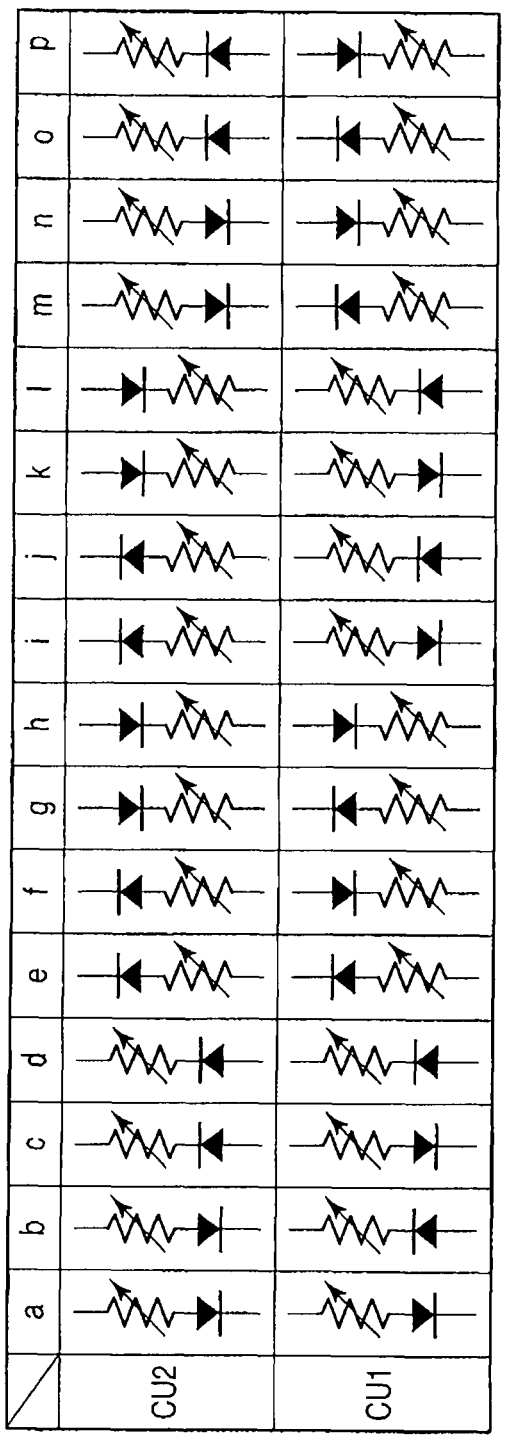
FIG. 4 is a view showing connecting relationships between a memory element and a rectification element.

FIG. 4 shows connecting relationships between the memory element and the rectification element.

In one cell unit, as the connecting relationships between the memory element and the rectification element, there are 4 patterns, i.e., two positional relationships between the memory element and the rectification element and two directions of the rectification element. Therefore, as the connecting relationships between the memory element and the rectification element in each cell unit in the two memory cell arrays, there are 16 patterns (4 patterns×4 patterns). In FIG. 4, reference characters "a" to "p" represent the 16 connecting relationships. This embodiment can be applied to all of the 16 connecting relationships.

For example, the cell unit depicted in FIG. 3B has the configuration of the cell unit CU1 indicated by a in FIG. 4.

FIGS. 5A and 5B show a first example of a layout of the first and second control circuits.

A memory cell array Ms in FIG. 5A corresponds to any one of the memory cell arrays M1, M2, M3 and M4 depicted in FIG. 2. As shown in FIG. 5A, the memory cell array Ms includes a plurality of cell units CUs arranged in an array shape. One end of each cell unit CUs is connected to a control line Ls(j−1), Ls(j) or Ls(j+1), and the other end of each cell unit CUs is connected to a control line Ls+1(i−1), Ls+1(i) or Ls+1(i+1).

As shown in FIG. 5B, a memory cell array Ms+1 includes a plurality of cell units CUs+1 arranged in an array shape. One end of each cell unit CUs+1 is connected to a control line Ls+1(i−1), Ls+1(i) or Ls+1(i+1), and the other end of the same is connected to a control line Ls+2(j−1), Ls+2(j) or Ls+2(j+1).

However, in FIG. 5A and FIG. 5B, "s" is determined as 1, 3, 5, 7 . . . .

The first control circuit 3 is connected to one end of each control line Ls+1(i−1), Ls+1(i) or Ls+1(i+1) in the first direction through a switch element SW1. The switch element SW1 is controlled by, e.g., each control signal $\phi s+1(i-1)$, $\phi s+1(i)$ or $\phi s+1(i+1)$. The switch element SW1 is formed of, e.g., an N-channel type field-effect transistor (FET).

The second control circuit 4 is connected to one end of each control line Ls(j−1), Ls(j) or Ls(j+1) in the second direction through a switch element SW2. The switch element SW2 is controlled by, e.g., each control signal $\phi s(j-1)$, $\phi s(j)$ or $\phi s(j+1)$. The switch element SW2 is formed of, e.g., an N-channel type FET.

The second control circuit 4 is connected to one end of each control line Ls+2(j−1), Ls+2(j) or Ls+2(j+1) in the second direction through a switch element SW2'. The switch element SW2' is connected by, e.g., each control signal $\phi s+2(j-1)$, $\phi s+2(j)$ or $\phi s+2(j+1)$. The switch element SW2' is formed of, e.g., an N-channel type FET.

Figure 6:
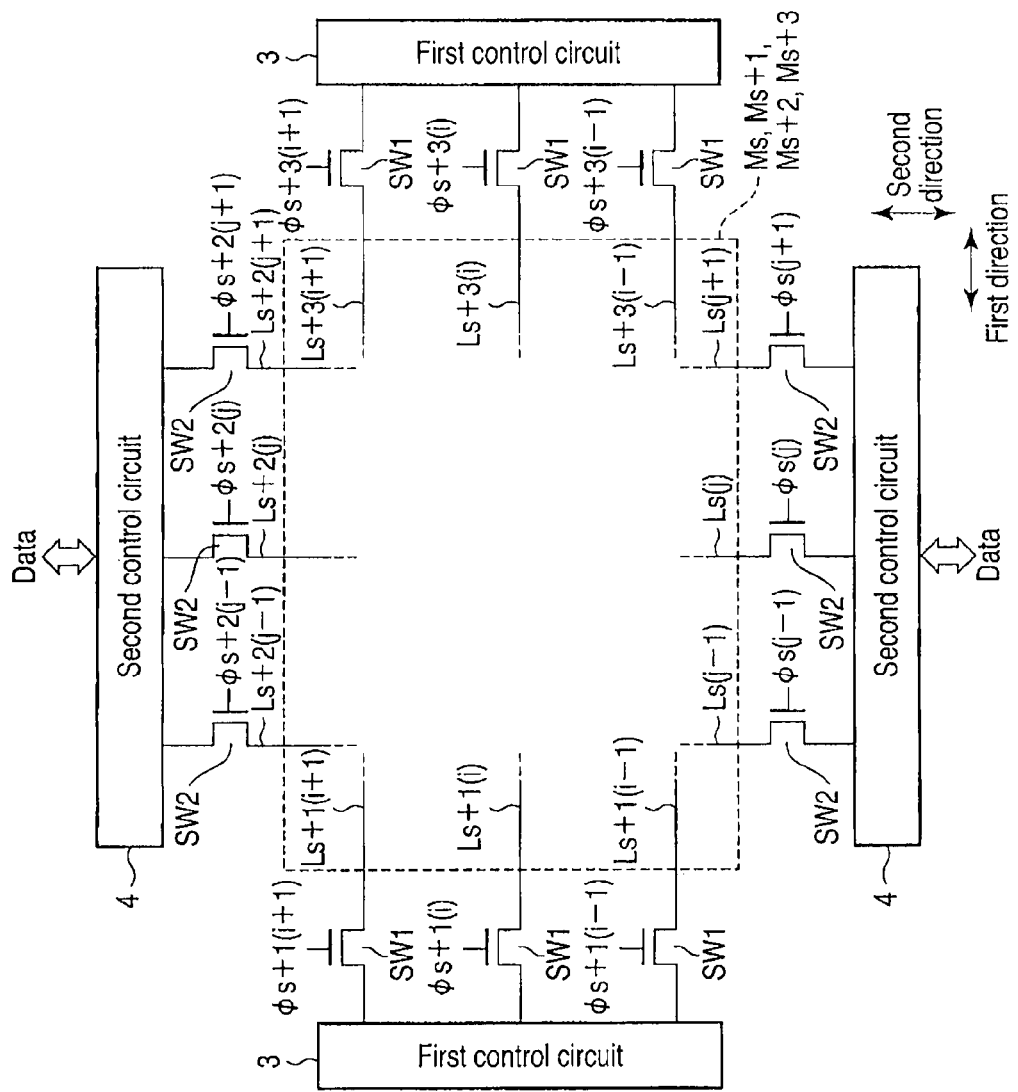
FIG. 6 is a view showing a layout of the first and second control circuits.

FIG. 6 shows a second example of a layout of the first and second control circuits. It is to be noted that an internal configuration of each of the memory cell arrays Ms, Ms+1, Ms+2 and Ms+3 in FIG. 6 is substantially equal to that of the memory cell array depicted in FIG. 5A or FIG. 5B, and hence the illustration of the internal configuration of each memory cell array is omitted in FIG. 6.

The layout in the second example is different from the layout in the first example in that the first control circuits 3 are arranged at both ends of each of the memory cell arrays Ms, Ms+1, Ms+2 and Ms+3 in the first direction and the second control circuits 4 are arranged at both ends of each of the memory cell arrays Ms, ms+1, Ms+2 and Ms+3 in the second direction, respectively. However, "s" in FIG. 6 is determined as 1, 5, 9, 13, . . . .

The first control circuits 3 are connected to both ends of each of the control lines Ls+1(i−1), Ls+1(i) and Ls+1(i+1) in the first direction through the switch elements SW1. The switch element SW1 is controlled by, e.g., each of control signals $\phi s+1(i-1)$, $\phi s+1(i)$, $\phi s+1(i+1)$, $\phi s+3(i-1)$, $\phi s+3(i)$ and $\phi s+3(i+1)$. The switch element SW1 is formed of, e.g., an N-channel type FET.

The second control circuits 4 are connected to both ends of each of the control lines Ls(j−1), Ls(j) and Ls(j+1) in the second direction through the switch elements SW2. The switch element SW2 is controlled by, e.g., each of control signals $\phi s(j-1)$, $\phi s(j)$, $\phi s(j+1)$, $\phi s+2(j-1)$, $\phi s+2(j)$ and $\phi s+2(j+1)$. The switch element SW2 is formed of, e.g., an N-channel type FET.

In each resistance change memory shown in FIG. 5A to FIG. 6, a space in which interconnects are drawn is provided in the chip 1 to connect the control lines in the cross-point type memory cell array 2 to the peripheral circuits 3 and 4 in the chip 1. In this embodiment, this space in which the interconnects are drawn is called a lead area in this embodiment.

Figure 7:
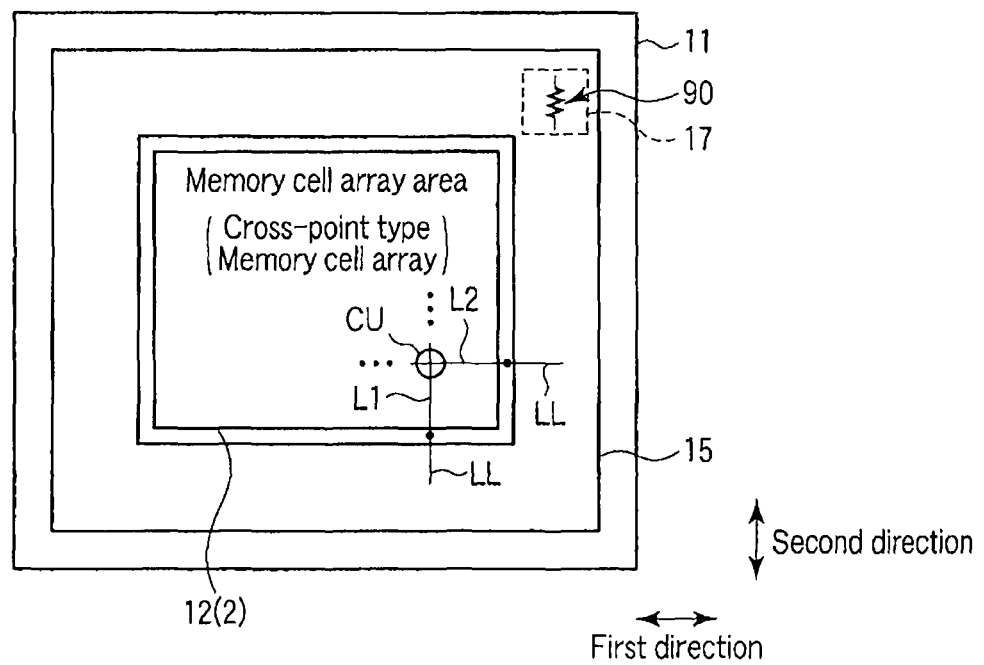
FIG. 7 is a view showing a layout of the vicinity of a cross-point type memory cell array.

For example, as shown in FIG. 7, a lead area (which is also called a hook-up area) 15 is provided on the substrate (e.g., an interlayer insulating film) 15 to be adjacent to an area where the cross-point type memory cell array 2 is provided (which will be referred to as a memory cell array area hereinafter) 12. Further, the control circuits 3 and 4 or the other circuits 6, 7, 8, 9 and 10 are provided as the peripheral circuits on the surface of the semiconductor substrate (an active region) below the memory cell array area 12 and the lead area 15.

In FIG. 7, although the lead area 15 is provided to surround the memory cell array area 12, this embodiment is not restricted thereto, and the lead area 15 may be provided to be adjacent to one end alone of the memory cell array area 12 in the first direction (or the second direction) or the lead area 15 may be provided to be adjacent to one end and the other end of the memory cell array area 12 in the first direction (or the second direction) in accordance with a layout of the interconnects in the lead area 15.

The plurality of control lines included in the cross-point type memory cell array are drawn into the lead area 15 from the memory cell array area 12. In FIG. 7, to simplify the drawing, a control line L1(j) extending in the second direction and a control line L2(i) extending in the first direction in the plurality of control lines are shown.

In the lead area 15, a change in line width of each of the control lines L1(j) and L2(i), a change in interconnect pitch between the control lines (the interconnects) or connection between the interconnects on different interconnect levels is executed.

In this embodiment, a conductive line (wiring) provided in the lead area 15 is called an interconnect.

A contact plug (not shown) is provided in the lead area 15. The contact plug electrically connects two or more interconnects on different interconnect levels with each other. In this embodiment, the interconnect level means a height of an interconnect (a position in the third direction) when the substrate surface is determined as a reference.

In the lead area 15, a region where an interconnect (wiring) LL and the contact plug are provided is called an interconnect area.

An area 17 where a resistive element 90 is formed is disposed on the substrate having the memory cell array area 12 provided thereto. In this embodiment, the area 17 where the resistive element 90 is formed is called a resistive element area 17. The resistive element area 17 is provided in, e.g., the lead area 15. The plurality of resistive elements 90 are provided in the resistive element area 17.

Configurations of the memory cell array area 12, the lead area 15 and the resistive element area 17 will now be described with reference to FIG. 8 to FIG. 10B.

Figure 8:
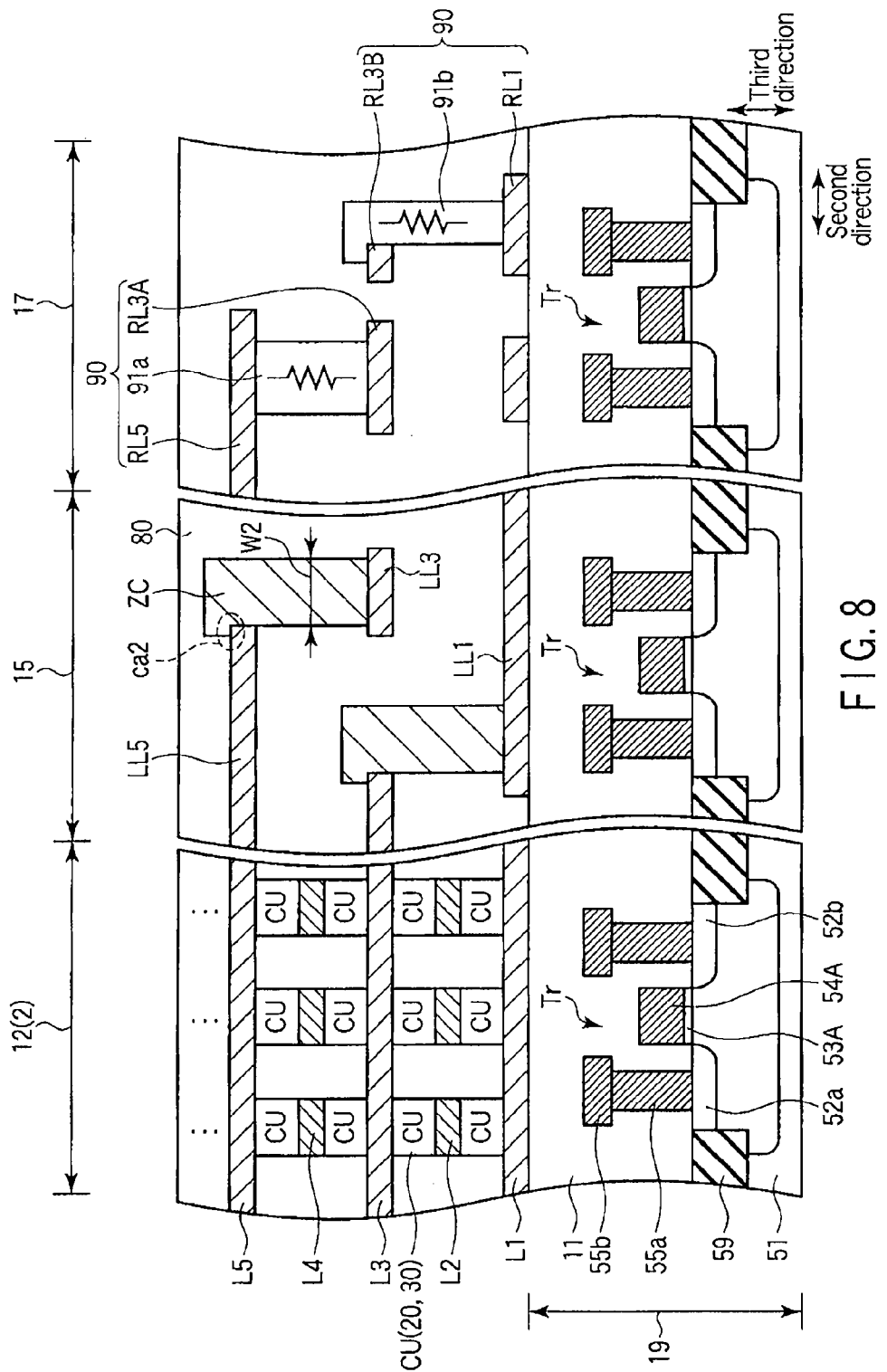
FIG. 8 is a schematic view showing a cross-sectional configuration of a resistance change memory.

FIG. 8 is a view schematically showing a cross-sectional configuration of the resistance change memory according to this embodiment. In FIG. 8, for clarity, the illustration of the interlayer insulating film is omitted.

As shown in FIG. 8, the memory cell array area 12, the lead area 15 and the resistive element area 17 are provided above a peripheral region 19 on the substrate 51.

In the peripheral region 19, a field-effect transistor Tr is provided in an active region defined by an isolation insulating film 59. The field-effect transistor Tr has a source/a drain 52a and 53b and a gate electrode 54. Two diffusion layers 52a and 52b as the source and the drain are provided in the semiconductor substrate (the active region). A gate insulating film 53A is provided on the surface of the substrate (a well region) 51 between the two diffusion layers 52a and 52b. The gate electrode 54A is provided on the gate insulating film 53A.

An intermediate layer 55b is connected to the diffusion layers 52a and 52b through a contact 55a. An upper surface of the semiconductor substrate 1, the field-effect transistor Tr and the intermediate layer 55B are covered with an interlayer insulating film 11.

The interlayer insulating film 11 serves as a substrate for the cross-point type memory cell array 2 in an upper part of the peripheral area 19.

As described above, the cross-point type memory cell array 2 is provided in the memory cell array area 12 assured on the interlayer insulating film (the substrate 51) 11. The cell units CU are provided between control lines L1, L3 and L5 extending in the second direction and control lines L2 and L4 extending in the first direction. The cell unit CU is formed of the memory element 20 and the non-ohmic element 30.

Each of the control lines L1, L2, L3, L4 and L5 is formed of a conductor such as aluminum, copper or a silicide.

The control lines L1, L2, L3, L4 and L5 are drawn into the lead area 15 adjacent to the memory cell array area 12. A line width, an interconnect pitch between interconnects adjacent to each other and an interconnect layout of each of the control lines L1, L2, L3, L4 and L5 are changed in the lead area 15.

The conductive lines in the lead area 15 continuously extend from, e.g., the memory cell array area 12. However, the conductive lines LL in the lead area 15 are individually provided in the lead area 15, and conductive lines which are connected in the lead area 15 to the control lines L1 and L2 drawn into the lead area 15 from the memory cell array area 12 are also present. Conductive lines drawn into the lead area 15 from the memory cell array area 12 and conductive lines drawn into the lead area 15 from the resistive element area 17 will be referred to as interconnects LL1, LL3 and LL5 as portions provided in the lead area 15.

In the lead area 15 adjacent to the memory cell array area 12 in the second direction, the interconnects LL1, LL3 and LL5 are placed on the same interconnect levels as those of the control lines L1, L3 and L5. The interconnects LL1, LL3 and LL5 are drawn on the respective interconnect levels in the lead area 15 to provide a predetermined layout.

The interconnects LL1, LL3 and LL5 connect the memory cell array to the peripheral circuit (the field-effect transistor) by using a multilayer interconnect technology. The interconnects LL1, LL3 and LL5 stacked to sandwich an interlayer insulating film 80 in the third direction are connected through contact plugs ZC buried in the interlayer insulating film 80. The contact plugs ZC are provided in the lead area 15. Each contact plug ZC is provided to cross the plurality of interconnect levels, for example. The contact plugs ZC connect the plurality of interconnects LL1, LL3 and LL5 in the different interconnect levels.

For example, an upper portion of the contact plug ZC has a portion protruding in a direction horizontal to the surface of the substrate 11 (which will be referred to as a protruding portion hereinafter). When this protruding portion is caught by the interconnects, the contact plug ZC is electrically connected to the upper interconnect LL5.

The contact plug may be sandwiched between two interconnects. In this case, an upper surface of the contact plug comes into contact with a bottom surface of the upper interconnect, and a bottom surface of the contact plug comes into contact with an upper surface of the lower interconnect.

The interconnects LL1, LL3 and LL5 are formed by using the same material as that of the control lines L1, L3 and L5 provided on the same interconnect level, for example.

Although FIG. 8 shows the lead area alone which is adjacent to the memory cell array area 12 in the second direction, the lead area which is adjacent to the memory cell array area 12 in the first direction may be of course provided on the substrate 11. The interconnects are mainly provided on the same interconnect levels as the control lines L2 and L4 in the neighboring lead area in the first direction. However, the interconnects on the same interconnect levels as the control lines L2 and L4 may be of course drawn into the lead area 15 adjacent to the memory cell array area 12 in the second direction in accordance with an interconnect layout of the resistance change memory 12.

The resistive element area 17 is provided in the same interconnect layer as the memory cell array area 12 above the peripheral area 19. The resistive element area 17 may be provided between the memory cell array area 12 and the lead area 15.

The plurality of resistive elements 90 are provided in the resistive element area 17. The resistive element 90 includes at least one resistor 91a or 91b which is electrically connected to two resistance lines, i.e., a resistance line RL1, RL3A, RL3B or RL5 and a resistance line RL1, RL3A, RL3B or RL5.

Each resistance line RL1, RL3A, RL3B or RL5 of the resistive element 90 is placed on the same interconnect level as each control line L1, L3 or L5 connected to the cell unit.

In FIG. 8, for example, the resistance line RL1 is placed on the same interconnect level as the control line L1, the resistance lines RL3A and RL3B are placed on the same interconnect level as the control line L3, and the resistance line RL5 is placed on the same interconnect level as the control line L5. The resistance lines RL1, RL3A, RL3B and RL5 are connected to the interconnects or the control lines.

When the resistor is electrically connected to the resistance lines, it may be sandwiched between the resistance line RL1A and the resistance line RL3B like the resistor 91a, or it may be partially in contact with the resistance line RL3B like the resistor 91b.

The resistance lines RL1, RL3A, RL3B and RL5 may be formed of the same material as the control lines L1, L3 and L5, or they may be formed of a material different from that of the control lines L1, L3 and L5. In terms of simplification of manufacturing steps, it is preferable for the resistance lines RL1, RL3A, RL3B and RL5 to be formed by using the same material as the control lines L1, L3 and L5.

The resistors 91a and 91b are made of, e.g., the same material as the contact plugs ZC. Alternatively, the resistors 91a and 91b are made of a material including the cell units CU.

To obtain a predetermined resistance value of each of the plurality of resistive elements 90, configurations and shapes of the resistors, a layout of the resistance lines RL1A, RL3A, RL3B and RL5, the number of the resistors 91a and 91b included in one resistive element, and connecting relationships between the resistance lines RL1, RL3A, RL3B and RL5 and the resistors 91a and 91b are adjusted.

(b) Configuration of Resistive Element

A configuration of the resistive element used in this embodiment will now be described with reference to FIG. 9A to FIG. 19.

(b-1) Basic Configuration

A basic configuration of one resistive element in the resistance change memory according to this embodiment will now be described with reference to FIG. 9A to FIG. 10B.

Each of FIG. 9A to FIG. 10B shows a basic configuration of the resistive element according to this embodiment.

Figure 9A:
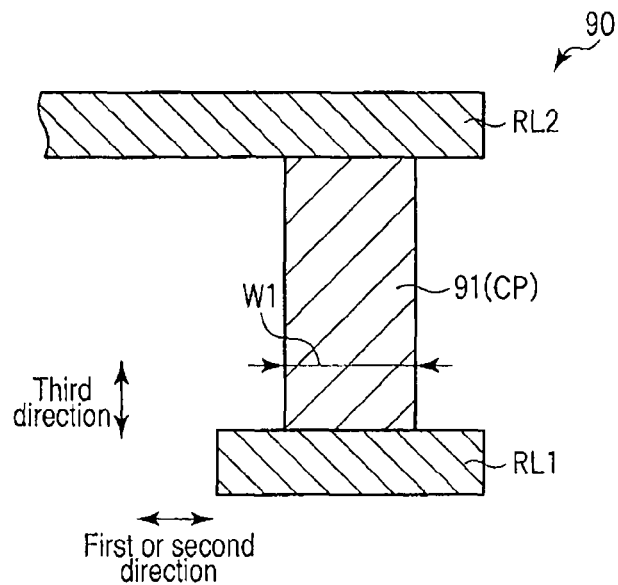
FIG. 9A is a cross-sectional view showing a basic configuration of a resistive element.

FIG. 9A shows an example of a cross-sectional configuration of the resistive element 90.

In the example depicted in FIG. 9A, the resistor 91 is sandwiched between the two resistance lines RL1 and RL2. The resistor 91 is buried in, e.g., the interlayer insulating film (not shown).

When the resistance line RL1 and the resistance line RL2 have different interconnect levels, the interconnect level of the resistance line RL2 may be immediately above the counterpart of the resistance line RL1, or it may be 2 levels above the counterpart of the resistance line RL1. For example, a material of the resistance lines RL1 and RL2 is made of the same material as the control lines or the interconnects. In this case, the resistance lines RL1 and RL2 are formed of aluminum (Al), copper (Cu), tungsten (W) or a silicide.

However, when the control lines are formed of a silicide, the resistance lines RL1 and RL2 may be formed by using silicon (doped-Si). A resistivity of the silicon which is a base material for forming the silicide is higher than a resistivity of the silicide. Therefore, when a silicide treatment is prevented from being executed with respect to the silicon for forming the resistance lines, the resistivity of the resistance lines RL1 and RL2 formed of the silicon becomes higher than the resistivity of the resistance lines formed of the silicide.

For example, the resistor 91 is formed of the same material as the contract plug ZC that connects the interconnects on the different interconnect levels to each other. In this case, the resistor 91 is formed of tungsten (W) or molybdenum (Mo). In terms of simplification of manufacturing steps, it is preferable for the resistor 91 to be formed of the same material as the contact plug ZC.

Electric resistance is proportionate to a resistivity of the resistor 91 and a length of the resistor, and it is inversely proportionate to a cross-sectional area of the resistor. Therefore, in the resistive element 90 according to this embodiment, a resistance value of the resistor 91 is proportionate to a dimension (a length or a height) in a direction vertical to the substrate surface (the third direction), and it is inversely proportionate to a dimension (the cross-sectional area) in a direction horizontal to the substrate surface (the first or second direction).

Therefore, to increase the resistance value of the resistive element 90, it is preferable for a dimension W1 of the resistor 91 in the direction horizontal to the substrate surface to be smaller than a dimension W2 of the contact plug ZC, which is such a contact plug ZC configured to connect the interconnects LL3 and LL5 to each other as depicted in FIG. 8, in the direction horizontal to the substrate surface. In case that the dimension W1 of the resistor 91 is reduced, reliability of the resistive element is assured.

It is to be noted that, if a material used for the resistor is a conductor, a material having a resistivity higher than that of a material used for the contact plug may be utilized for the resistor 91.

Figure 9B:
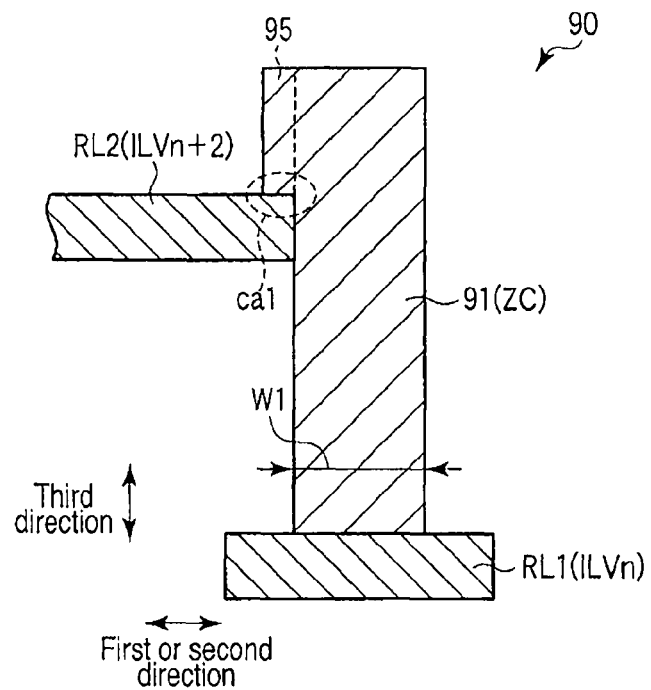
FIG. 9B is a cross-sectional view showing a basic configuration of a resistive element.

Like FIG. 9A, FIG. 9B shows a cross-sectional configuration of the resistive element in which the same configuration as the contact plug is used for the resistor.

In the resistive element 90 depicted in FIG. 9B, a shape of the contact plug as the resistor is different from that in the resistive element shown in FIG. 9A. Like the contact plug ZC shown in FIG. 8 and the resistor 91 depicted in FIG. 9B, the contact plug (the resistor) having a protruding portion at an upper part thereof in the cross-sectional shape of the resistor is used to two or more stacked memory cell arrays, as will be described later in conjunction with a manufacturing method.

In the resistive element 90 shown in FIG. 9B, the resistance line RL2 is placed on, e.g., an interconnect level ILVn+2 which is two levels above an interconnect level ILVn of the resistance line RL1. Here, n is an integer equal to or above 1.

In the resistor 91, when a protruding portion 95 protruding in the horizontal direction to the substrate surface is in contact with an upper surface of an end portion of the upper resistance line RL2, the resistor 91 is electrically connected with the resistance line RL2.

In the resistive element 90 depicted in FIG. 9B, when a contact area ca1 of the resistance line RL2 and the resistor 91 is reduced to be smaller than a contact area ca2 of the interconnect LL5 and the contact plug ZC depicted in FIG. 8 insofar as reliability of the resistive element 90 can be assured, a resistance value of the resistive element 90 can be raised based on an increase in contact resistance.

Further, it is also preferable for a dimension W1 of the resistor 91 in the substrate horizontal direction to be smaller than a dimension W2 of the contact plug ZC. In this embodiment, the dimensions W1 and W2 of the contact plug ZC having the protruding portion 95 and the resistor 91 (ZC) are determined as dimensions below the protruding portion 95.

Figure 9C:
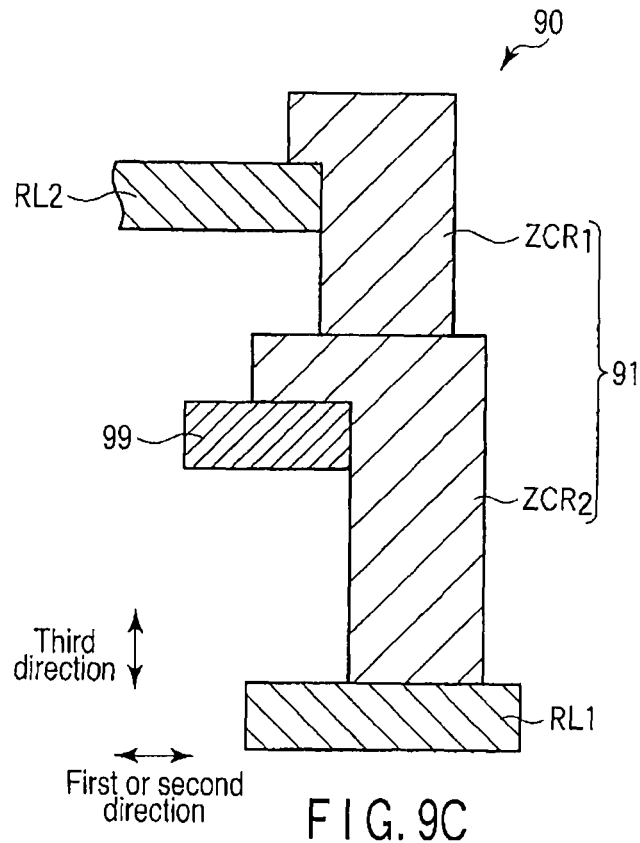
FIG. 9C is a cross-sectional view showing a basic configuration of a resistive element.

FIG. 9C shows a cross-sectional configuration of the resistive element 90 using a plurality of contact plugs as a resistor.

As shown in FIG. 9C, a stacked body constituted of a plurality of contact plugs $ZCR_1$ and $ZCR_2$ may be used as one resistor 91 connected to two resistance lines.

One contact plug $ZCR_2$ in the plurality of contact plugs may be in contact with a dummy layer 99 placed on an interconnect level between the two resistance lines RL1 and RL2. When the contact plugs $ZCR_1$ and $ZCR_2$ as the resistor 91 are stacked in this manner, a length (a dimension in the third direction) of the resistor 91 is prolonged, and a resistance value of the resistor 91 is increased. As a result, a resistance value of the resistive element 90 rises.

Figure 10A:
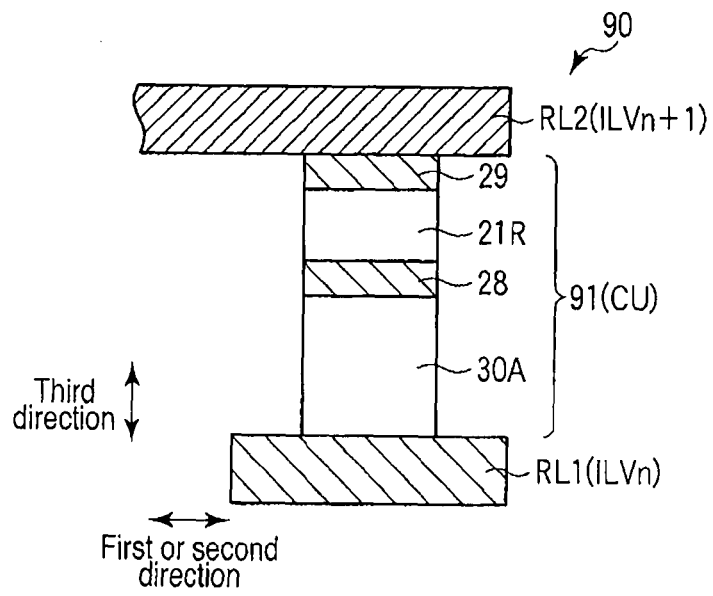
FIG. 10A is a cross-sectional view showing a basic configuration of a resistive element.
Figure 10B:
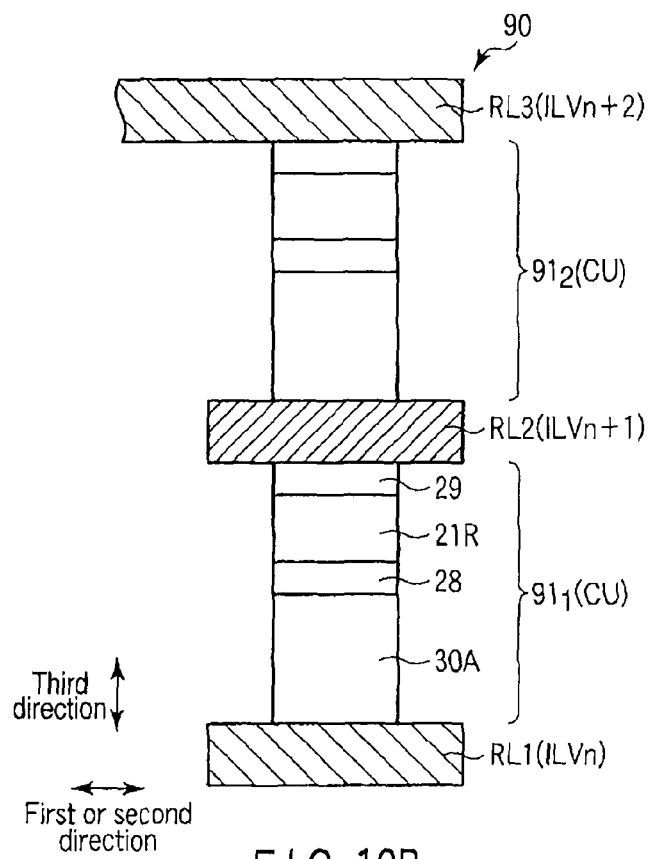
FIG. 10B is a cross-sectional view showing a basic configuration of a resistive element.

Each of FIG. 10A and FIG. 10B shows a cross-sectional configuration of the resistive element 90 in which constituent members included in the cell unit are used for the resistor.

The resistor 91 has substantially the same configuration as the cell unit CU in the memory cell array. That is, the resistor 91 includes the same constituent members as the memory element 20 and the non-ohmic element 30 in the cell unit CU. As a result, the resistor 91 in the resistive element and the cell unit CU can be simultaneously processed, thereby simplifying manufacturing steps of the resistance change memory.

For example, the resistor 91 includes a stacked body 30A, a resistive film 21R and two conductive layers 28 and 29.

The stacked body 30A is formed of, e.g., a constituent member of the non-ohmic element 30 in the cell unit. However, it is preferable for the stacked body 30A to avoid showing non-ohmic characteristics or to have a small difference between reverse bias characteristics and forward bias characteristics, without being dependent on the directions a current and a voltage are applied, for reliability of the resistive element. Furthermore, it is also preferable for the stacked body 30A not to include insulator. When the entire stacked body 30A is formed of a semiconductor layer, it is preferable for an impurity profile in the stacked body 30A to be different from an impurity profile of the non-ohmic element 30. For example, it is preferable for the entire stacked body 30A formed of a semiconductor to be constituted of an n-type semiconductor layer or a p-type semiconductor layer.

A relationship between the resistive film 21R and the two conductive layers 28 and 29 is equal to the constituent element of the memory element 20. The resistive film 21R is formed of the same material as that of the resistance change film 21 of the memory element 20, and the conductive layers 28 and 29 are formed of the same material as that of the electrode layers 25 and 26 of the memory element 20.

A resistance value of the resistive film 21R can be changed by applying a predetermined current/voltage pulse like the resistance change film 21 of the memory element 20. Therefore, a resistance value of the resistive element 90 can be modulated in the range of a resistance value which can be taken by the resistive film 21R. However, at the time of driving the resistance change memory (actual use), it is preferable to supply a current/voltage pulse which does not change a resistance value of the resistive film 21R to the resistive element 90.

Since the resistor 91 has substantially the same configuration as the cell unit CU, it is provided between the resistance line RL1 placed on a given interconnect level ILVn (where n≥1) and the resistance line RL2 placed on an interconnect level ILVn+1 that is immediately above the former level.

It is to be noted that the resistive film 21R is provided above the stacked body 30A in FIG. 10A, but the stacked body 30A may be provided above the resistive film 21R depending upon the configuration of the cell unit in the memory cell array (see FIG. 4).

FIG. 10B shows a cross-sectional configuration of the resistive element 90 using a plurality of cell units as resistors.

In the resistive element 90 shown in FIG. 10B, two resistors $91_1$ and $91_2$ are provided between the resistance line RL1 on a given interconnect level ILVn and the resistance line RL3 placed on an interconnect level ILVn+2 which is two levels above the former level. The resistance line (an intermediate layer) RL2 placed on an interconnect level ILVn+1 which is immediately above the resistance line RL1 is sandwiched between the two stacked resistors $91_1$ and $91_2$.

When the cell units CU are used as the resistors, the resistance lines RL1, RL2 and RL3 do not have to extend in the same directions as the control lines LL1 to LL5 provided on the same interconnect levels as those of the resistance lines. Furthermore, the resistance line RL2 may be electrically separated from the interconnect or the control line on the same interconnect level as the resistance line RL2 or may be connected to the interconnect or the control line on the same interconnect level in accordance with a connecting relationship between the resistive element 90 and a circuit.

As shown in FIG. 10B, since the resistive element 90 using the constituent members of the cell unit as the resistors has substantially the same configuration as the cross-point type memory cell array, the resistor 91 can be readily stacked and an occupied area of the resistive element can be reduced in terms of a process.

In the resistance change memory according to this embodiment, since the number of the interconnect levels in the resistive element area 15 is equal to the number of the interconnect levels of the cross-point type memory cell array, the number of resistor layers in the resistive element area 15 can be adjusted in the range of the number of the memory cell array layers. Moreover, the number of manufacturing steps of the resistance change memory is not increased by stacking the plurality of resistors.

Increasing a dimension of one resistor in a stacking direction is difficult since there is a processing restriction arising from an aspect ratio. However, like this embodiment, when the resistor 91 and the resistance lines RL1 and RL2 constituting the resistive element are simultaneously formed on the same interconnect levels (the interconnect layers) as the cross-point type memory cell arrays by using a process that is common to a memory cell array forming process, the increasing in the number of manufacturing steps and the restriction arising from the aspect ratio can be suppressed, and the dimension of the resistor in the stacking direction can be increased.

Additionally, in the resistive element of the resistance change memory according to this embodiment, since a resistance value of the resistive element can be raised by increasing the dimension of the resistive element in the stacking direction, it is possible to suppress an occupied area of the resistive element in the direction horizontal to the substrate surface from becoming large due to an increase in resistance value.

(b-2) Layout

A planar layout and a cross-sectional configuration of the resistive element will now be described with reference to FIG. 11A to FIG. 18B. It is to be noted that the illustration of the interlayer insulating film is omitted in FIGS. 11A to 18B to clarify the drawings.

The resistive element 90 used for the resistance change memory according to this embodiment includes at least one resistor and at least two resistance lines connected to one end and the other end of this resistor. A description will be given as to a configuration and a layout of the resistive element using two or more resistors.

Figure 11A:
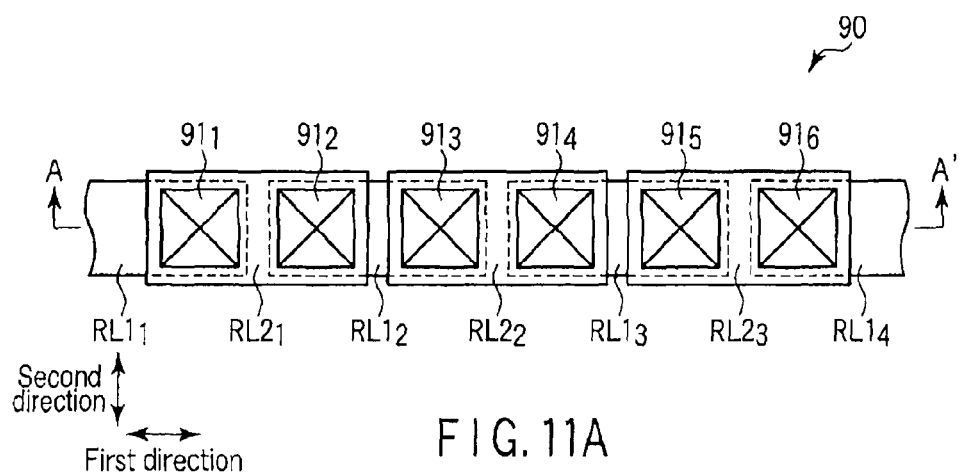
FIG. 11A is a plan view showing an example of a layout of a resistive element.

FIG. 11A is a plan view showing an example of a layout of the resistive element. FIG. 11B shows a cross-sectional configuration taken along a line A-A' in FIG. 11A.

In an example depicted in FIG. 11A, a resistive element 90A has a linear planar layout. As shown in FIG. 11B, a plurality of resistors $91_1$ to $91_6$ are connected in series between one end and the other end of the resistive element 90A through a plurality of resistance lines $RL1_1$ to $RL1_4$ and $RL2_1$ to $RL2_3$.

In the resistive element depicted in FIG. 11A and FIG. 11B, the six resistors $91_1$, $91_2$, $91_3$, $91_4$, $91_5$ and $91_6$ are used. However, when the number of the resistors constituting one resistive element is not smaller than 1, the number is not restricted to 6.

The resistors $91_1$, $91_2$, $91_3$, $91_4$, $91_5$ and $91_6$ may be formed of the same members as the contact plug or may be formed of the same members as the cell unit. As shown in FIG. 11A and FIG. 11B, in the resistive element 90 of the resistance change memory according to this embodiment, a planar shape of each of the resistors $91_1$, $91_2$, $91_3$, $91_4$, $91_5$ and $91_6$ is a square shape, but it may be a circular or elliptic planar shape.

In the resistive element depicted in FIG. 11A and FIG. 11B, the plurality of resistance lines $RL1_1$ to $RL1_4$ and $RL2_1$ to $RL2_3$ placed on the two interconnect levels are used.

The resistance lines $RL1_1$, $RL1_2$, $RL1_3$ and $RL1_4$ are placed on an interconnect level ILVn, and the resistance lines $RL2_1$, $RL2_2$ and $RL2_3$ are placed on an interconnect level ILVm. Here, "n" is an integer which is not smaller than 1 (1, 2, 3, . . . ), and "m" is an integer larger than "n".

The resistance lines $RL1_1$ to $RL1_4$ and $RL2_1$ to $RL2_3$ are arranged along a given direction (the first direction in this example).

The interconnect level ILVm of the resistance lines $RL2_1$, $RL2_2$ and $RL2_3$ may be an interconnect level which is immediately above or two or more levels above the interconnect level ILVn of the resistance lines $RL1_1$, $RL1_2$, $RL1_3$ and $RL1_4$ as long as it is different from the interconnect level ILVn.

Further, the resistance lines $RL2_1$, $RL2_2$ and $RL2_3$ may be provided on different interconnect levels, respectively.

One resistance line $RL2_1$ placed on the interconnect level ILVm is arranged on an upper (or lower) interconnect level to get across one end/the other end of each of the two resistance lines $RL1_1$ and $RL1_2$ placed on the interconnect level ILVn.

One resistor $91_1$ is provided between the two resistance lines $RL1_1$ and $RL2_1$ on different interconnect levels. At the same time, each of the resistors $91_2$, $91_3$, $91_4$, $91_5$ and $91_6$ is provided between each pair of the resistance lines $RL1_2$, $RL1_3$, $RL1_4$, $RL1_1$, $RL2_2$ and $RL2_3$ placed on different interconnect levels.

That is, the resistance line $RL1_1$ and the resistor $91_1$ are arranged in such a manner that a bottom surface of the resistor $91_1$ is in contact with an upper surface of the resistance line $RL1_1$ at one end, and the resistor $91_1$ and the resistance line $RL2_1$ are arranged in such a manner that a bottom surface of the resistance line $RL2_1$ at one end is in contact with an upper surface of the resistor $91_1$. The resistance line $RL2_1$ and the resistor $91_2$ are arranged in such a manner that an upper surface of the resistor $91_2$ is in contact with a bottom surface of the resistance line $RL2_1$ at the other end, and the resistor $91_2$ and the resistance line $RL1_2$ are arranged in such a manner that an upper surface of the resistance line $RL1_2$ at one end is in contact with a lower surface of the resistor $91_2$. When such a layout is repeated, the resistors $91_2$, $91_3$, $91_4$, $91_5$ and $91_6$ are connected in series, thereby forming the resistive element. It is to be noted that the other end of the resistance line $RL1_1$ and the other end of the resistance line $RL1_4$ are connected to the interconnects or the control lines. As described above, according to the resistive element 90 depicted in FIG. 11A and FIG. 118, a predetermined resistance value can be obtained by adjusting the number of the resistors, dimensions of the resistors and lengths of the resistance lines.

The resistors connected in series will be referred to as a resistor chain hereinafter.

Although FIG. 11B shows resistors $91_1$ to $91_6$ each of which is sandwiched between each pair of resistance lines $RL1_1$ to $RL1_4$ and $RL2_1$ to $RL2_3$, resistors each having the protruding portion 95 may be connected in series as depicted in FIG. 11C. In the two resistors $91_1$ and $91_2$ connected to each other through the upper resistance line $2_1$, their protruding portions 95 may be in contact with each other on the resistance line $2_1$. In this case, the resistor has a concave cross-sectional shape facing the lower side.

That is, the resistance line $RL1_1$ and the resistor $91_1$ are arranged in such a manner that a bottom surface of the resistor $91_1$ is in contact with an upper surface of the resistance line $RL1_1$ at one end. The resistor $91_1$ and the resistance line $RL2_1$ are arranged in such a manner that a side surface of the resistance line $RL2_1$ at one end is in contact with a side surface of the resistor $91_1$ and that an upper surface of the resistance line $RL2_1$ at one end is in contact with the protruding portion 95. The resistance line $RL2_1$ and the resistor $91_2$ are arranged in such a manner that a side surface of the resistor $91_2$ is in contact with a side surface of the resistance line $RL2_1$ at the other end and that the protruding portion 95 is in contact with an upper surface of the resistance line $RL2_1$ at the other end. The resistor $91_2$ and the resistance line $RL1_2$ are arranged in such a manner that a bottom surface of the resistor $91_2$ is in contact with an upper surface of the resistance line $RL1_2$ at one end. When such a layout is repeated, the resistors $91_2$, $91_3$, $91_4$, $91_5$ and $91_6$ are connected in series, thereby forming the resistive element. It is to be noted that the other end of the resistance line $RL1_1$ and the other end of the resistance line $RL1_4$ are connected to the interconnects or the control lines.

Figure 11D:
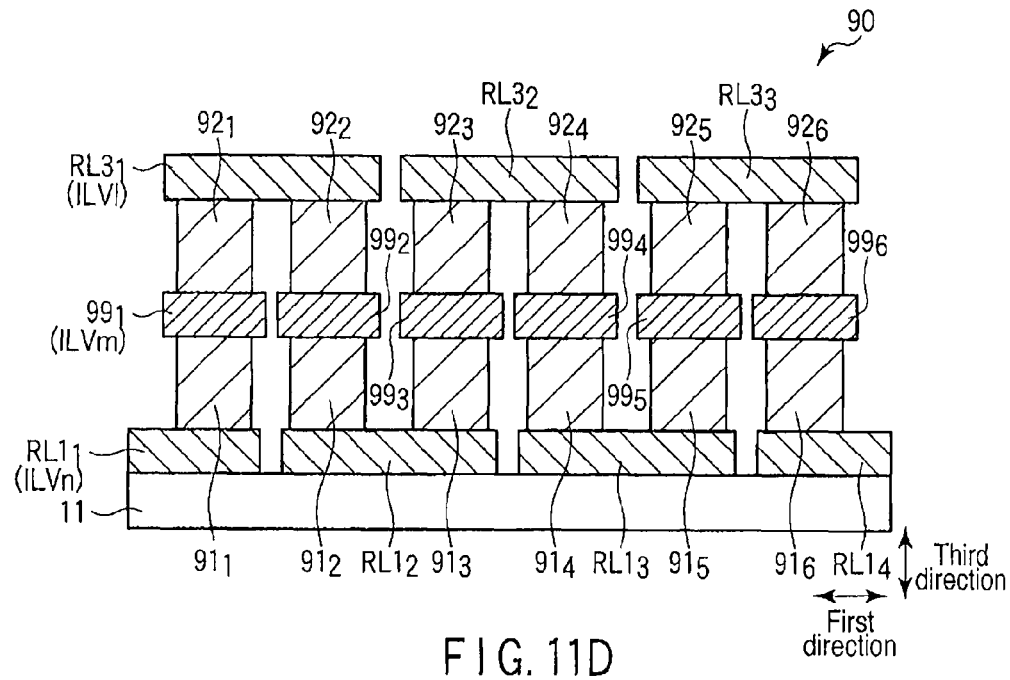
FIG. 11D is a cross-sectional view showing a structural example of the resistive element depicted in FIG. 11A.

In FIG. 11B and FIG. 11C, the resistance lines $RL1_1$ to $RL1_4$ and $RL2_1$ to $RL2_3$ placed on two different interconnect levels ILVn and ILVm are utilized to connect the plurality of resistors $91_1$ to $91_6$ in series. However, as shown in FIG. 11D, resistance lines $RL1_1$ to $RL1_4$ and $RL2_1$ to $RL2_3$ and intermediate layers (resistance lines) $99_1$ to $99_6$ placed on three or more interconnect levels ILV1, ILVm and IVLn can be of course utilized to connect a plurality of resistors $91_1$ to $91_6$ and $92_1$ to $92_6$. The resistor $92_1$ is stacked on the resistor $91_1$ through the intermediate layer $99_1$. Likewise, the resistors $92_2$, $92_3$, $92_4$, $92_5$ and $92_6$ are stacked on the resistors $91_2$, $91_3$, $91_4$, $91_5$ and $91_6$ through the intermediate layers $99_2$ to $99_6$.

That is, the resistance line $RL1_1$ and the resistor $91_1$ are arranged in such a manner that a bottom surface of the resistor $91_1$ is in contact with an upper surface of the resistance line $RL1_1$ at one end. The resistor $92_1$ is arranged above the resistor $91_1$ through the intermediate layer $99_1$. The resistor $92_1$ and the resistance line $RL2_1$ are arranged in such a manner that a bottom surface of the resistance line $RL2_1$ is in contact with an upper surface of the resistor $92_1$. The resistance line $RL2_1$ and the resistor $92_2$ are arranged in such a manner that an upper surface of the resistor $92_2$ is in contact with a bottom surface of the resistance line $RL2_1$ at the other end. The resistor $91_2$ is arranged below the resistor $92_2$ via the intermediate layer $99_2$. The resistor $91_2$ and the resistance line $RL1_2$ are arranged in such a manner that a bottom surface of the resistor $91_2$ is in contact with an upper surface of the resistance line $RL1_2$ at one end. When such a layout is repeated, the resistors $91_2$, $91_3$, $91_4$, $91_5$ and $91_6$ and the resistors $92_2$, $92_3$, $92_4$, $92_5$ and $92_6$ are connected in series, thereby forming the resistive element. It is to be noted that the other end of the resistance line $RL1_1$ and the other end of the resistance line $RL1_4$ are connected to the interconnects or the control lines.

Like the resistive element 90 shown in FIG. 11D, when the resistance lines on the three or more interconnect levels are used, the number of the resistors included in one resistive element 90 can be increased in the same occupied area as that of the resistive element depicted in FIG. 11B. Therefore, the resistive element 90 in FIG. 11D can have a resistance value higher than that of the resistive element shown in FIG. 11B.

Like the resistive element having the linear layout shown in each of FIG. 11A to FIG. 11D, adopting the configuration in which the cross-sectional structure of the resistive element is turned in the staking direction of the interconnects enables increasing a substantial length of the resistive element. Therefore, the resistance value of the resistive element can be raised without excessively increasing the occupied area of the resistive element on the substrate (the chip).

In the following layout example of the resistive element, the configurations shown in FIG. 11B to FIG. 11D can be applied. However, to simplify the explanation, like the cross-sectional configuration depicted in FIG. 11B, a cross-sectional configuration such that the same member as the contact plug is sandwiched between the two resistance lines is exemplified to describe a layout and the cross-sectional configuration of the resistive element according to this embodiment.

Figure 12A:
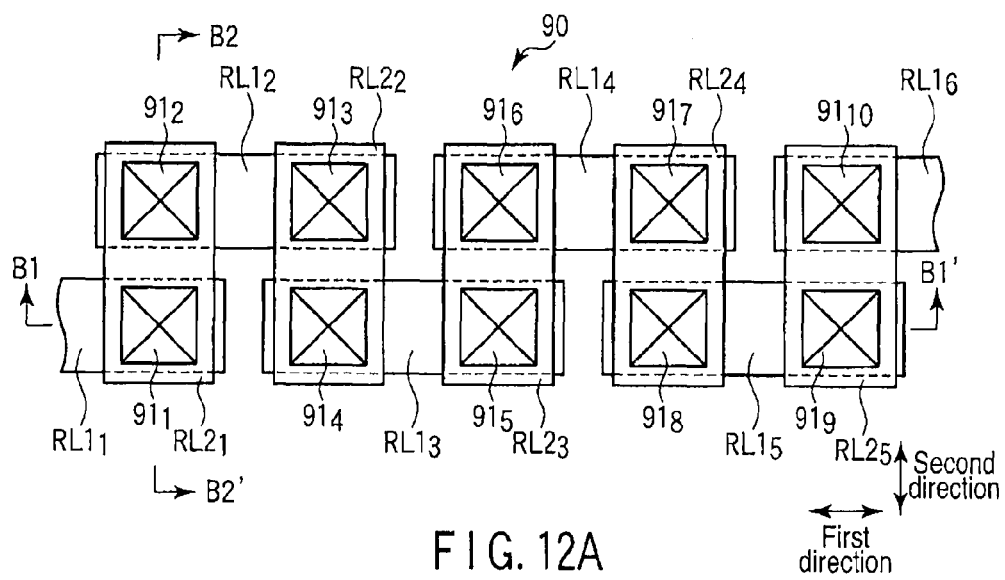
FIG. 12A is a plan view showing an example of a layout of a resistive element.
Figure 12B:
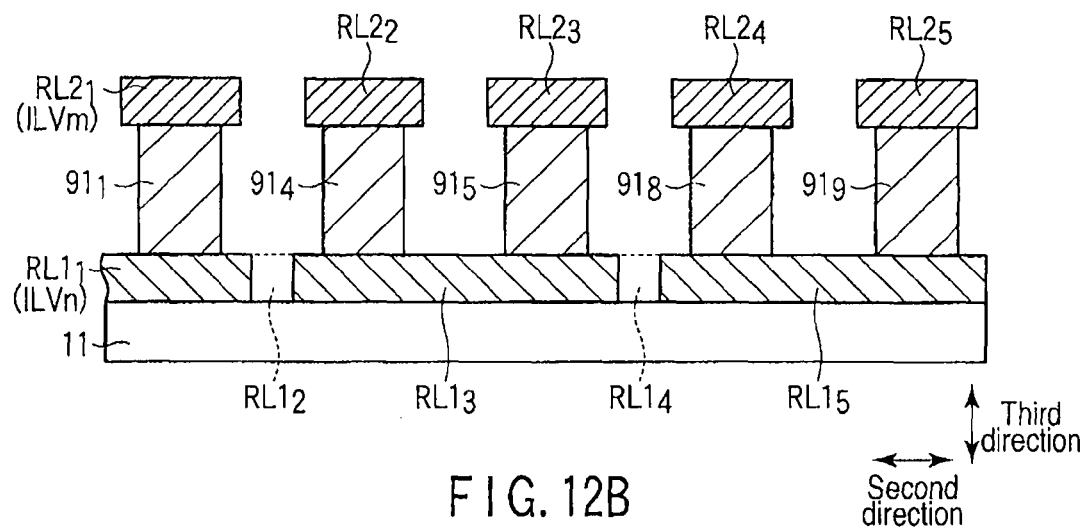
FIG. 12B is a cross-sectional view showing a structural example of the resistive element depicted in FIG. 12A.
Figure 12C:
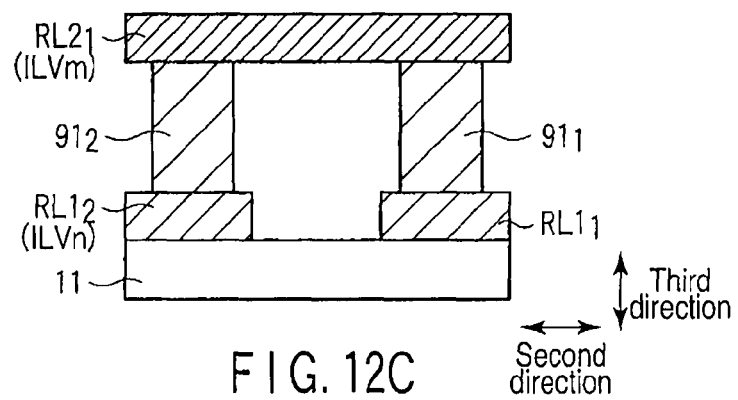
FIG. 12C is a cross-sectional view showing a structural example of the resistive element depicted in FIG. 12A.

FIG. 12A is a plan view showing an example of a layout of the resistive element. FIG. 12B shows a cross-sectional configuration taken along a line B1-B1' in FIG. 12A. FIG. 12C shows a cross-sectional configuration taken along a line B2-B2' in FIG. 12A.

As depicted in FIG. 12A, FIG. 12B and FIG. 12C, resistance lines $RL1_1$ to $RL1_5$ and $RL2_1$ to $RL2_5$ on two or more different interconnect levels ILVn and ILVm may be utilized to form a resistive element having a meandering layout. That is, the layout of the resistive element shown in FIG. 12A corresponds to a configuration in which the layout of the resistive element shown in FIG. 11A meanders.

Resistance lines $RL1_1$ to $RL1_5$ placed on an interconnect level ILVn extend in a given direction (the second direction in this example). Resistance lines $RL2_1$ to $RL2_5$ placed on a interconnect level ILVm extend in a direction (the first direction in this example) crossing the extending direction of the resistance lines $RL1_1$ to $RL1_5$.

In the resistance lines $RL1_1$ to $RL1_5$ placed on the interconnect level ILVn, one end and the other end of each of the resistance lines $RL1_1$ to $RL1_5$ are adjacent to each other in the second direction. For example, one end of the resistance line $RL1_2$ is adjacent to one end of the resistance line $RL1_1$ in the second direction, and the other end of the resistance line $RL1_2$ is adjacent to one end of the resistance line $RL1_3$ in the second direction. That is, the resistance lines $RL1_1$, $RL1_3$ and $RL1_5$ are arranged at fixed intervals in the second direction. As a result, a first resistor chain is formed. Likewise, the resistance lines $RL1_2$, $RL1_4$ and $RL1_6$ are arranged at fixed intervals in the second direction, thereby forming a second resistor chain. In the first resistor chain and the second resistor chain, positions of the respective resistance lines constituting these chains are arranged to shift in the first direction.

Each of the resistance lines $RL2_1$ to $RL2_5$ is arranged in each upper layer of the resistance lines $RL2_1$ to $RL1_5$ to get across each portion where the resistance lines $RL1_1$ to $RL1_5$ are adjacent to each other. It is to be noted that the layout of the resistance lines $RL1_1$ to $RL1_5$ and the layout of the resistance lines $RL2_1$ to $RL1_5$ may be counterchanged.

As described above, in the two resistance lines connected to one end and the other end of the resistor 91, when the extending direction of the resistance line on one interconnect level is set to be different from that of the resistance line on the other interconnect level, a degree of freedom of the layout of the resistive element can be improved.

Figure 13A:
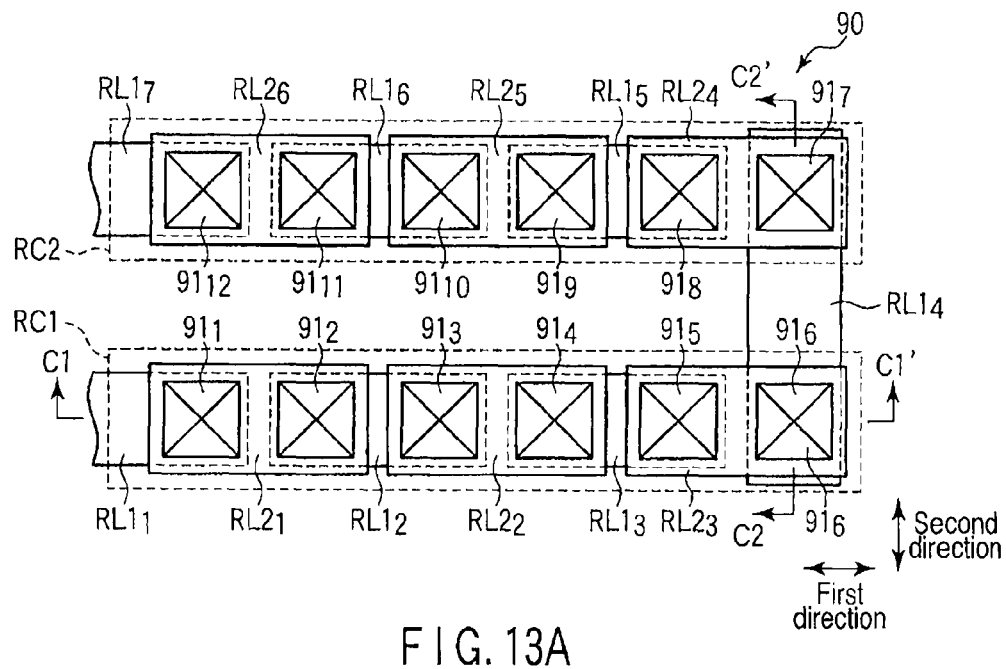
FIG. 13A is a plan view showing an example of a layout of a resistive element.
Figure 13B:
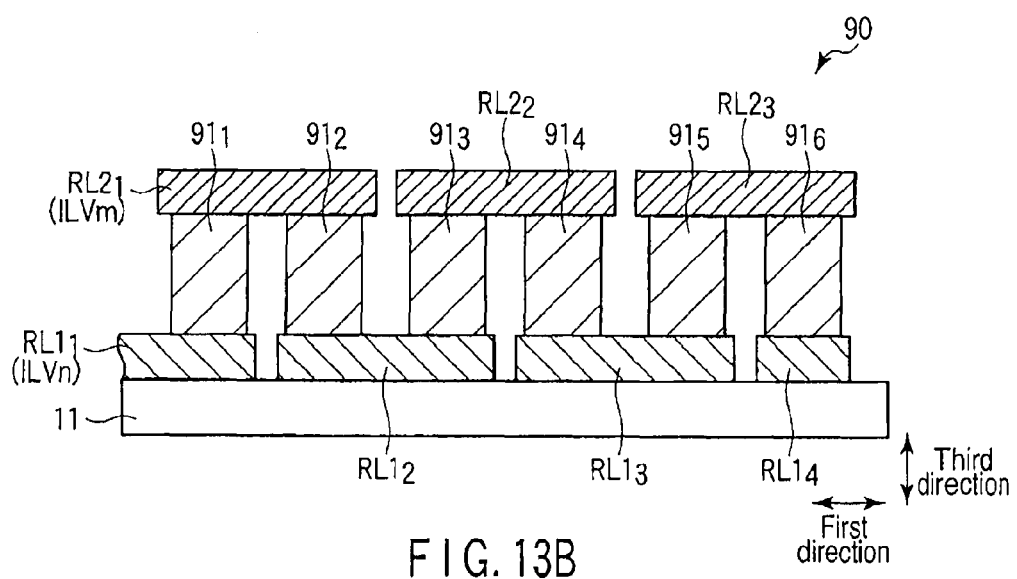
FIG. 13B is a cross-sectional view showing a structural example of the resistive element depicted in FIG. 13A.

FIG. 13A is a plan view showing an example of the layout of the resistive element. FIG. 13B shows an example of a cross-sectional configuration taken along a line C1-C1' in FIG. 13A, FIG. 13C shows an example of a cross-sectional configuration taken along a line C2-C2' in FIG. 12A.

Figure 13C:
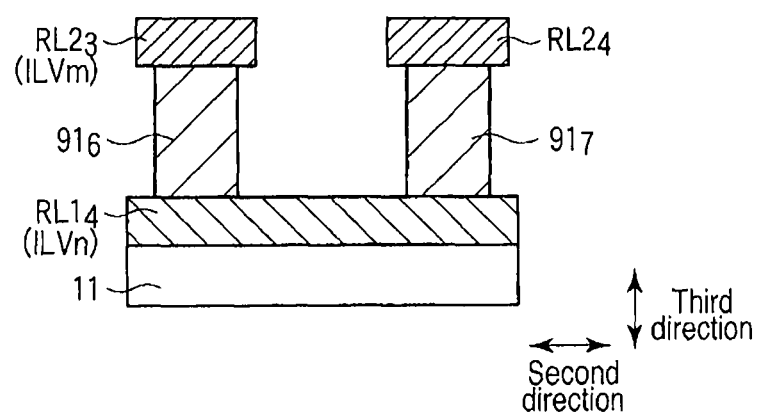
FIG. 13C is a cross-sectional view showing a structural example of the resistive element depicted in FIG. 13A.

In FIG. 13A to 13C, two resistor chains RC1 and RC2 are provided on the interlayer insulating film 11 to be adjacent to each other in the second direction.

The resistor chain RC1 is constituted of resistance lines $RL1_1$, $RL1_2$ and $RL1_3$ on an interconnect level ILVn, resistance lines $RL2_1$, $RL2_2$ and $RL2_3$ on an interconnect level ILVm, and a plurality of resistors $91_1$, $91_2$, $91_3$, $91_4$, $91_5$ and $91_6$ sandwiched between the resistance lines $RL1_1$ to $RL1_3$ and $RL2_1$ to $RL2_3$, respectively.

The resistor chain RC2 is constituted of resistance lines $RL1_5$, $RL1_6$ and $RL1_7$ on the interconnect level ILVn, resistance lines $RL2_4$, $RL2_5$ and $RL2_6$ on the interconnect level ILVm, and a plurality of resistors $91_7$, $91_8$, $91_9$, $91_{10}$, $91_{11}$ and $91_{12}$ sandwiched between the resistance lines $RL1_5$ to $RL1_7$ and $RL2_4$ to $RL2_6$, respectively. The interconnect levels of the resistance lines used in the resistor chain RC1 may be different from the interconnect levels of the resistance lines used in the resistor chain RC2.

Furthermore, as shown in FIG. 13A, FIG. 13B and FIG. 13C, a resistance line $RL1_4$ is provided to get across the two resistor chains RC1 and RC2 each having the linear layout, thereby connecting the two resistor chains RC1 and RC2 to each other. In the example shown in FIG. 13A and FIG. 13B, the resistance line $RL1_4$ on the lower interconnect level ILVn is utilized to connect the two resistor chains RC1 and RC2 to each other.

When the two or more resistor chains are connected through the resistance line in this manner, a high resistance value can be obtained, and a degree of freedom of the layout of the resistive element in the resistive area 17 can be improved.

Figure 14A:
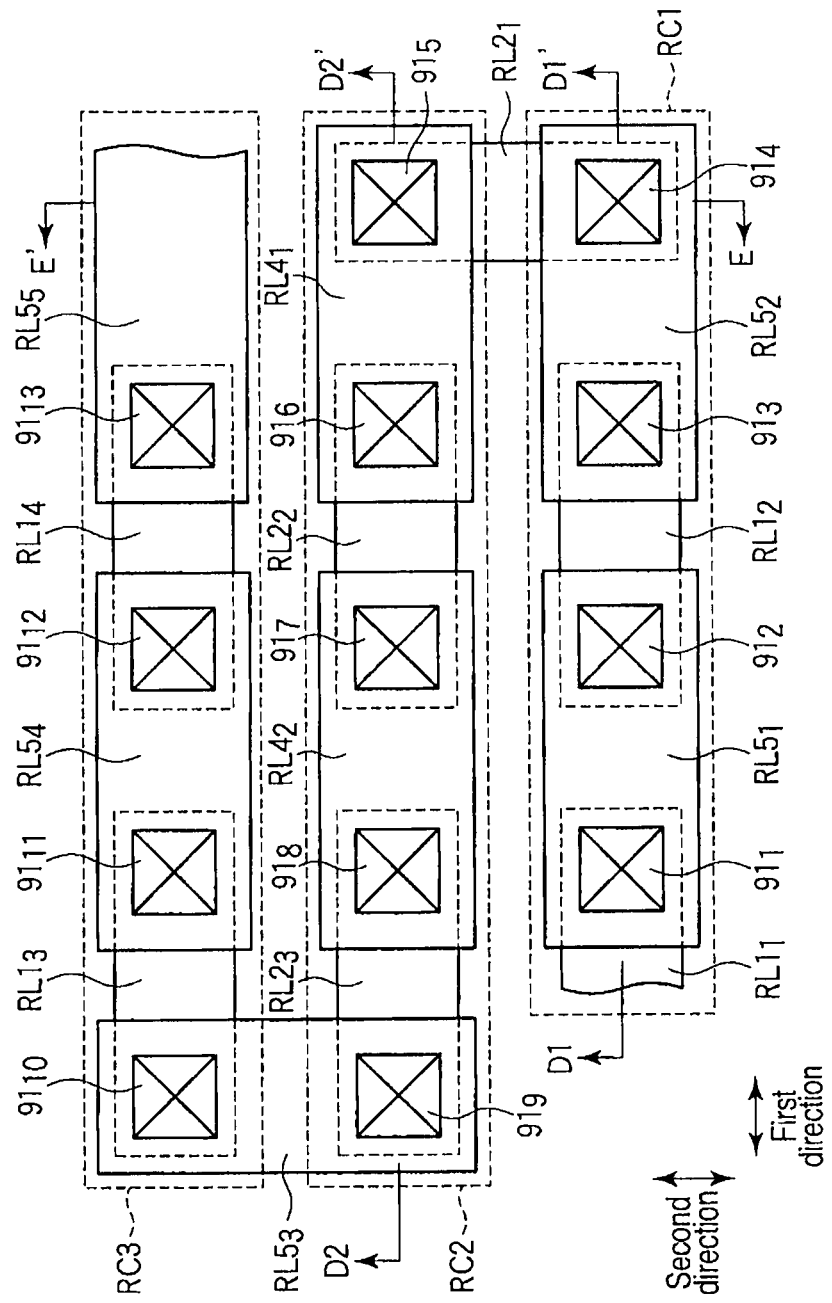
FIG. 14A is a plan view showing an example of a layout of a resistive element.
Figure 14B:
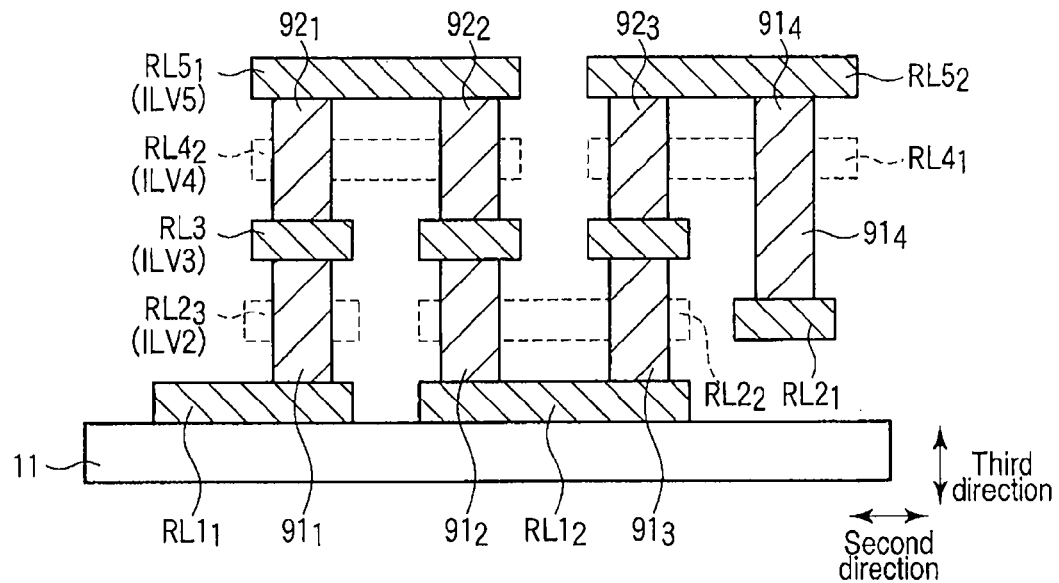
FIG. 14B is a cross-sectional view showing a structural example of the resistive element depicted in FIG. 14A.
Figure 14C:
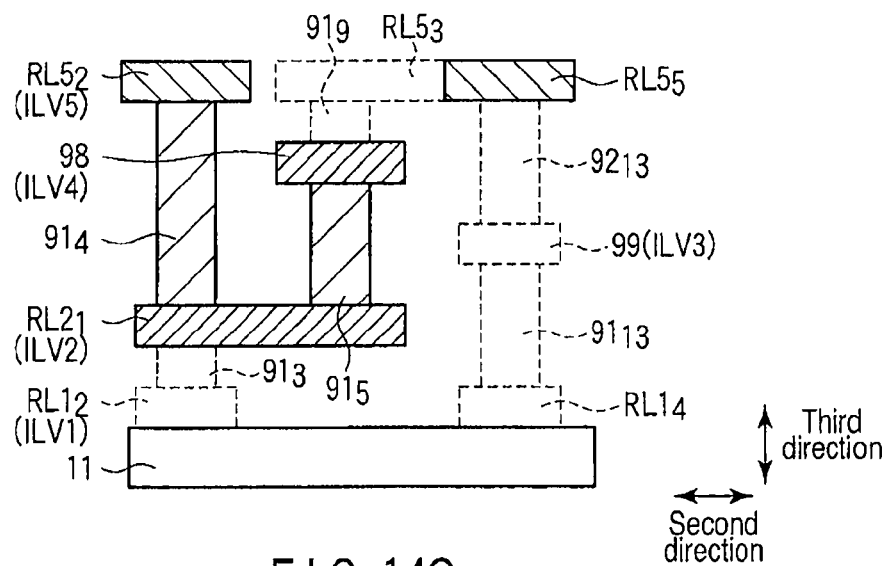
FIG. 14C is a cross-sectional view showing a structural example of the resistive element depicted in FIG. 14A.
Figure 14D:
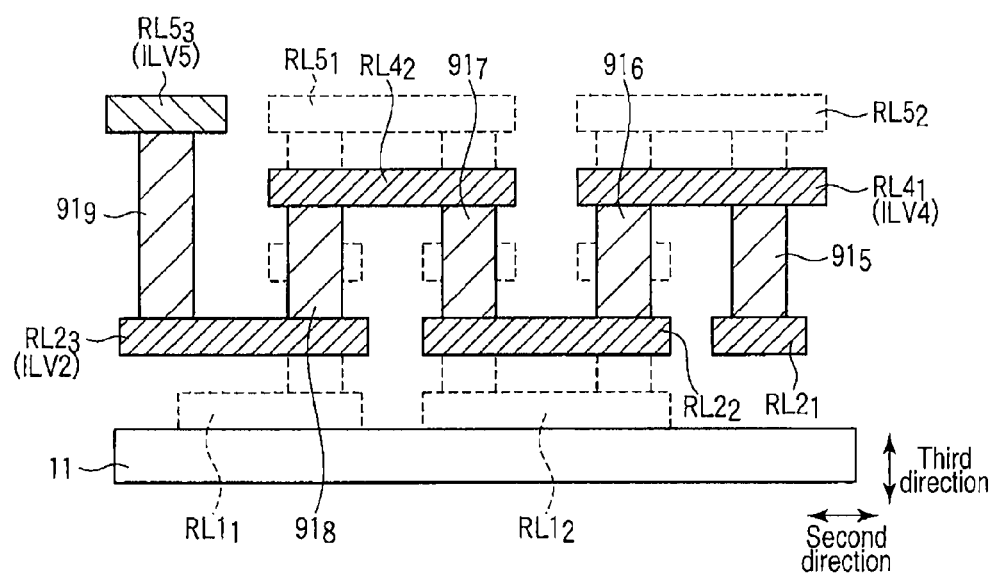
FIG. 14D is a cross-sectional view showing a structural example of the resistive element depicted in FIG. 14A.

FIG. 14A is a plan view showing an example of the layout of the resistive element. FIG. 14B shows an example of a cross-sectional configuration taken along a line D1-D1' in FIG. 14A, and FIG. 14C shows a cross-sectional configuration taken along a line E-E' in FIG. 14A. FIG. 14D shows an example of a cross-sectional configuration taken along a line D2-D2' in FIG. 14A. In FIG. 14B to FIG. 14D, members provided along a depth direction (or a front direction) in the drawings are indicated by broken lines.

As shown in FIG. 14A to FIG. 14D, a resistor chain RC2 formed of resistance lines $RL2_1$, $RL2_2$, $RL2_3$, $RL4_1$ and $RL4_2$ placed on even-numbered interconnect levels (ILV2 and ILV4 in this example) from a substrate side is arranged. Resistors $91_5$, $91_6$, $91_7$, $91_8$ and $91_9$ are provided between respective pairs of resistance lines $RL2_1$ to $RL2_3$, $RL4_1$ and $RL4_2$ in substantially the same configuration as that depicted in FIG. 11B. The resistor chain RC2 is sandwiched between two resistor chains RC1 and RC2 in the second direction.

The resistor chains RC1 and RC3 formed by using odd-numbered resistance lines from the substrate side are provided on the interlayer insulating film 11 to be adjacent to the resistor chains RC2.

In one resistor chain RC1 depicted in FIG. 14A to FIG. 14D, resistance lines $RL1_1$ and $RL1_2$ placed on an odd-numbered interconnect level ILVn (ILV1 in this example) from the substrate side are connected to resistance lines $RL5_1$ and $RL5_2$ placed on an interconnect level ILVn+4 (ILV5 in this example) which is four levels above the interconnect level ILVn, respectively. Two resistors $91_1$ to $91_3$ and $92_1$ to $92_3$ and an intermediate layer (a resistance line) RL3 sandwiched between two resistors $91_1$ to $91_3$ and $92_1$ to $92_3$ are provided between one resistance line $RL1_1$ or $RL1_2$ and one resistance line $RL5_1$ or $RL5_2$ connected to each other.

The intermediate layer RL3 sandwiched between the two resistors is an odd-numbered resistance line placed between the lower resistance line $RL1_1$ or $RL1_2$ and the upper resistance line $RL5_1$ or $RL5_2$. In the example depicted in FIG. 14A to FIG. 14D, the odd-numbered resistance line is the resistance line RL3 placed on an interconnect level ILVn+2 (ILV3 in this example) which is two levels above the lower resistance line $RL1_1$ or $RL1_2$. This resistor chain RC1 has substantially the same configuration as a configuration of the resistor chain depicted in FIG. 11.

Like the resistor chain RC1, in the resistor chain RC3, each pair of resistors $91_{10}$ to $91_{13}$ and $92_{11}$ to $92_{13}$ and an intermediate layer RL3 are provided between each resistance line $RL1_3$ or $RL1_4$ on an interconnect level ILV1 and each resistance line $RL5_3$, $RL5_4$ or $RL5_5$ on an interconnect level ILV5.

The resistor chain RC2 is constituted by providing four resistors $91_5$ to $91_8$ between resistance lines $RL2_1$, $RL2_2$ and $RL2_3$ on an interconnect level ILV2 and resistance lines $RL4_1$ and $RL4_2$ on an interconnect level ILV4. That is, the resistance line $RL2_1$ and the resistor $91_5$ are arranged in such a manner that a bottom surface of the resistor $91_5$ is in contact with an upper surface of the resistance line $RL2_1$ at one end, and the resistor $91_5$ and the resistance line $RL4_1$ are arranged in such a manner that an upper surface of the resistor $91_5$ is in contact with a bottom surface of the resistance line $RL4_1$ at one end. The resistance line $4_1$ and the resistor $91_6$ are arranged in such a manner that an upper surface of the resistor $91_6$ is in contact with the bottom surface of this resistance line $RL4_1$ at the other end. The resistor $91_6$ and the resistance line RL$2_2$ are arranged in such a manner that a bottom surface of the resistor $91_6$ is in contact with an upper surface of the resistance line RL$2_2$ at one end. When such a layout is repeated, the resistors $91_5$ to $91_8$ are connected in series, thereby forming the resistor chain RC2.

In the resistor chains RC1, RC2 and RC3 adjacent to each other, since the resistance lines on the odd-numbered interconnect level and on the even-numbered interconnect level are used, respectively, the plurality of resistance lines included in the resistive element are not adjacent to each other on the same interconnect level in the direction horizontal to the substrate surface.

The resistor chain RC1 and the resistor chain RC2 are connected to each other through, e.g., the resistance line RL$2_1$ on the even-numbered interconnect level ILV2. The resistance line RL$2_1$ gets across the resistance line RL$5_2$ and the resistance line RL$4_1$ below the resistance line RL$5_2$ and the resistance line RL$4_1$.

The resistor chain RC2 and the resistor chain RC3 are connected to each other through, e.g., the resistance line RL$5_3$ placed on the interconnect level ILV5. The resistance line RL$5_3$ gets across the resistance line RL$1_3$ and the resistance line RL$2_3$ below the resistance line RL$1_3$ and the resistance line RL$2_3$.

In a later-described manufacturing method, there is a method of manufacturing a memory cell array by simultaneously processing an odd-numbered control line and an even-numbered control line provided immediately above the former line and thereby leaving a constituent member of a cell unit between the simultaneously processed control lines. The resistive element in the resistive region 12 is also simultaneously formed in a process common to the memory cell array. When the constituent member of the cell unit is not used for the resistive element, it is not preferable to leave the constituent member of the cell unit in the resistive element area 12.

In the resistive element depicted in FIG. 14A to FIG. 14D, the respective resistance lines are arranged in a plane (the substrate) in such a manner that the resistance lines on a given interconnect level and the resistance lines immediately above the former lines do not overlap in the vertical direction. Further, each set of the resistor chains is formed by using the odd-numbered resistance lines alone or the even-numbered resistance lines alone.

When connecting the two resistor chains which are adjacent to each other in the direction horizontal to the surface of the interlayer insulating film 11 as seen from the third direction, in a relationship between the interconnect levels of two resistance lines placed at this connecting position, the resistance line on a given interconnect level is connected to the resistance line on an interconnect level that is at least 2 levels above (or 2 levels below) this resistance line on a given interconnect level through the resistor.

As a result, the constituent member of each cell unit does not remain between the plurality of resistance lines placed on the different interconnect levels. Therefore, the constituent member of the cell unit remaining in the resistive element area does not adversely affect characteristics of the resistive element.

Further, when a distance (a margin) in the direction horizontal to the substrate surface (the first or second direction) is assured to prevent the resistance lines on a predetermined interconnect level and the resistance lines on an interconnect level immediately above the former level which are simultaneously processed from vertically overlapping, the resistive element depicted in FIG. 14A to FIG. 14D can be formed.

Therefore, in the resistive element depicted in FIG. 14A to 14D, an area of the resistive element does not increase to secure the processing margin.

Moreover, when the resistor chains RC1 and RC3 using the odd-numbered resistance lines and the resistor chain RC2 using the even-numbered resistance lines are alternately adjacent to each other in the second direction, intervals (a pitch) of the resistance lines which are adjacent to each other in the second direction on the same interconnect level can be increased. Therefore, mutual interference between the resistance lines adjacent to each other can be suppressed, thereby stabilizing operations of the resistive element.

Figure 15A:
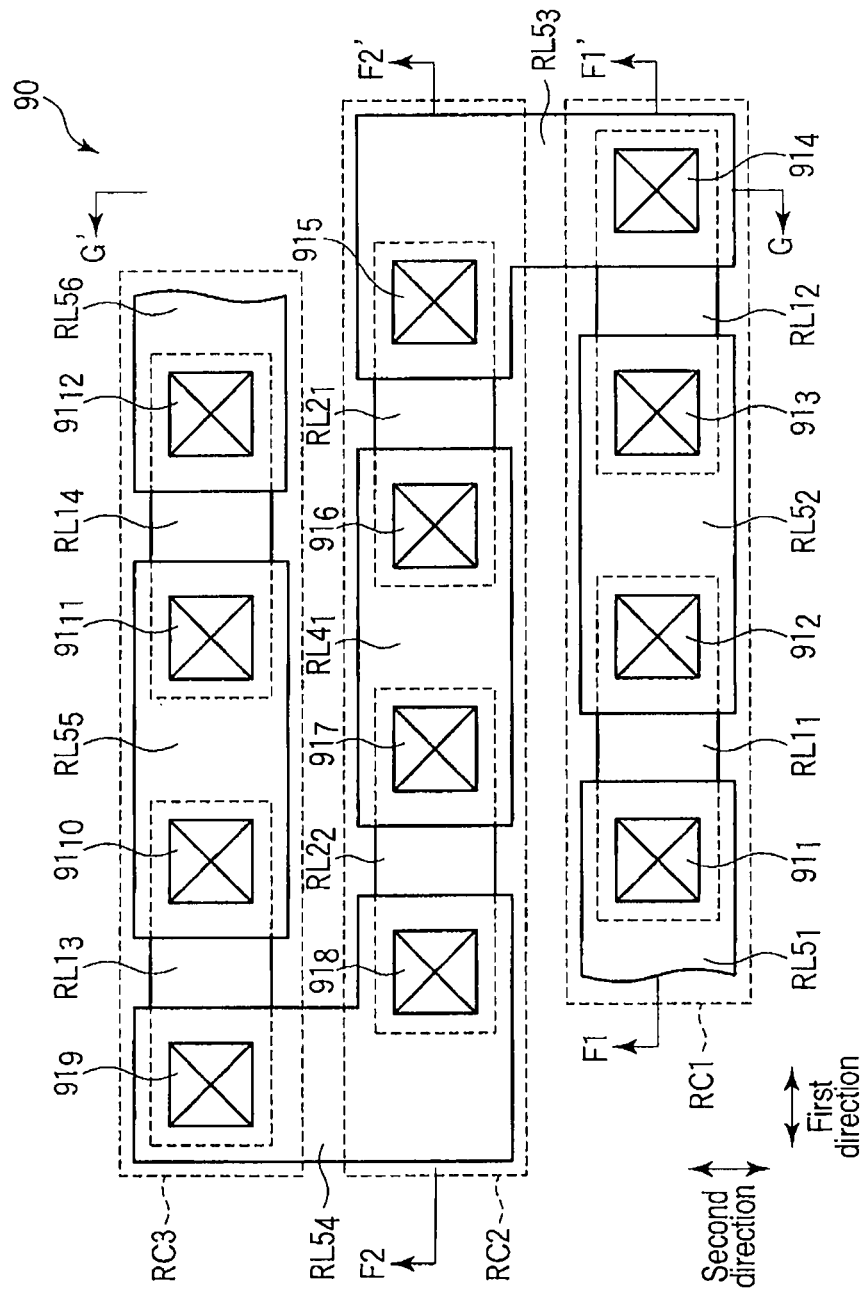
FIG. 15A is a plan view showing an example of a layout of a resistive element.
Figure 15B:
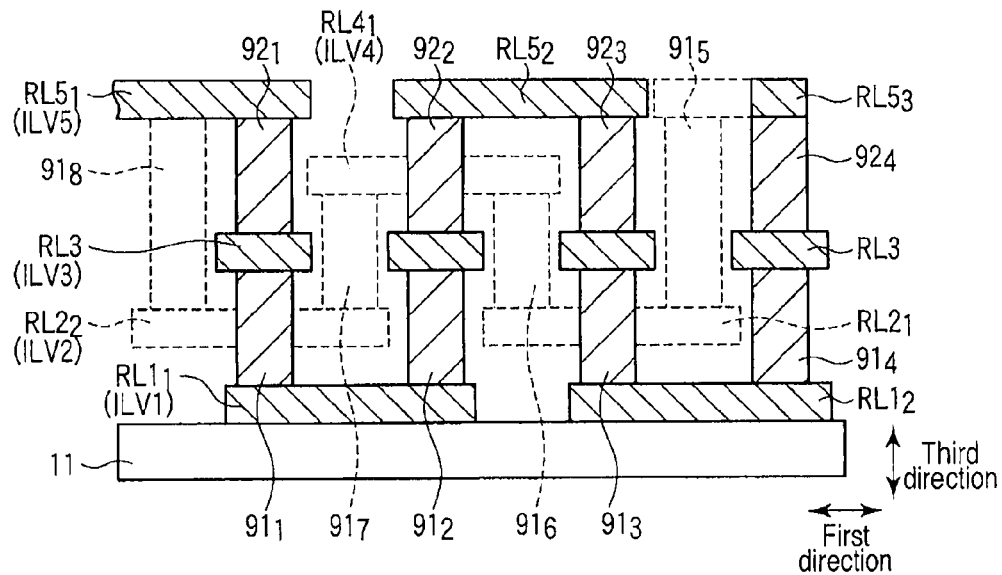
FIG. 15B is a cross-sectional view showing a structural example of the resistive element depicted in FIG. 15A.
Figure 15C:
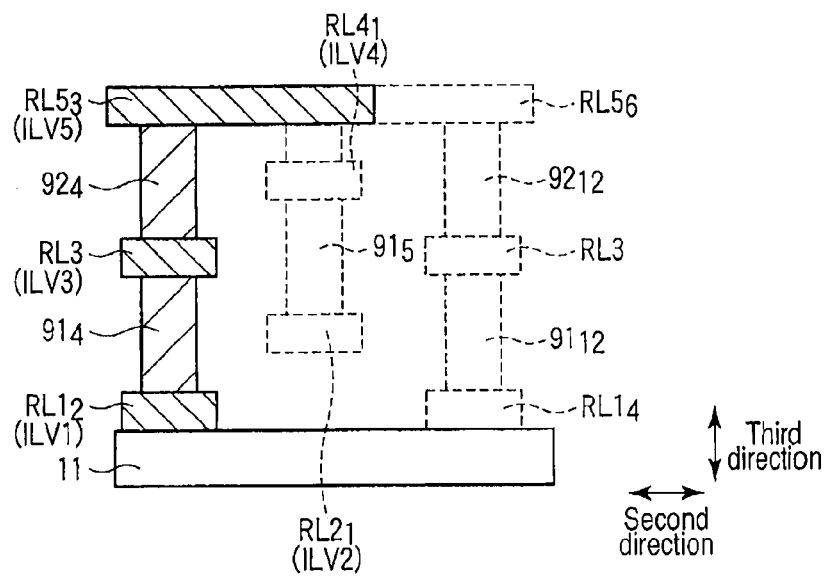
FIG. 15C is a cross-sectional view showing a structural example of the resistive element depicted in FIG. 15A.
Figure 15D:
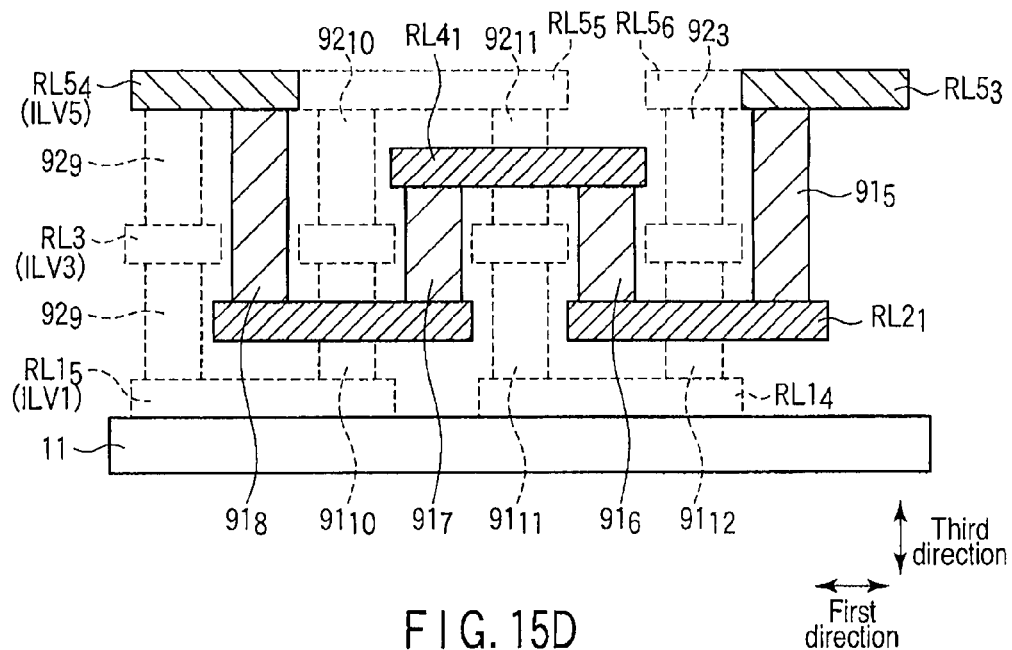
FIG. 15D is a cross-sectional view showing a structural example of the resistive element depicted in FIG. 15A.

FIG. 15A is a plan view showing an example of the layout of the resistive element. FIG. 15B shows an example of a cross-sectional configuration taken along a line F1-F1' in FIG. 15A, and FIG. 15C shows an example of a cross-sectional configuration taken along a line G-G' in FIG. 15A. FIG. 15D shows an example of a cross-sectional configuration taken along a line F2-F2' in FIG. 15A.

Like the resistive element depicted in FIG. 14A to FIG. 14D, odd-numbered resistance lines RL$1_1$ to RL$1_4$ and RL$5_1$ to RL$5_6$ are used for resistor chains RC1 and RC3 shown in FIG. 15A to FIG. 15D, and even-numbered resistance lines RL$2_1$, RL$2_2$ and RL$4_1$ are used for a resistor chain RC2.

The resistor chain RC1 is connected to the resistor chain RC2 through the resistance line RL$5_3$ having, e.g., an L-like planar shape. The resistor chain RC3 is connected to the resistor chain RC2 through the resistance line RL$5_4$ having an L-like planar shape. Although the resistance lines each having the square planar shape alone are used for connecting the plurality of resistors in the above-described example, resistance lines each having a planar shape other than a square shape, e.g., an L-like shape, a concave shape or a convex shape may be utilized to form a resistive element including a plurality of resistors like the resistive element shown in FIG. 15A to FIG. 15D.

The L-like shape means a planar shape constituted of a first portion extending in a given direction and a second portion protruding from one end of the first portion in a direction crossing the extending direction of the first portion on one interconnect level. Additionally, the concave shape means a planar shape constituted of a first portion extending in a given direction, a second portion protruding from one end of the first portion in a direction crossing the extending direction of the first portion and a third portion protruding from the other end of the first portion in the same direction as the second portion on one interconnect level. The convex shape means a substantially-T-like planar shape constituted of a first portion extending in a given direction and a second portion protruding from a position between one end and the other end of the first portion in a direction crossing the extending direction of the first portion on one interconnect level.

As depicted in FIG. 15A to FIG. 15D, resistors $91_1$ to $91_4$ included in the resistor chain RC1 are alternately arranged in such a manner that they are not adjacent to resistors $91_5$ to $91_8$ included in the resistor chain RC2 in the second direction (a depth direction). In the resistive element depicted in FIG. 15A to FIG. 15D, the resistors $91_1$ to $91_{12}$ are alternately arranged as seen from the third direction.

When the plurality of resistors $91_1$ to $91_{12}$ included in the resistive element 90 are alternately arranged in this manner, a processing margin between the resistors adjacent to each other in the second direction can be reduced. Therefore, according to the resistive element depicted in FIG. 15A to FIG. 15D, an occupied area of the resistive element can be decreased.

Additionally, in the resistive element depicted in FIG. 15A to FIG. 15D, since intervals between the resistors adjacent to each other are larger than those in the example where the resistors are adjacent to each other in the second direction, mutual interference between the resistors can be reduced. Therefore, operations of the resistive element can be stabilized.

Figure 16A:
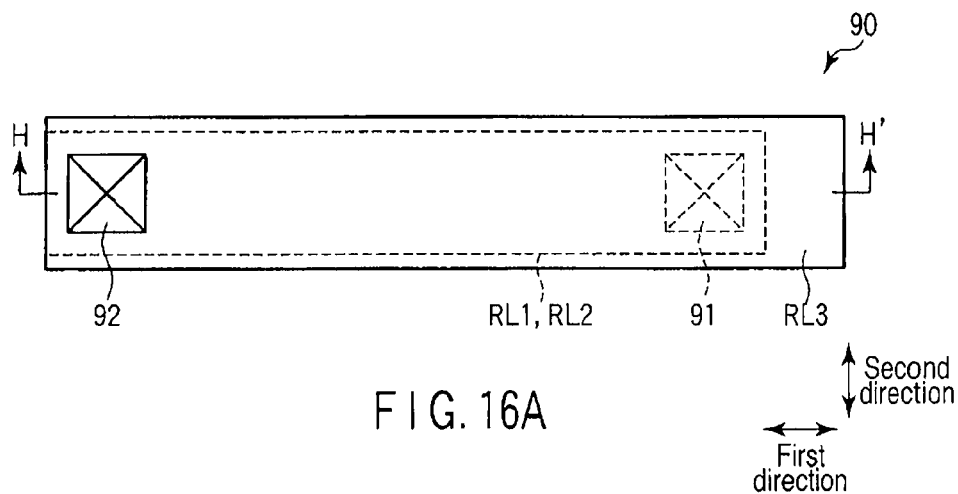
FIG. 16A is a plan view showing an example of a layout of a resistive element.

FIG. 16A shows an example of the layout of the resistive element. FIG. 16B shows an example of a cross-sectional configuration taken along a line H-H' in FIG. 16A.

In the resistive element depicted in FIG. 11A to FIG. 15D, the description has been given as to the example where the number of the resistors in a given area is increased to constitute the resistive element having a high resistance value.

However, as shown in FIG. 16A to FIG. 16B, interconnect lengths of resistance lines RL1, RL2 and RL3 of the resistive element may be increased to form the resistive element having a high resistance value. For example, each of the resistance lines RL1, RL2 and RL3 connected to each other has a length which is threefold or more of a dimension of the resistive element when the resistive element 90 is seen from an upper surface thereof (the third direction).

Furthermore, as shown in FIG. 16B, the resistive element 90 has a configuration such that the resistance lines RL1, RL2 and RL3 overlap in a stacking direction as seen from above the resistive element (the third direction). That is, it can be said that the resistance lines RL1, RL2 and RL3 have a turn-about configuration with respect to the third direction. As a result, as different from simply increasing the interconnect length of each of the resistance lines RL1, RL2 and RL3, using the resistors 91 and 92 enables increasing the resistance of the resistive element without enlarging an area of the element.

In the example depicted in FIG. 16A and FIG. 16B, the resistance lines each having a linear layout are shown, but one resistance line may have such a meandering planar shape as depicted in FIG. 12A, or one resistance line may have such a planar shape turned about in the substrate horizontal direction as depicted in FIG. 13A.

Figure 17A:
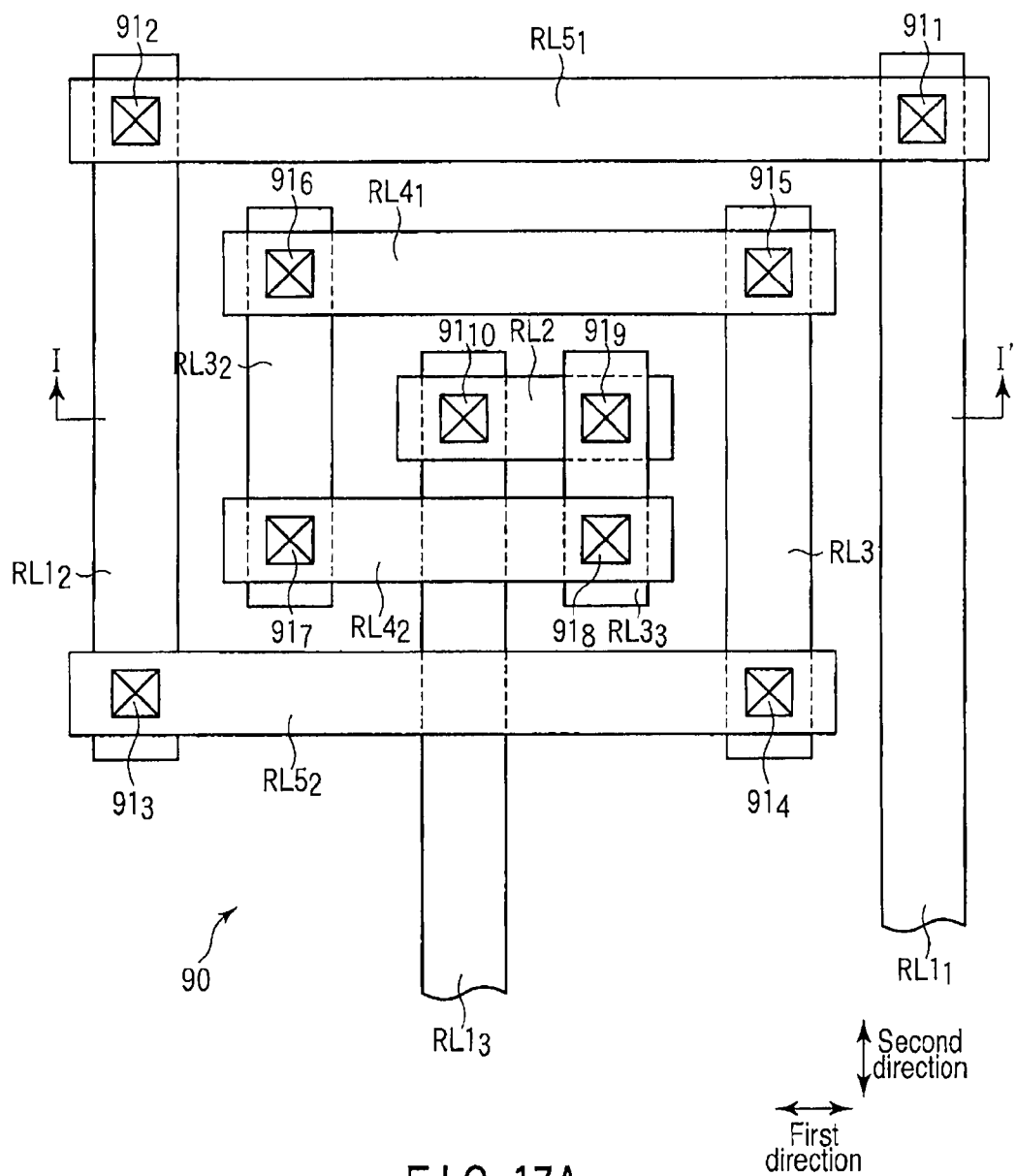
FIG. 17A is a plan view showing an example of a layout of a resistive element.
Figure 17B:
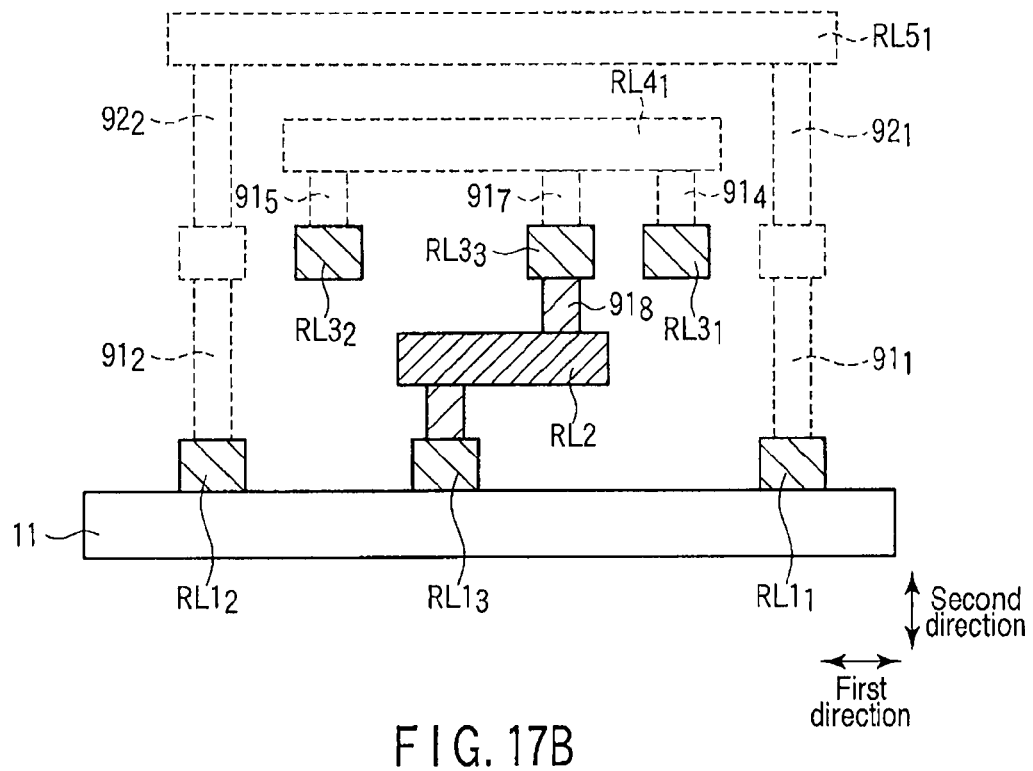
FIG. 17B is a cross-sectional view showing a structural example of the resistive element depicted in FIG. 17A.

FIG. 17A shows an example of the layout of the resistive element. FIG. 17B shows an example of a cross-sectional configuration taken along a line I-I' in FIG. 17A.

In the example depicted in FIG. 17A and FIG. 17B, lengths of resistance lines are increased, and contact plugs $91_1$ to $91_{10}$ as resistors are utilized, whereby the plurality of resistance lines $RL1_1$ to $RL5_2$ are spirally drawn on a plurality of interconnect levels.

Here, in the example depicted in FIG. 17A and FIG. 17B, each of the resistance lines $RL1_1$ to $RL5_2$ forms any one side of the spiral, and the upper or lower resistance lines are connected to each other through the resistors at end portions of the resistance lines $RL1_1$ to $RL5_2$. However, each of the resistance lines $RL1_1$ to $RL5_2$ may continuously form two or more sides of the spiral. Moreover, the upper or lower resistance lines may be connected to each other through the resistors at portions other than the end portions of the resistance lines $RL1_1$ to $RL5_2$.

As depicted in FIG. 17A and FIG. 17B, in the resistive element having the resistance lines drawn in the spiral shape, interconnect levels utilized to spirally draw the resistance lines on each interconnect level can be appropriately changed.

When the resistive element having the spiral configuration shown in FIG. 17A and FIG. 17B is formed by using the resistance lines on the plurality of interconnect levels, a margin for avoiding short-circuit of the resistance lines adjacent to each other can be reduced by drawing the resistance lines on the plurality of interconnect levels as compared with a configuration where the resistance lines on one interconnect level are spirally (in a vortex shape) drawn. Therefore, in the resistive element having the spiral planar layout depicted in FIG. 17A and FIG. 17B, considering a margin required for processing alone can suffice.

Therefore, according to the resistive element shown in FIG. 17A and FIG. 17B, using the resistance lines on the different interconnect levels to form the spiral configuration can suppress a process difficulty of the resistive change memory from increasing.

A planar layout when the same member as the constituent member in the cell unit is used for the resistor in the resistive element will now be described with reference to FIG. 18A and FIG. 18B.

When a stacked body including the same material as the constituent member in the cell unit is used for the resistor in the resistive element, the resistive element 90 may have the same layout as that of the cell unit in the memory cell array.

Figure 18A:
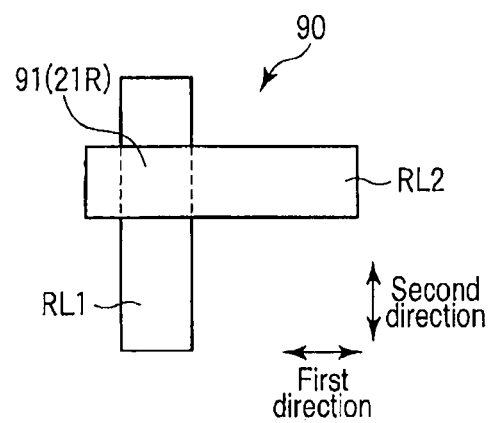
FIG. 18A is a plan view showing an example of a layout of a resistive element.

That is, like a resistive element 90 shown in FIG. 18A, a resistor 91 including the same member as that of the cell unit may be provided between a resistance line RL1 extending in the first direction and a resistance line RL2 extending in the second direction. The resistor 91 includes a resistive film 21R formed of the same material as that of the resistance change film 21 of the memory element 20.

The resistive element 90 shown in FIG. 18A may be provided in the resistive element area 17, or it may be provided in the memory cell array area 12. It is to be noted that a cell unit determined as a defective unit at a test step of the resistance change memory may be used as a resistive element. In this case, the resistive element is arranged in the memory cell array area 12.

Like the layout shown in FIG. 18B, a resistive element having a resistor 91 including the same constituent element as that of the cell unit may be provided in a dummy area 12X. The dummy area 12X is provided at a boundary portion between the memory cell array area 12 and the lead area 15.

In the dummy area 12X, dummy cells each having substantially the same configuration as the cell unit are arranged. The dummy cells DC are connected to control lines extending in the first direction and control lines extending in the second direction. Although the dummy cell DC has substantially the same function as the cell unit CU, it is not used for storing data.

If a connecting relationship between the cell unit used for storing data and each of the control circuits 3 and 4 is assured, one of the two control lines connected to the dummy cell DC may be electrically separated from the control circuit 3 or 4.

For example, the resistive element 90 provided in the dummy cell region 12X is provided at the center of a 3×3 region or a 5×5 region of the dummy cells DC, and the resistive element 90 is surrounded by the dummy cells DC. Here, when using (driving) the resistive element, it is good enough to set control lines $L1_1$ to $L1_3$ connected to the cell units to a floating state and determine a resistance line $RL1_1$ and a control line $L2_2$ as input/output terminals of the resistive element to apply a potential to each interconnect. It is to be noted that also setting interconnects $DL1_1$ and $DL1_2$ connected to the dummy cells to the floating state is preferable, but a potential may be applied to each of the interconnects $DL1_1$ and $DL1_2$ to the extent that an excessive current does not flow, based on a relationship between the interconnects $DL1_1$ and $DL1_2$ and the control line $L2_2$.

A dimension of the dummy cell DC in the direction horizontal to the substrate surface may be larger than a dimension of the cell unit CU. In this case, a dimension of the resistive element (the resistor) provided in the dummy area 12X is equal to the dimension of the dummy cell and larger than the dimension of the cell unit.

When the cell unit which is not used for storing data is utilized as the resistor of the resistive element 90 in this manner, a region where the resistive element is to be provided does not have to be newly assured. As a result, the resistive element 90 including the same constituent member as that of the cell unit can contribute to an increase in occupied area of the memory cell array area 12 or an improvement in degree of freedom of the layout of the lead area 15.

Further, when the same member (the resistive film 21R) as the resistance change film 21 of the memory element 20 is included in the resistor 91 of the resistive element 90, a resistance value of the resistive element can be adjusted to acquire a predetermined resistance value.

It is to be noted that, as the resistor including the constituent member of the cell unit, the constituent member of the non-ohmic element alone may be used for the resistor without including the constituent member of the memory element. Further, a resistor having the same configuration as the contact plug may be provided between the resistance line extending in the first direction and the resistance line extending in the second direction.

Like the description based on FIG. 9A to FIG. 18B, according to the resistance change memory of this embodiment, an increase in occupied area on the substrate can be suppressed, the resistive element having a high resistance value provide.

(3) Adjustment of Resistance Value

Adjustment of a resistance value of the resistive element including the same constituent member (the resistive film 21R) as that of the memory element will now be described with reference to FIG. 19. FIG. 19 is a schematic view showing a circuit configuration used for adjusting a resistance value of the resistive element.

As shown in FIG. 19, since the resistive film 21R included in the resistive element 90 is formed of the same material as that of the resistance change film 21 of the memory element, a resistance value of the resistive film 21R can be changed by applying a predetermined voltage/current pulse. Therefore, when the constituent member of the memory element is used for the resistor 91 of the resistive element 90, the resistance value of the resistive film 21R can be adjusted so that the resistive element 90 can obtain a predetermined resistance value.

For example, the resistance value of the resistive film 21R included in the resistive element 90 is adjusted by using a circuit configured to write data in the memory element 20.

To change the resistance value of the resistive film 21R, a pulse generator 10A and a current/voltage adjustment circuit 10B are used. The pulse generator 10A generates a current/voltage pulse which is applied to the resistive film 21R, and the current/voltage adjustment circuit 10B adjusts a current value/voltage value and a pulse width of the generated current/voltage pulse.

The pulse generator 10A and the current/voltage adjustment circuit 10B are provided in, e.g., the potential supplying circuit 10. Each of the pulse generator 10A and the current/voltage adjustment circuit 10B is a circuit configured to write data in the memory element 20 in the cell unit CU.

To judge whether the resistive film 21R has a predetermined resistance value, a resistance determination circuit (a data determination circuit) 40A is used. The resistance determination circuit 40A determines a resistance value of the resistive element 90 by detecting a fluctuation in potential in the resistance line RL2 connected with the resistive element.

The resistance determination circuit 40A is provided in, e.g., the first or second control circuit 3 or 4. The resistance determination circuit 40A is a data determination circuit which determines data stored in the memory element 20 by detecting a resistance value of the memory element 20 in the cell unit CU.

One end (a resistance line RL2) of the resistive element 90 including the resistive film 21R is connected to the pulse generator 10A, the current/voltage adjustment circuit 10B and the resistance determination circuit 40A via a switch element SW2A. The other end (a resistance line RL1) of the resistance element 90 including the resistive film 21R is connected to a ground potential via a switch element SW2B.

The resistive element 90 including the resistive film 21R is connected to a predetermined circuit block 50 provided in a peripheral circuit area 19 through a switch element SW1A and a switch element SW1B.

The switch elements SW1A, SW1B, SW2A and SW2B are, e.g., field-effect transistors. ON/OFF of the switch elements SW1A, SW1B, SW2A and SW2B is controlled by, e.g., the state machine 8 in FIG. 1. The switch elements SW1A and SW1B configured to connect the resistive element 90 to the circuit block 50 are not simultaneously turned on with the switch elements SW2A and SW2B configured to be connected to the circuits 10A, 10B and 40A which adjust the resistance value of the resistive element 90. Therefore, for example, to enable complementary control by using a common control signal, the switch elements SW1A and SW1B may be formed of N-channel type FETs, and the switch elements SW2A and SW2B may be formed of P-channel type FETs.

The resistance value of the resistive film 21R included in the resistive element 90 is adjusted at the time of, e.g., a test step for the resistance change memory or forming for the memory element.

When the resistance value of the resistive film 21R is adjusted, the switch elements SW2A and SW2B are turned on, and the switch elements SW1A and SW1B are turned off. One end of the resistive element 90 is connected to the pulse generator 10A, the current/voltage adjustment circuit 10B and the resistance determination circuit 40A by the switch elements SW2A and SW2B which have been turned on, and the other end of the resistive element 90 is connected to the ground potential by the switch element SW2B which has been turned on. On the other hand, the resistive element 90 is electrically separated from the circuit block 50.

A current/voltage pulse which is utilized to change the resistance value of the resistive film 21R is supplied to the resistive element 90 from the pulse generator 10A and the current/voltage adjustment circuit 10B. The resistance determination circuit (the data determination circuit) 40A determines how much the resistance value of the resistive film 21R has changed.

When the resistance determination circuit 40A determines that the resistance value of the resistive element 90 is a predetermined value, the supply of the current/voltage pulse to the resistive element 90 is stopped by, e.g., the state machine 8. When the resistance determination circuit 40A determines that the resistance value of the resistive element 90 is not the predetermined value, the adjustment and the supply of the current/voltage pulse with respect to the resistive element 90 and the judgment on the resistance value are repeatedly executed until the predetermined resistance value is obtained.

When the resistance change memory is used as a memory device after the test step, the switch elements SW2A and SW2B are turned off, and the switch elements SW1A and SW1B are turned on. As a result, the resistive element 90 is electrically connected to the circuit block 50 by the switch elements SW1A and SW1B which have been turned on.

On the other hand, the switch elements SW2A and SW2B which have been turned off electrically separate the resistive element 90 from the circuits 10A, 10B and 40A configured to adjust the resistance value of the resistive element. Therefore, even if the pulse generator 10A, the current/voltage adjustment circuit 10B and the data determination circuit 40A are driven to write/read data with respect to the cell unit, the current/voltage pulse which changes the resistance value of the resistive film 21R in the resistive element 90 is not supplied to the resistive element 90.

As described above, the circuits 10A, 10B and 40A configured to drive the memory element 20 of the cell unit CU can be utilized to adjust the resistance value of the resistive element 90 including the resistive film (the resistance change film) 21R having a variable resistance value based on substantially the same operation as writing data into the memory element.

In the resistance change memory according to this embodiment, when the resistive element 90 is constituted of the constituent member (the resistance change film) of the cell unit in the memory cell array area 12, the resistive element 90 includes the resistive film 21R having a variable resistance value. As a result, the resistance value of the resistive element can be changed like the memory element 20 including the resistance change film 21. Therefore, a resistance value falling in a wide range of approximately 1 k$\Omega$ to 1 M$\Omega$ can be obtained from one resistive element. Accordingly, the resistive element having the predetermined resistance value with respect to the circuit block 50 can be provided with the predetermined resistance value while suppressing an increase in occupied area thereof.

Further, the resistance value of the resistive film 21R is adjusted by using a circuit utilized to write/read data with respect to the resistance change memory. Therefore, to change the resistance value of the resistive element including the resistive film having a variable resistance value to the predetermined resistance value, a new circuit does not have to be provided within or outside the chip of the resistance change memory.

Therefore, according to the resistance change memory of this embodiment, when the same constituent member as that of the cell unit in the resistance change memory is used for the resistive element, the resistive element having a small occupied area and a high resistance value can be provided.

(4) Manufacturing Method

A manufacturing method of a resistance change memory according to this embodiment will now be described with reference to FIG. 20A to FIG. 22.

Here, manufacturing steps of the memory cell array area 12, the lead area 15 and the resistive element area 17 will be explained.

(a) Manufacturing Method 1

Figure 20A:
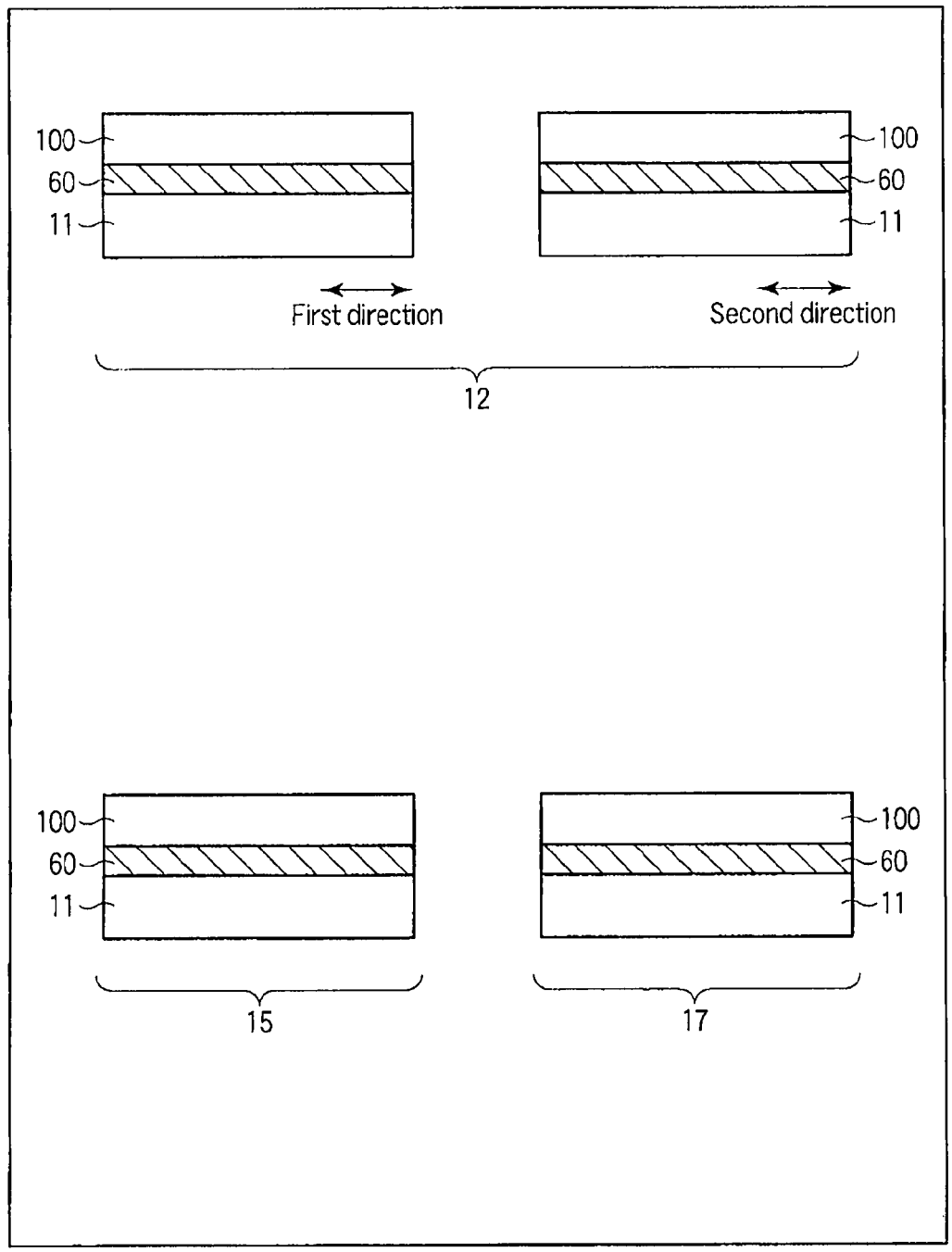
FIG. 20A is a view showing a step in a manufacturing method of a resistance change memory according to this embodiment.
Figure 20B:
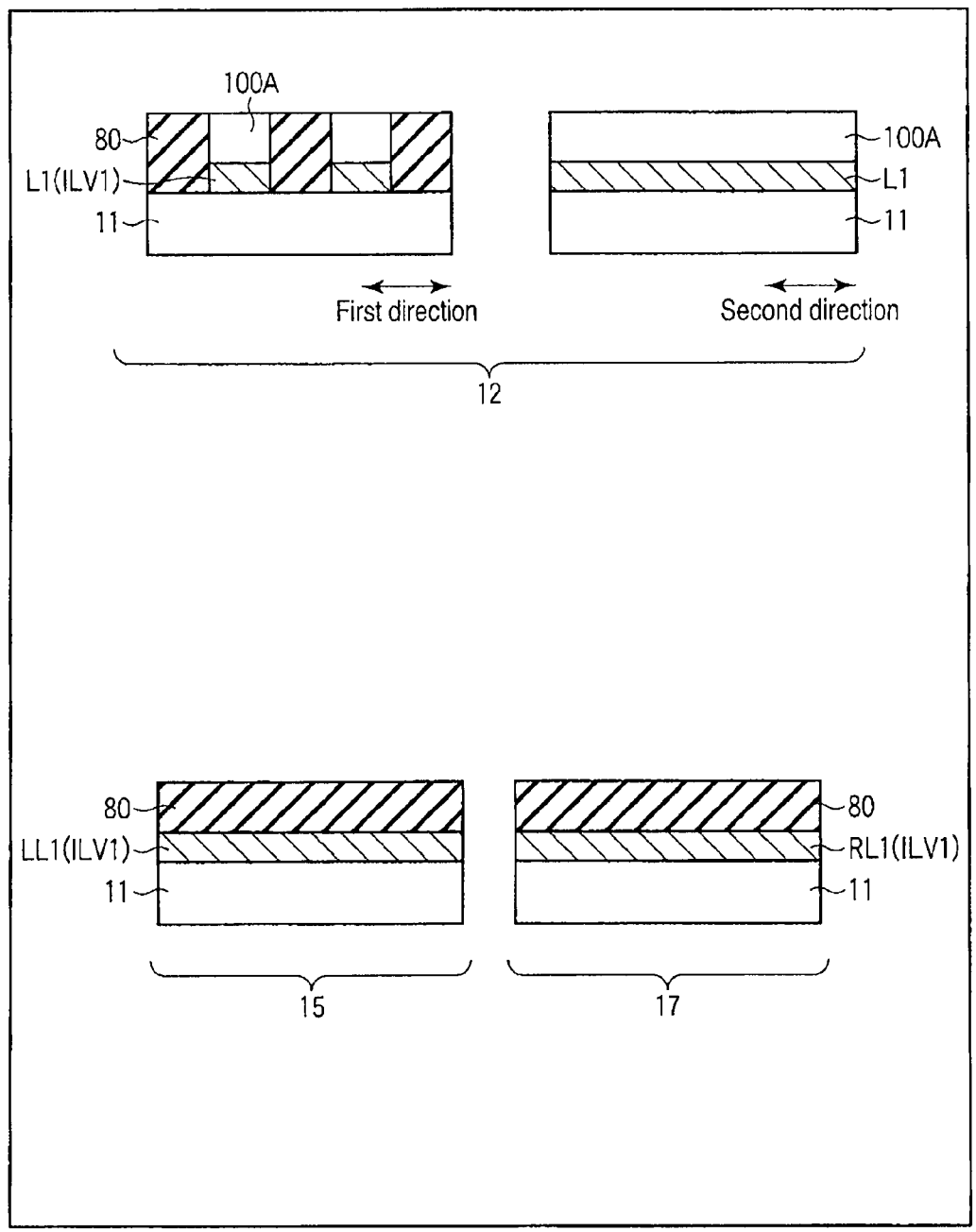
FIG. 20B is a view showing a step in the manufacturing method of a resistance change memory according to this embodiment.

A manufacturing method 1 of a resistance change memory according to this embodiment will now be described with reference to FIG. 20A to FIG. 20C. Each of FIG. 20A to FIG. 20C shows one step in the manufacturing method of a resistance change memory according to this embodiment. FIG. 20A to FIG. 20C show primary parts of the memory cell array area 12, the lead area 15 and the resistive element area 17. Each drawing shows a cross section taken along the first direction and a cross section taken along the second direction of the memory cell array area 12.

As shown in FIG. 20A, a conductive layer 60 is deposited on the interlayer insulating film 11 (or the substrate) by using, e.g., a CVD (Chemical Vapor Deposition) method and/or a sputtering method.

The conductive layer 60 serves as a control line in the memory cell array area 12, an interconnect in the lead area 15, or a resistance line in the resistive element area 17.

A plurality of layers (films) saving as a cell unit are sequentially deposited on the conductive layer 60 on the substrate 11 by using, e.g., the CVD (Chemical Vapor Deposition) method or the sputtering method.

For example, when a pin diode is formed as a non-ohmic element constituting the cell unit, an n-type semiconductor layer, an intrinsic semiconductor layer and a p-type semiconductor layer are stacked in a predetermined order in accordance with the connecting relationships of the cell unit depicted in FIG. 4.

When the memory element is provided on the pin diode, a lower electrode layer, a resistance change film and an upper electrode layer of the memory element are sequentially deposited on the semiconductor layer. The resistance change film is formed by using, e.g., the sputtering method, the CVD method, an ALD (Automatic Layer Deposition) method or an MOCVD (Metal-Organic CVD method. The lower and upper electrode layers are formed by using, e.g., sputtering method. In this manner, a stacked body 100 as the constituent member of the cell unit is formed on the conductor layer 60.

It is to be noted that a silicide layer may be formed between the semiconductor layer and the electrode layer. Furthermore, a diffusion preventing layer or an adhesive layer may be provided on the stacked body 100, between the electrode layer of the memory element and the constituent member of the non-ohmic element, or between the constituent member of the non-ohmic element and the conductive layer. The diffusion preventing layer suppresses constituent atoms of a given member from being diffused to other members. The adhesive layer increases the joint force between the members and suppresses detaching between the members.

The stacked body 100 on the conductive layer 60 is processed by using an RIE (Reactive Ion Etching) method and a mask pattern forming technology such as a photolithography technology or a sidewall transfer processing technology.

Based on this processing, as shown in FIG. 20B a stacked body 100A extending in the second direction is formed in the memory cell array area 12. With formation of the stacked body 100A, the conductive layer below the stacked body 100A is processed. The conductive layer in the memory cell array area 12 is divided into a plurality of control lines L1 extending in the second direction. The control lines L1 placed on the lowermost interconnect level ILV1 are formed on the interlayer insulating film 11.

Each layer in the lead area 15 and the resistive element area 12 is processed simultaneously with processing for the stacked body 100A and the control lines L1 in the memory cell array area 12. As a result, an interconnect LL1 having a predetermined shape/layout is formed from the conductive layer in the lead area 15. Moreover, a resistance line RL1 having a predetermined shape/layout is formed from the conductive layer in the resistive element area 17. As described above, the interconnect LL1 and the resistance line RL1 on the first interconnect level ILV1 are formed in the lead area 15 and the resistance element area 17 simultaneously with the control lines on the first interconnect level.

For example, the constituent member of the cell unit is selectively removed in the lead area 15 and the resistive element area 17.

Additionally, in the memory cell array area 12, an interlayer insulating film 80 is buried in each groove between the stacked bodies 100A which are adjacent to each other in the first direction by using the CVD method and a CMP (Chemical Mechanical Polishing) method. At the same time, in the lead area 15 and the resistive element area 17, the interlayer insulating film 80 is formed on the interconnect L1, the resistance line RL1 and the interlayer insulating film 11.

As shown in FIG. 20C, in the lead area 15 and the resistive element area 17, opening portions CH and RH each having a predetermined shape are formed in the interlayer insulating film 80 by using the photolithography technology and the RIE method to expose surfaces of the interconnect LL1 and the resistance line RL1.

Conductors are formed on the interlayer insulating film 80 and in the opening portions CH and RH by the sputtering method and the CMP method. When the conductor on the interlayer insulating film 80 is removed, the conductors are embedded in the opening portions CH and RH alone. As a result, the contact plug CP is formed in the lead area 15. At the same time, the resistor 91 is formed in the resistive element area 17. The contact plug CP and the resistor 91 are formed of the same material (e.g., tungsten).

Here, it is preferable for a dimension W1 of the opening portion RH in which the resistor 91 is buried in the direction horizontal to the substrate surface to be smaller than a dimension W2 of the opening portion (the contract hole) CH in which the contact plug CP is buried. As described above, a resistance value of the resistor 91 is inversely proportional to a cross-sectional area of the resistor 91. Therefore, when the dimension W1 of the opening portion RH is smaller than the dimension W2 of the contact hole CH, the resistance value of the resistor 91 buried in the opening portion RH can be increased.

Thereafter, the conductive layer is deposited on the stacked body and the interlayer insulating film 80 by, e.g., the sputtering method or the CVD method. Each of the conductive layer and the stacked body is processed to be divided in the second direction by the photolithography technology and the RIE method. As a result, the conductive layer is divided into a plurality of control lines L2, and the plurality of control lines L2 extending in the first direction are formed. The control lines L2 are positioned on an interconnect level ILV2 which is the second level from the substrate side.

At the same time, the stacked body below the control lines L2 is divided in the second direction. As a result, the plurality of cell units CU are formed between the control lines L1 extending in the second direction and the control lines L2 extending in the first direction. The cell unit CU is a stacked body formed of the memory element 20 and the non-ohmic element 30, and the memory element 20 and the non-ohmic element 30 are connected in series between the two control lines L1 and L2.

As described above, in the memory cell array area 12; the memory cell array M1 in the lowermost layer is formed.

On the other hand, in each of the lead area 15 and the resistive element area 17, the conducive line deposited on the interlayer insulating film 80 is processed. In the lead area 15, an interconnect LL2 having a predetermined shape and a predetermined layout is formed on the contact plug CP at the same interconnect level ILV2 as the control line L2. The upper interconnect LL2 is connected to the interconnect LL1 at the lower interconnect level ILV1 through the contact plug CP2.

In the resistive element area 17, a resistance line RL2 having a predetermined shape and a predetermined layout is formed on the resistor 91 at the same interconnect level ILV2 as the control line L2. The resistor 91 is provided between the resistance line RL1 and the resistance line RL2. The upper resistance line RL2 is electrically connected to the resistance line RL1 on the lower interconnect level ILV2 via the resistor 91.

As described above, the resistive element 90 is formed simultaneously with formation of the memory cell array M1. As shown in FIG. 18A and FIG. 18B, it is to be noted that, when the resistive element including the same constituent member as the cell unit is provided in the dummy area, steps of forming this resistive element are substantially equal to respective steps for the memory cell array area 12.

The steps substantially equal to the steps depicted in FIG. 20A to FIG. 20C are repeatedly executed, thereby forming the cross-point type memory cell array in which a predetermined number of memory cell arrays are stacked.

In the resistive element 90 used for the resistance change memory according to this embodiment, the resistance lines RL1 and RL2 as the constituent elements of this resistive element 90 are formed simultaneously with the control lines L1 and L2 included in the memory cell array.

Further, in the resistive element 90 used for the resistance change memory according to this embodiment, the resistor 91 as the constituent element of the resistive element is formed simultaneously with the contact plug CP included in the lead area 15. It is to be noted that the contact plug and the resistor may be formed at different steps, a material having a low resistivity may be used for the contact plug, and a material having a high resistivity may be used for the resistor 91.

As described above, the resistive element included in the resistance change memory can be formed without increasing the number of manufacturing steps for the resistance change memory. It is to be noted that FIG. 20A to FIG. 20B show one resistive element 90 alone for simplification of the explanation, although a plurality of resistors and resistance lines are of course formed in the resistive element area 17 to form the resistive element depicted in FIG. 11A to FIG. 18B. At the same time, in the lead area 15, the plurality of interconnects LL1 and LL2 and the plurality of contact plugs CP are likewise of course formed.

In the resistive element used in the resistance change memory according to this embodiment, a resistance value of the resistive element can be increased by enlarging a dimension of the element in the stacking direction of the memory cell array. Therefore, an occupied area (a surface area) of the resistive element area 17 in the chip does not become excessively large.

Therefore, an area of the resistive element to obtain a high resistance value can be suppressed from increasing. Then, areas of the memory cell array area 12 and the lead area 15 is not compressed the area of the resistive element. Furthermore, an increase in planar dimension of the resistive element area 17 does not reduce a degree of freedom of the interconnect layout in the lead area 15.

Thus, according to the manufacturing method 1 of the resistance change memory of this embodiment, an increase in occupied area can be suppressed without increasing the number of manufacturing steps, and the resistive element having a high resistance value can be provided.

(b) Manufacturing Method 2

A manufacturing method 2 of a resistance change memory according to this embodiment will now be described with reference to FIG. 21A to FIG. 21D. Each of FIG. 21A to FIG. 21D shows each manufacturing step with respect to the memory cell array area 12, the lead area 15 and the resistive element area 17 in the manufacturing method 2 of a resistance change memory according to this embodiment. In this manufacturing method 2, a detailed description on steps common to the manufacturing method 1 will be omitted.

In the above-described manufacturing method 1, as shown in FIG. 20C, a stacked body 100 is divided in the second direction to form cell units CU and, at the same time, interconnects L2 extending in the first direction are formed on the cell units to form the first memory cell array M1 depicted in FIG. 2. However, in the cross-point type memory cell array in which the plurality of memory cell arrays are stacked, in view of simplification of manufacturing steps, it is preferable to use the following steps depicted in FIG. 21A to FIG. 21D to share manufacturing steps of the memory cell arrays on different interconnect levels without forming the memory cell arrays layer by layer and to form the limited cell units and memory cell arrays.

Figure 21A:
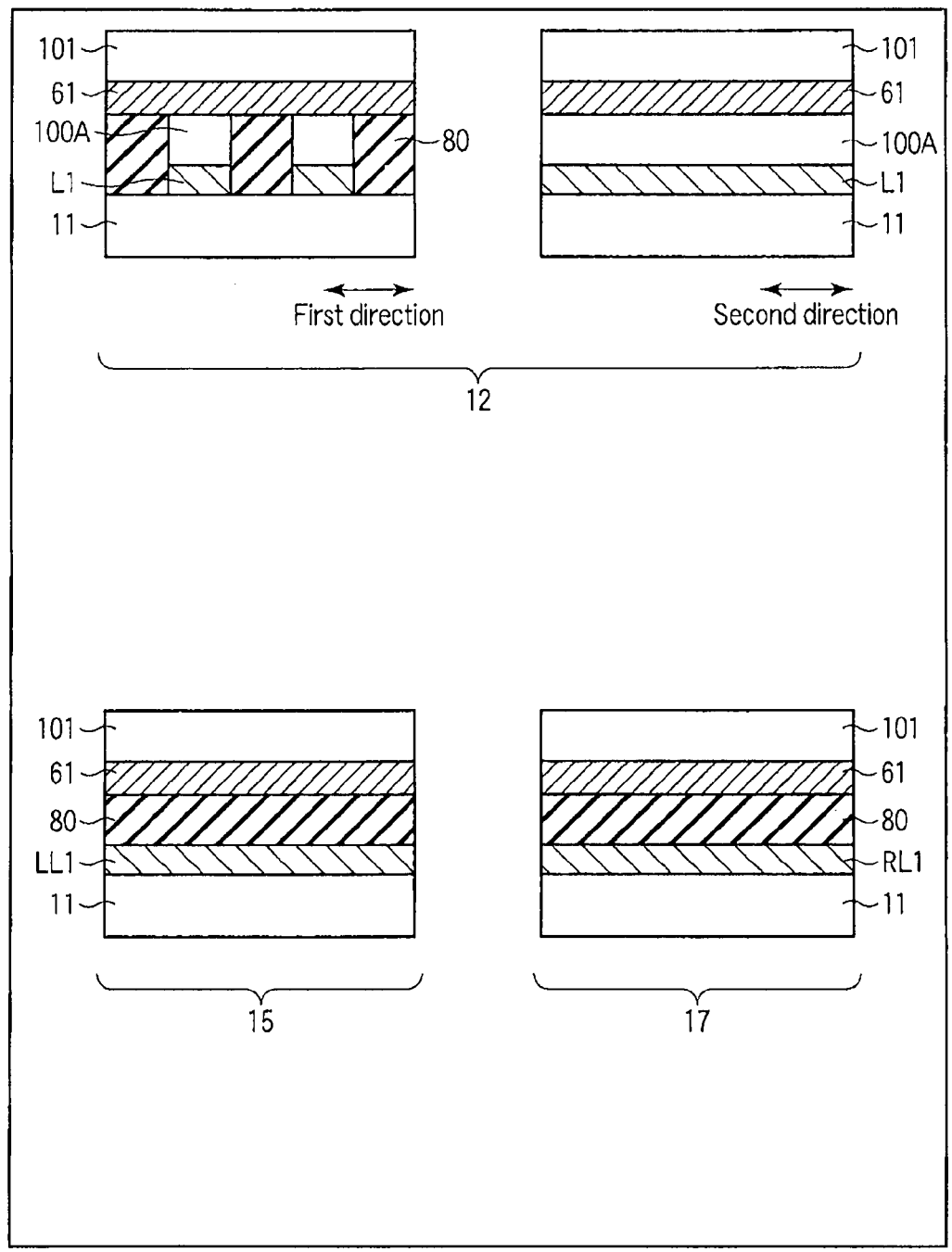
FIG. 21A is a view showing a step in the manufacturing method of a resistance change memory according to this embodiment.

After the manufacturing step shown in FIG. 20B, as depicted in FIG. 21A, a conducive layer 61 placed on a second interconnect level ILV2 is deposited on the stacked bodies 100A and the interlayer insulating films 80 extending in the second direction by using, e.g., the sputtering method. Here, a stacked body 101 saving as cell units in the second memory cell array is formed on the conductive layer 61 without executing processing for a conductive layer 65 and the stacked bodies 100A below this layer.

A stacking order of layers deposited on the conductive layer 61 differs depending on a connecting relationship selected from the connecting relationships indicated by "a" to "p" in FIG. 4 which is provided for two cell units stacked to sandwich one interconnect (the conductive layer 61).

Furthermore, as shown in FIG. 21A, in the lead area 15 and the resistive element area 17, the conductive layer 61 and the stacked body 101 are sequentially deposited on the interlayer insulating films 80 without forming contact plugs and resistors in the interlayer insulating films 80.

At the step depicted in FIG. 21A, the constituent member of the cell unit is removed from each of the lead area 15 and the resistive element area 17, and the interlayer insulating film 80 is deposited on an interconnect LL1 and a resistance line RL1. However, in the lead area 15 and the resistive element area 17, the conductive layer 61 and the constituent member 101 of the cell unit may be deposited on the constituent member of the cell unit for the first memory cell array without removing the constituent member of the cell unit for the first memory cell array from the areas 16 and 17.

Figure 21B:
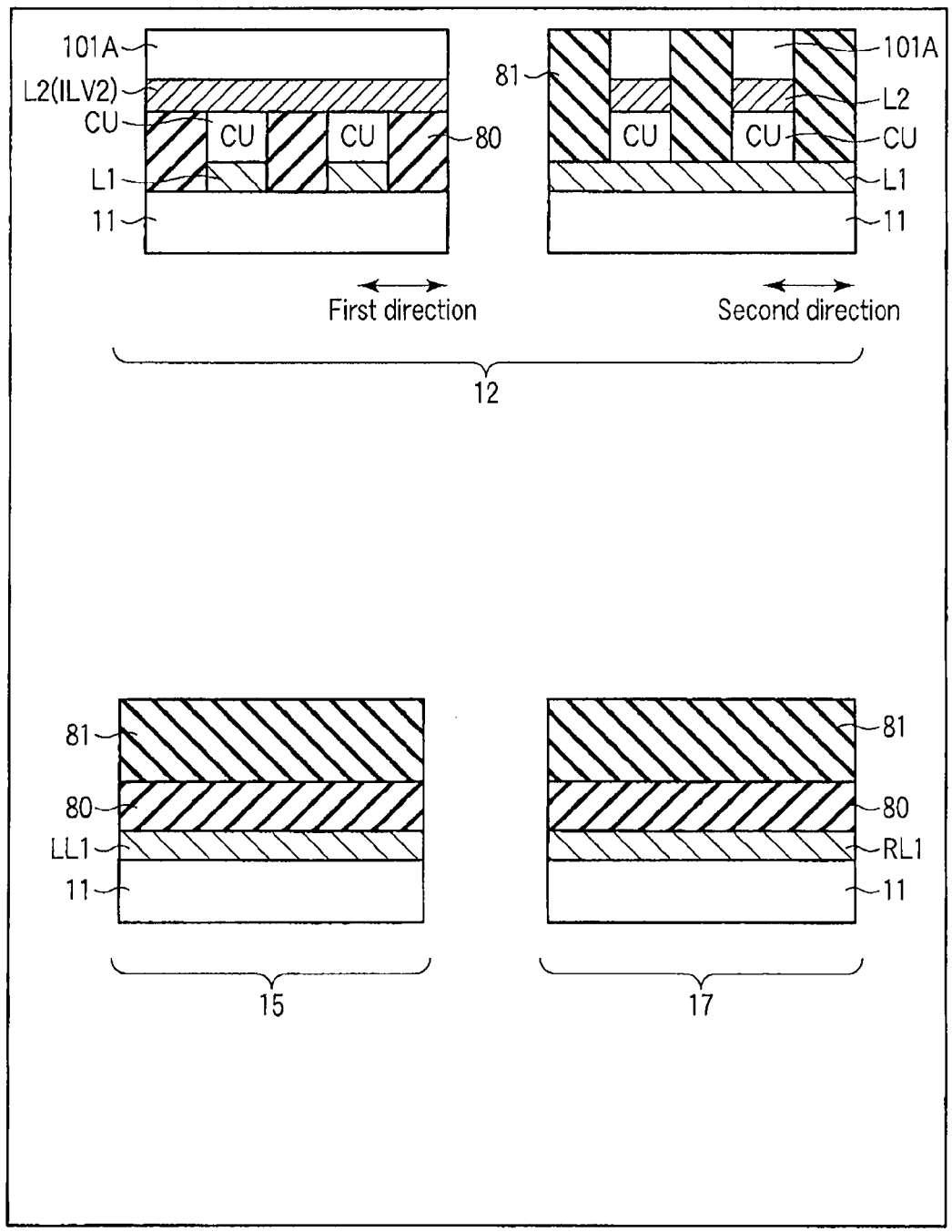
FIG. 21B is a view showing a step in the manufacturing method of a resistance change memory according to this embodiment.

As shown in FIG. 21B, processing for dividing the stacked body in the memory cell array area 12 in the second direction is executed based on mask pattern formation and the RIE method. As a result, the stacked bodies 101 extending in the first direction and control lines L2 extending in the first direction are formed above the control lines L1 extending in the second direction. The control lines L2 are placed on an interconnect level ILV2 which is the second from the substrate side.

Furthermore, since the stacked bodies extending in the second direction on the control lines L1 are processed in the second direction, cell units CU of the lowermost memory cell array are formed between the control lines L1 extending in the second direction and the control lines L2 extending in the first direction at the same step as that of forming the stacked bodies 101A serving as the cell units in the second memory cell array.

Moreover, in the memory cell array area 12, an interlayer insulating film 81 is buried between the cell units CU which are adjacent to each other in the second direction and between the stacked bodies 101A adjacent to each other in the second direction.

Additionally, in the lead area 15 and the resistive element area 17, for example, the constituent member of the cell unit and the conductive layer are removed, and an insulating film 81 is deposited on the interlayer insulating film 80. It is to be noted that the conductive layer may remain in the lead area 15 and the resistive element area 17 in accordance with a configuration of the interconnects or the resistive element.

Figure 21C:
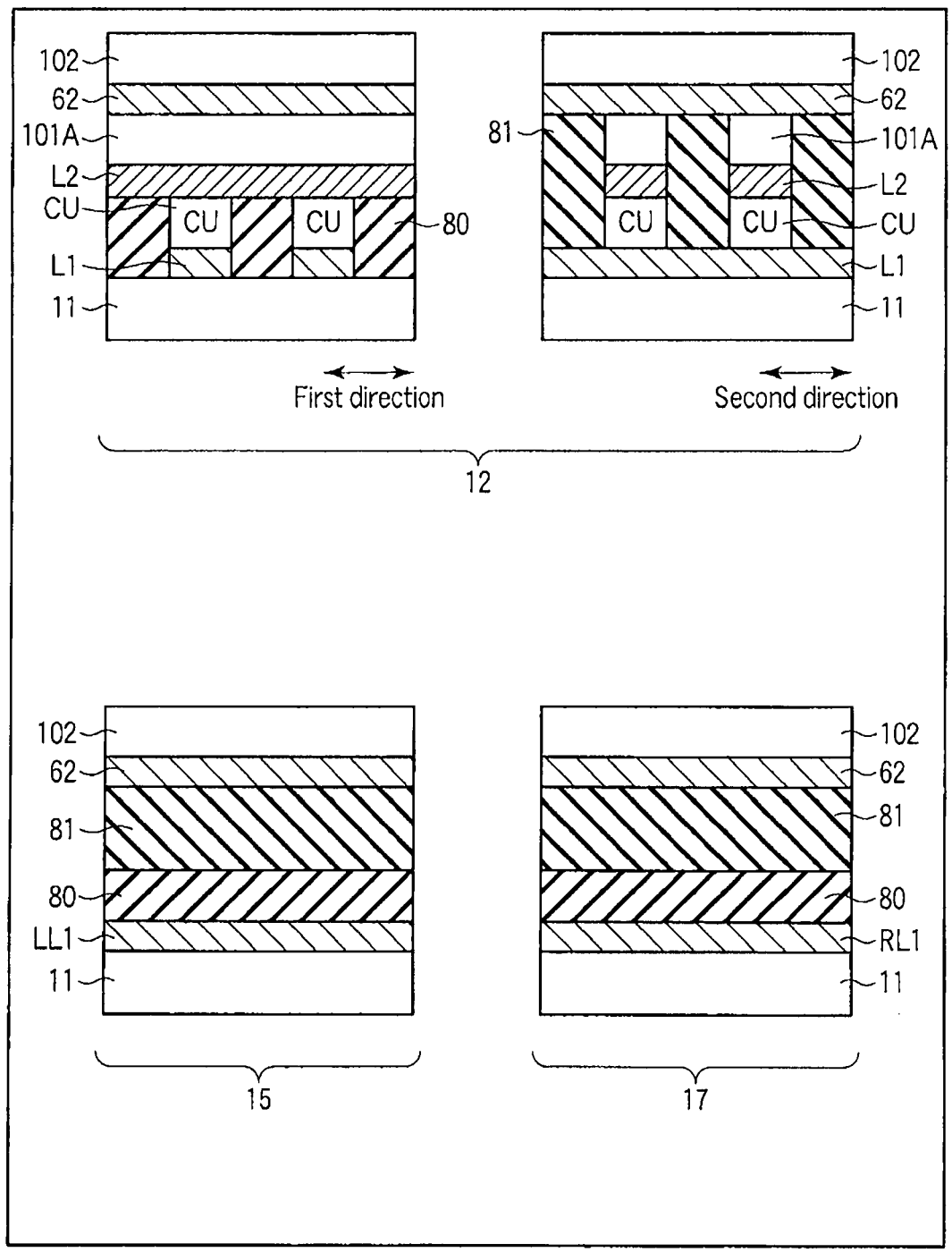
FIG. 21C is a view showing a step in the manufacturing method of a resistance change memory according to this embodiment.
Figure 21E:
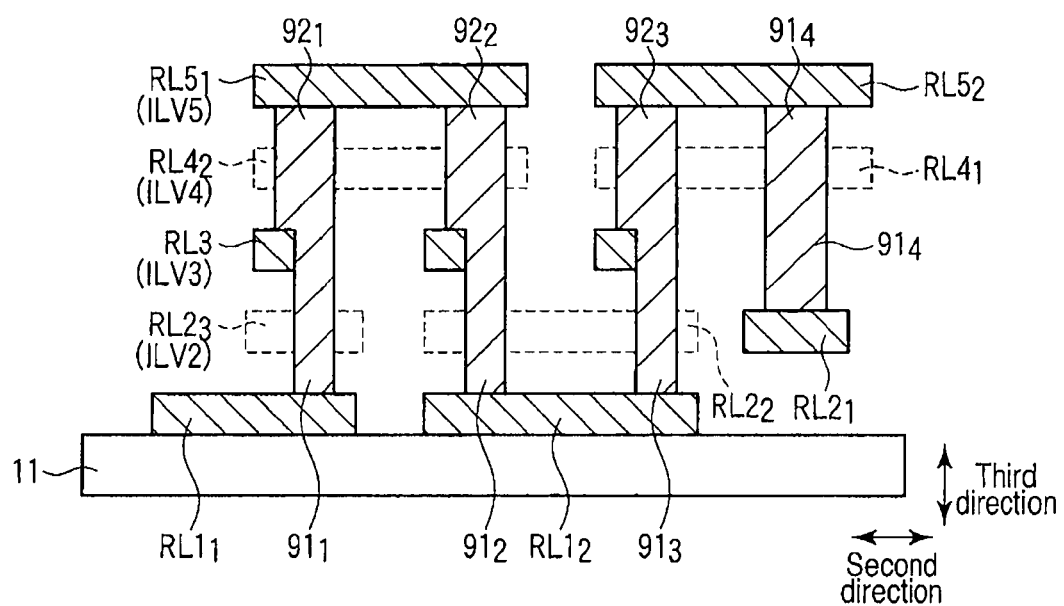
FIG. 21E is a cross-sectional view showing a structural example of a resistive element.

As shown in FIG. 21C, a conductive layer 62 and a constituent member (a stacked body) 102 for the third memory cell array are deposited on the interlayer insulating films 81 and the stacked bodies 101A extending in the first direction by the same technique as that described above. In the lead area 15 and the resistive element area 17, likewise, the conductive layer 62 and the stacked body 102 are deposited on the interlayer insulating film 81.

It is to be noted that, when the resistive element has a configuration in which an upper surface of each resistor is in contact with a bottom surface of each resistance line, like the step depicted in FIG. 20C, a resistor is buried in each opening portion (a contact hole) formed in the interlayer insulating films 80 and 81, and then the conductive layer 62 is formed on the resistors and the interlayer insulating films.

As shown in FIG. 21D, like the step described in conjunction with FIG. 21B, processing for the second memory cell array and that for the third memory cell array are simultaneously carried out. That is, the processing in the first direction is performed with respect to the stacked bodies 101A and 102 and the conductive layer 62 in FIG. 21C.

As a result, stacked bodies 102A extending in the second direction are formed on the conductive layers L3. The stacked body 102A is a constituent member of the cell unit for the third memory cell array. The conductive layer 62 is divided in the first direction, thereby forming a plurality of control lines L3 extending in the second direction. The control lines L3 are placed on a third interconnect level ILV3.

The stacked bodies between the control lines L2 and the control lines L3 are divided in the first direction, whereby cell units CU are formed between the control lines L2 extending in the first direction and the control lines L3 extending in the second direction. As a result, the memory cell array which is the second from the substrate side is formed between the control lines L2 and the control lines L3. Thereafter, interlayer insulating films 82 are deposited in the memory cell array area 12.

In the lead area 15 and the resistive element area 17, the conductive layer on the interlayer insulating film 81 is processed into predetermined shapes and layouts, thereby forming interconnects LL3 and resistance lines RL3 on the interlayer insulating films 81. Thereafter, the constituent member of the cell unit is removed from the upper sides of the interconnects LL3 and the resistance lines RL3. It is to be noted that the constituent member of the cell unit may be removed from the upper side of the conductive layer before forming the interconnects LL3 and the resistance line RL3.

Interlayer insulating films 82 are deposited on the conductive layer simultaneously with the forming step for the memory cell array area 12. Furthermore, in the lead area 15 and the resistive element area 17, opening portions CH and RH are formed in the interlayer insulating films 80, 81 and 82 by using the photolithography technology and the RIE method, respectively. When the opening portions CH and RH are formed, upper surfaces of the interconnect LL1 and the resistance line RL1 placed on the interconnect level ILV1 are exposed. Moreover, a dimension of an upper portion of each opening portion is set in such a manner that the upper surfaces of the interconnect LL3 and the resistance line RL3 placed on the interconnect level ILV3 are exposed.

At this time, etching selectivity is assured so that the interconnect LL3 and the resistance line RL3 are not etched by etching for the interlayer insulating films 80, 81 and 82. In this case, in dimensions of the opening portions CH and RH formed in the interlayer insulating films 81, 82 and 83, dimensions above upper surfaces of the interconnect/resistance line LL3 and RL3 placed on the interconnect level ILV3 in the direction horizontal to the substrate surface are larger than dimensions W2 and W1 below the upper surfaces of the interconnect/resistance line LL3 and RL3 placed on the interconnect level ILV3.

Thereafter, the formed opening portions CH and RH are filled with a conductor. As a result, a contact plug ZC is formed in the lead area 15, and a resistor 91 is buried in the resistive element area 17.

Each of the contact plug ZC and the resistor 91 has a protruding portion 95 protruding in the direction horizontal to the substrate surface. The contact plug ZC is connected to the interconnect LL3 and the resistor 91 is connected to the resistance line RL3 by the formed protruding portions 95. As described above, the two resistance lines RL1 and RL3 placed on the interconnect levels ILV1 and ILV3 which are odd-numbered levels from the substrate side are utilized to form the resistive element.

Incidentally, when the same member as the contact plug ZC is used for the resistor 91 of the resistive element as described above, it is preferable for the dimension W1 of the resistor 91 in the direction horizontal to the substrate surface to be smaller than the dimension W2 of the contact plug ZC. It is to be noted that the dimensions W1 and W2 of the contact plug ZC and the resistor 91 are dimensions below the protruding portions 95 in this manufacturing method 3.

Thereafter, the steps depicted in FIG. 21A and FIG. 21D are repeatedly executed until the number of stacked memory cell array layers reaches a predetermined number, thereby fabricating the resistance change memory according to this embodiment.

As described above, when the two stacked memory cell arrays are simultaneously processed at the common steps, the manufacturing steps of the resistance change memory including the cross-point type memory cell array can be simplified. In this case, the resistive element including the resistor connected to the two resistance lines can be formed simultaneously with formation of the memory cell array.

Furthermore, such a resistive element 90 using the contact plug having the protruding portion 95 as the resistor 91 as depicted in FIG. 9B, FIG. 9C and FIG. 11C can be formed based on the manufacturing steps shown in FIG. 21C and FIG. 21D.

When the manufacturing method 2 described with reference to FIG. 21A and FIG. 21D is used for the manufacturing method of the resistance change memory, in the resistive element having the plurality of resistors connected in series, using the resistive element shown in FIG. 14A to FIG. 14D for the resistance change memory is effective. That is because the cell unit is necessarily formed between a given interconnect and an interconnect immediately above this line when the manufacturing method 2 is utilized. In other words, to avoid formation of the cell unit between the interconnects, the interconnects must be separated from each other by at least two layers (two interconnect levels) or more in the stacking direction. It is to be noted that, when this manufacturing method 2 is applied to the layout shown in FIG. 14A, a cross-sectional configuration corresponding to FIG. 14B is a configuration depicted in FIG. 21E.

According to the manufacturing method 2 of the resistance change memory of this embodiment, the manufacturing steps of the memory cell array area 12 can be simplified, an increase in occupied area can be suppressed, and the resistive element having a high resistance value can be provided.

(c) Manufacturing Method 3

Figure 22:
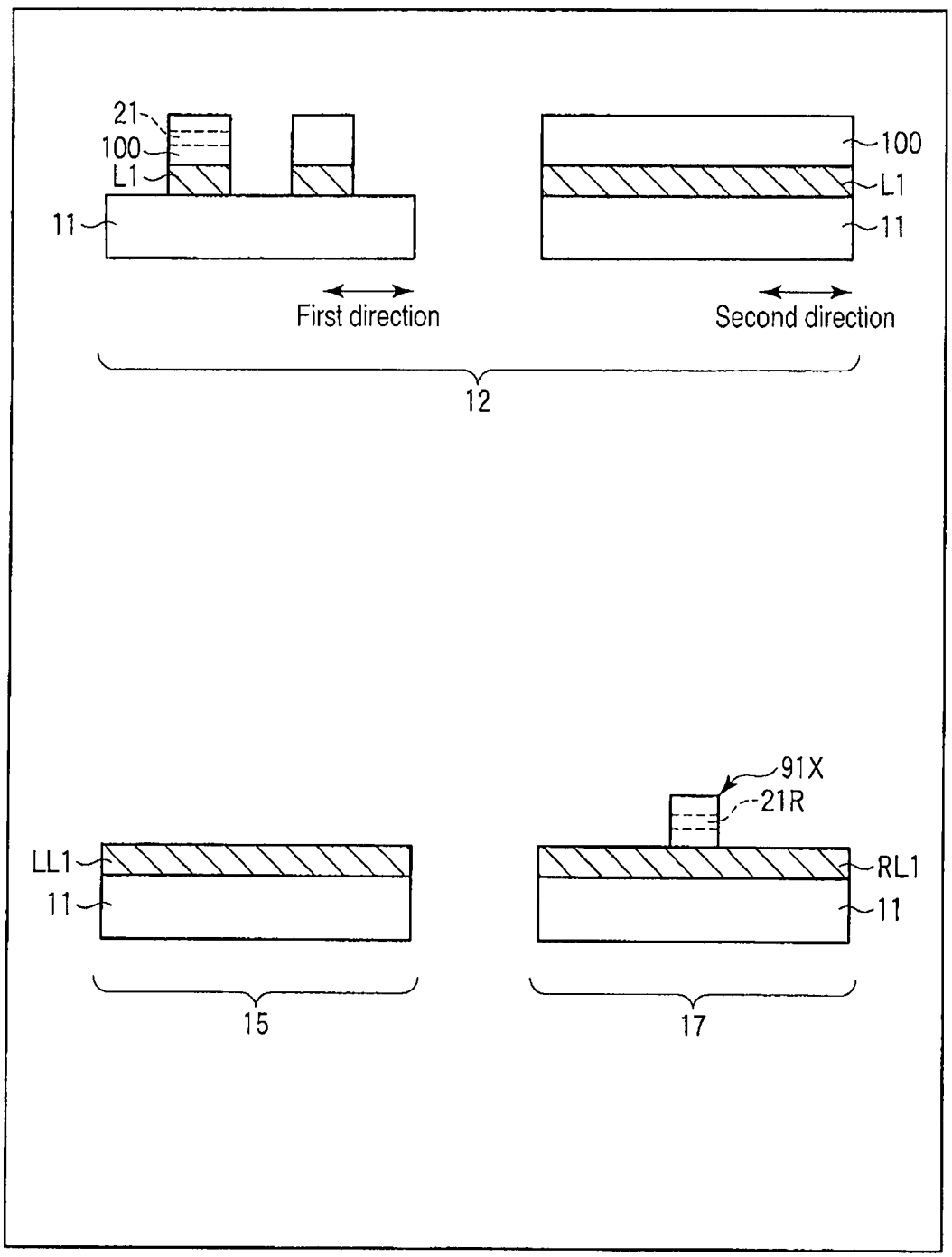
FIG. 22 is a view showing a step in the manufacturing method of a resistance change memory according to this embodiment.

A manufacturing method 3 of a resistance change memory according to this embodiment will now be described with reference to FIG. 22. FIG. 22 is a manufacturing step with respect to the memory cell array area 12, the lead area 15 and the resistive element area 17 in the manufacturing method 3 of a resistance change memory according to this embodiment. In the manufacturing method 3, a detailed description on steps equal to those in the manufacturing methods 1 and 2 will be omitted.

As shown in FIG. 10A, FIG. 10B, FIG. 18A and FIG. 18B, the same member as the memory element of the cell unit may be used as a constituent element of the resistive element according to this embodiment. Here, a manufacturing method of a resistive element including the same constituent element as that of the cell unit will be explained.

Like the step depicted in FIG. 20A, a constituent member of the cell unit is deposited on a conductive layer. Then, like the step depicted in FIG. 20B, a stacked body 100 and a control line L1 are formed.

When removing the constituent member of the cell unit from the lead area 15 and the resistive element area 17, the resistive element area 17 is patterned to leave a part of the constituent member of the cell unit.

A constituent member 91X of the cell unit remaining on a resistance line RL1 serves as a resistor of the resistive element. The same member 21R as the resistance change film 21 of the memory element is included in this resistor 91X and utilized as a resistive film 21R. A resistance value of the resistive film 21R can be adjusted at, e.g., a test step after forming the resistance change memory as described above.

Then, at substantially the same steps as the manufacturing steps described in the manufacturing method 1 or the manufacturing method 2, interlayer insulating films are deposited in the memory cell array area 12, the lead area 15 and the resistive element area 17, then formation of each cell unit and formation of a control line L1, an interconnect LL1 and a resistance line RL1 are carried out.

It is to be noted that processing for the stacked body 91X as the resistor in the resistive element area 17 may be performed at the same step as a processing step for the memory cell array area 12, or it may be performed at a step different from the processing step for the memory cell array area 12.

Further, as described above, when the resistive element including substantially the same member as the constituent member of the cell unit is formed in the dummy cell area, this resistive element is formed at the same step as that of the cell unit in the memory cell array area 12.

Based on the above-described steps, the resistive element including the same constituent member as that of the cell unit is formed. Like the manufacturing method 1 and the manufacturing method 2, the resistive element included in the resistance change memory can be formed without a substantial increase in the number of the manufacturing steps.

According to the manufacturing method 3 of the resistance change memory of this embodiment, like the manufacturing method 1 and the manufacturing method 2, an increase in occupied area can be suppressed without an increase in the number of the manufacturing steps, and the resistive element having a high resistance value can be provided.

(5) Operation

An operation of the resistance change memory according to this embodiment will now be described with reference to FIG. 23.

FIG. 23 shows two memory cell arrays.

A memory cell array M1 corresponds to the memory cell array M1 in FIG. 2, and a memory cell array M2 corresponds to the memory cell array M2 in FIG. 2. A connecting relationship between a memory element and a non-ohmic element (e.g., a rectification element) in each of cell units CU1 and CU2 corresponds to "a" in FIG. 4.

<Set Operation>

An example where a write (set) operation is executed with respect to a selected cell unit CU1-sel in the memory cell array M1 will be explained.

An initial state of the selected cell unit CU1-sel is, e.g., an erased (reset) state.

Furthermore, for example, it is assumed that the reset state is a high-resistance state (100 kΩ to 1 MΩ) and the set state is a low-resistance state (1 kΩ to 1 kΩ).

A selected control line L2($i$) is connected to a power supply potential Vdd on a high-potential side, and a selected control line L1($j$) is connected to a power supply potential Vss (e.g., a ground potential) on a low-potential side.

Moreover, in first control lines from the substrate side, non-selected control lines L1($j$−1) and L1($j$+1) other than the selected control line L1($j$) are connected to the power supply potential Vdd. In second control lines from the substrate side, a non-selected control line L2($i$+1) other than the selected control line L2($i$) is connected to the power supply potential Vss.

Additionally, third non-selected control lines L3($j$−1), L3($j$) and L3($j$+1) from the substrate side are connected to the power supply potential Vss.

At this time, a forward bias is applied to a rectification element (e.g., a diode) in the selected cell unit CU1-sel. Therefore, a set current I-set from a constant current source 12 flows through the selected cell unit CU1-sel, and a resistance value of a memory element in the selected cell unit CU1-sel changes to a low-resistance state from a high-resistance state.

Here, in the set operation, for example, a voltage of 3 V to 6 V is applied to the memory element in the selected cell unit CU1-sel for a period (a pulse width) of approximately 10 ns to 100 ns. A current value of the set current I-set flowing through this memory element (the high-resistance state) is, e.g., approximately 10 nA, and a current density of the same is set to a value falling in a range of $1 \times 10^5$ to $1 \times 10^7$ A/cm$^2$.

On the other hand, a reverse bias is applied to a rectification element (a diode) in each of cell units connected to positions between the non-selected control lines L1($j$−1) and L1($j$+1) and the non-selected control line L2($i$+1) in non-selected cell units CU1-unsel in the memory cell array M1. Likewise, a reverse bias is applied to a rectification element (a diode) in each of cell units connected to positions between the selected control line L2($i$) and the non-selected control lines L3($j$−1), L3($j$) and L3($j$+1) in non-selected cell units CU2-unsel in the memory cell array M2.

It is to be noted that a potential difference between terminals of the rectification element in each of the cell units connected to the positions between the selected control line L2($i$) and the non-selected control lines L1($j$−1) and L1($j$+1) is set to substantially zero (Vdd−Vdd). Likewise, a potential difference between terminals of the rectification element in the cell unit connected to the position between the selected control line L1($j$) and the non-selected control line L2($i$+1) is set to substantially zero (Vss−Vss).

<Reset Operation>

An example in which an erase (reset) operation is performed with respect to the selected cell unit CU1-sel in the memory cell array M1 will now be explained.

The selected control line L2($i$) is connected to the power supply potential Vdd on the high-potential side, and the selected control line L1($j$) is connected to the power supply potential Vss on the low-potential side.

Furthermore, the non-selected control lines L1($j$−1) and L1($j$+1) other than the selected control line L1($j$) in the first control lines from the substrate side are connected to the power supply potential Vdd. The non-selected control line L2($i$+1) other than the selected control line L2($i$) in the second control lines from the substrate side is connected to the power supply potential Vss.

Moreover, the third non-selected control lines L3($j$−1), L3($j$) and L3($j$+1) from the substrate side are connected to the power supply potential Vss.

At this time, since the forward bias is applied to the rectification element in the selected cell unit CU1-sel, a reset current I-reset from the constant current source 12 flows through the selected cell unit CU1-sel, and a resistance value of the memory element in the selected cell unit CU1-sel changes from a low-resistance state to a high-resistance state.

Here, in the reset operation, a voltage of 0.5 V to 3 V is applied to the memory element in the selected cell unit CU1-sel for a period (a pulse width) of approximately 200 ns to 1 μs. The reset current I-reset flowing through the memory element (the low-resistance state) is approximately 1 μA to 100 μA, and its current density is set to a value falling in a range of $1 \times 10^3$ to $1 \times 10^6$ A/cm$^2$.

On the other hand, a reverse bias is applied to the rectification element in each of the cell units connected to positions between the non-selected control lines L1($j$−1) and L1($j$+1) and the non-selected control line L2($i$+1) in the non-selected cell units CU1-unsel in the memory cell array M1. Likewise, a reverse bias is applied to the rectification element in each of the cell units connected to positions between the selected control line L2(1) and the non-selected control lines L3($j$−1), L3($j$) and L3($j$+1) in the non-selected cell units CU2-*unsel* in the memory cell array M2.

It is to be noted that a potential difference between terminals of the rectification element in each of the cell units connected to the positions between the selected control line L2($i$) and the non-selected control lines L1 ($j$−1) and L1($j$+1) is set to substantially zero (Vdd-Vdd). Likewise, a potential difference between terminals of the rectification element in the cell unit connected to the position between the selected control line L1($j$) and the non-selected control line L2($i$+1) is set to substantially zero (Vss−Vss).

It is to be noted that the current value of the set current I-set is different from the current value of the reset current I-reset. Moreover, when the set/reset operation of the memory element is dependent on a pulse width of the current/voltage, a pulse width of the set current is different from a pulse width of the reset current. A voltage value, a current value or a length of the period (the pulse width) of the voltage/current applied to the memory element in the selected cell unit CU1-sel is dependent on a material forming the memory element.

In the set/reset operation, if the configurations of the stacked cell units indicated by "a" to "p" in FIG. 4 have a connecting relationship in which a predetermined potential difference can be applied to the selected cell unit and a reverse bias or a potential difference of 0 v can be applied to the non-selected cell units, a potential higher than the power supply potential Vss on the low-potential side may be applied to the control lines connected to the non-selected cell units to previously charge the control lines for the next operation. As a result, a time required for charging the control lines in the next operation cycle can be eliminated, thereby increasing a speed of the memory operation.

<Read Operation>

An example of performing a read operation with respect to the selected cell unit CU1-sel in the memory cell array M1 will now be explained.

The selected control line L2(i) is connected to the power supply potential Vdd on the high-potential side, and the selected control line L1(j) is connected to the power supply potential Vss on the low-potential side.

Additionally, the non-selected control lines L1(j−1) and L1(j+1) other than the selected control line L1(j) in the first control lines from the substrate side are connected to the power supply potential Vdd. The non-selected control line L2(i+1) other than the selected control line L2(i) in the second control lines from the substrate side is connected to the power supply potential Vss.

Further, the third non-selected control lines L3(j−1), L3(j) and L3(j+1) from the substrate side are connected to the power supply potential Vss.

At this time, a forward bias is applied to the rectification element (e.g., a diode) in the selected cell unit CU1-sel. Therefore, a read current I-read from the constant current source 12 flows through the memory element (a high-resistance state or a low-resistance state) in the selected cell unit CU1-sel.

Therefore, for example, detecting a change in potential of a sense node when the read current I-read is flowing through the memory element enables reading data (a resistance value) in this memory element.

Here, a value of the read current I-read must be sufficiently smaller than a value of the set current I-set and a value of the reset current I-reset so that a resistance value of the memory element does not change at the time of reading. Further, when a change in resistance value of the memory element is dependent on a pulse width of the current, the pulse width of the read current must be set to a pulse width which causes no change in a resistance value of the memory element.

At the time of reading, like the set/reset operation, a reverse bias is likewise applied to the rectification element in each of the cell units connected to the positions between the non-selected control lines L1(j−1) and L1(j+1) and the non-selected control line L2(i+1) in the non-selected cell units CU1-unsel in the memory cell array M1. Furthermore, a reverse bias is also applied to the rectification element in each of the cell units connected to the positions between the selected control line L2(i) and the non-selected control lines L3(j−1), L3(j) and L3(j+1) in the non-selected cell units CU2-unsel in the memory cell array M2.

As described above, the set/reset operation and the read operation of the resistance change memory are executed as described above.

As explained in conjunction with FIG. 19, when the resistive element includes the resistive film formed of the same material as that of the resistance change film of the memory element, a resistance value of the resistive element can be adjusted by the same operation as the set operation/reset operation. That is, when the same operation as the set operation is performed with respect to the resistive element including the resistive film having a variable resistance value, the resistance value of this resistive element can be reduced. When the same operation as the reset operation is performed with respect to the resistive element, the resistance value of this resistive element can be increased.

As described above, according to the resistance change memory of this embodiment, the resistive element having a high resistance value can be realized while suppressing an increase in occupied area.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
a memory cell array area and a resistive element area on a substrate;
a first memory cell array in the memory cell array area, the first memory cell array including a first control line which is placed on a first interconnect level and parallel to a first direction, a second control line which is placed on a second interconnect level above first interconnect level and parallel to a second direction crossing the first direction, and a first cell unit provided between the first control line and the second control line;
a second memory cell array stacked on the first memory cell array, the second memory cell array including the second control line shared by the first memory cell array and the second memory cell array, a third control line which is placed on a third interconnect level above the second interconnect level and parallel to the first direction, and a second cell unit provided between the second control line and the third control line;
a first contact plug in contact with the first control line and a fourth control line placed on the third interconnect level; and
a resistive element in the resistive element area, the resistive element including at least two resistance lines provided on at least two interconnect levels in the first to third interconnect levels, and at least one resistor which is connected to the resistance lines and includes the same constituent member as a constituent member of the first contact plug.

2. The resistance change memory according to claim 1, wherein the resistive element comprises: a first resistance line on the first interconnect level; a second resistance line on the second interconnect level; and a first resistor provided between the first resistance line and the second resistance line.

3. The resistance change memory according to claim 1, wherein the resistive element comprises: a first resistance line on the first interconnect level; a second resistance line on the second interconnect level; a third resistance line on the first interconnect level; a first resistor provided between the first resistance line and the second resistance line; and a second resistor provided between the second resistance line and the third resistance line.

4. The resistance change memory according to claim 1, wherein the plurality of resistance lines have a spiral configuration in the resistive element area, and the plurality of resistors connect the plurality of resistance lines provided on the different interconnect levels.

5. The resistance change memory according to claim 1, wherein the plurality of resistance lines have a meandering planar configuration in the resistive element area, and the plurality of resistors connect the plurality of resistance lines provided on the different interconnect levels.

6. The resistance change memory according to claim 1, wherein the resistive element comprises: a first resistor chain in which the plurality of resistance lines and the plurality of resistors are connected in series; and a second resistor chain in which the plurality of resistance lines and the plurality of resistors are connected in series, wherein the first resistor chain extends in the first direction, and the second resistor chain extends in the first direction and is adjacent to the first resistor chain in the second direction.

7. The resistance change memory according to claim 1, wherein the resistor comprises a protruding portion, the protruding portion is provided at an upper portion of the resistor and protrudes in a direction parallel to the substrate surface, a bottom portion of the resistor is in contact with an upper portion of a first resistance line in the first interconnect level, and a bottom portion of the protruding portion is in contact with an upper portion of a second resistance line above the first resistance line.

8. The resistance change memory according to claim 1, further comprising:

a lead area on the substrate, the lead area including a first interconnect on the first interconnect level, a second interconnect on the second interconnect level, and a second contact plug which connects the first interconnect line to the second interconnect line, wherein a dimension of the resistor in a direction parallel to the substrate surface is smaller than a dimension of the second contact plug in a direction parallel to the substrate surface.

9. A resistance change memory comprising:

a memory cell array area and a resistive element area on a substrate;

a first memory cell array in the memory cell array area, the first memory cell array including a first control line which is placed on a first interconnect level and parallel to a first direction, a second control line which is placed on a second interconnect level above the first interconnect level and parallel to a second direction crossing the first direction, and a first cell unit which is provided between the first control line and the second control line;

a second memory cell array stacked on the first memory cell array, the second memory cell array including the second control line shared by the first memory cell array and the second memory cell array, a third control line which is placed on a third interconnect level above the second interconnect level and extends along the first direction, and a second cell unit which is provided between the second control line and the third control line;

a first contact plug in contact with the first control line and a fourth control line placed on the third interconnect level; and a resistive element in the resistive element area, the resistive element including at least two resistance lines provided on at least two interconnect levels in the first to third interconnect levels, at least one resistor which is connected to the resistance lines and includes the same constituent member as a constituent member of the first contact plug.

10. The resistance change memory according to claim 9, further comprising:

a lead area on the substrate, the lead area including a first interconnect on the first interconnect level, a second interconnect on the second interconnect level, and a second contact plug which connects the first interconnect to the second interconnect, wherein a dimension of the resistor in a direction parallel to the substrate surface is smaller than a dimension of the second contact plug in a direction parallel to the substrate surface.

11. The resistance change memory according to claim 9, wherein the resistive element comprises:

a first resistance line, a second resistance line vertically overlapping the first resistance line; and a resistor which is provided between one end of the first resistance line and one end of the second resistance line.

12. The resistance change memory according to claim 9, wherein the resistive element comprises: a first resistor chain in which the plurality of resistance lines and the plurality of resistors are connected in series; and a second resistor chain in which the plurality of resistance lines and the plurality of resistors are connected in series, wherein the first resistor chain extends in the first direction, and the second resistor chain extends in the first direction and is adjacent to the first resistor chain in the second direction.

13. The resistance change memory according to claim 12, wherein the first resistor chain comprises: a first resistance line on the first interconnect level; and a second resistance line on the third interconnect level; and the second resistor chain comprises: a third resistance line on the second interconnect level; and a fourth resistance line on a fourth interconnect level.

\* \* \* \* \*